US009792173B2

(12) United States Patent
Adachi et al.

(10) Patent No.: US 9,792,173 B2
(45) Date of Patent: Oct. 17, 2017

(54) INTERFACE CONTROL CIRCUIT, MEMORY SYSTEM, AND METHOD OF CONTROLLING AN INTERFACE CONTROL CIRCUIT

(71) Applicant: Sony Corporation, Tokyo (JP)

(72) Inventors: Naohiro Adachi, Tokyo (JP); Yoshiyuki Shibahara, Tokyo (JP); Yasushi Fujinami, Tokyo (JP)

(73) Assignee: Sony Corporation, Tokyo (JP)

( * ) Notice: Subject to any disclaimer, the term of this patent is extended or adjusted under 35 U.S.C. 154(b) by 242 days.

(21) Appl. No.: 14/271,732

(22) Filed: May 7, 2014

(65) Prior Publication Data

US 2014/0372791 A1 Dec. 18, 2014

(30) Foreign Application Priority Data

Jun. 12, 2013 (JP) ................................. 2013-123321

(51) Int. Cl.
*G06F 11/07* (2006.01)
*G06F 11/10* (2006.01)
*G06F 13/16* (2006.01)
*H03M 13/35* (2006.01)
*G05B 13/02* (2006.01)

(52) U.S. Cl.
CPC ...... *G06F 11/1048* (2013.01); *G06F 13/1689* (2013.01); *G05B 13/02* (2013.01); *G06F 11/07* (2013.01); *G06F 11/073* (2013.01); *G06F 11/0703* (2013.01); *G06F 11/0745* (2013.01); *G06F 11/0793* (2013.01); *G06F 11/1008* (2013.01); *H03M 13/353* (2013.01)

(58) Field of Classification Search
CPC .... G06F 11/07; G06F 11/0703; G06F 11/073; G06F 11/0745; G06F 11/079; G06F 11/0793; G06F 11/08; G06F 11/1008; G06F 11/14; G06F 11/1402; G06F 11/142; G06F 11/1423; G06F 11/1443; G06F 11/10; G05B 13/02; H03M 13/31; H03M 13/33; H03M 13/353
See application file for complete search history.

(56) References Cited

U.S. PATENT DOCUMENTS

| 7,512,201 | B2 * | 3/2009 | Kelly | H04L 7/0091 375/354 |
| 2009/0106634 | A1 * | 4/2009 | Muraoka | H03M 13/1585 714/785 |
| 2010/0005376 | A1 * | 1/2010 | LaBerge | G11C 29/808 714/819 |
| 2010/0100779 | A1 * | 4/2010 | Moriya | G11C 29/023 714/718 |

(Continued)

*Primary Examiner* — Albert Decady
*Assistant Examiner* — Christian Dorman
(74) *Attorney, Agent, or Firm* — Michael Best & Friedrich LLP

(57) ABSTRACT

Disclosed is an interface control circuit including an error detection unit, an error correction unit, and an adjustment control unit. The error detection unit is configured to detect whether an error occurs in error correction coded data transmitted via an interface. The error correction unit is configured to execute error correction processing of correcting the error when the error occurs. The adjustment control unit is configured to start adjustment processing of adjusting a transmission characteristic of the interface when the error occurs.

29 Claims, 41 Drawing Sheets

(56) References Cited

U.S. PATENT DOCUMENTS

| | | | |
|---|---|---|---|
| 2010/0135100 A1* | 6/2010 | Chiu | G11C 7/1072 365/233.11 |
| 2011/0093753 A1* | 4/2011 | Takagi | G06F 11/1004 714/746 |
| 2012/0042116 A1* | 2/2012 | Park | G06F 13/4086 711/102 |
| 2012/0250386 A1* | 10/2012 | Lee | H05K 1/0243 365/51 |
| 2012/0266048 A1* | 10/2012 | Chung | G06F 11/08 714/768 |
| 2013/0007562 A1* | 1/2013 | Fai | G06F 11/1004 714/758 |
| 2013/0055046 A1* | 2/2013 | Blodgett | G06F 11/106 714/764 |
| 2013/0185612 A1* | 7/2013 | Lee | G06F 11/0751 714/773 |

\* cited by examiner

INTERFACE CONTROL CIRCUIT, MEMORY SYSTEM, AND METHOD OF CONTROLLING AN INTERFACE CONTROL CIRCUIT

CROSS REFERENCE TO RELATED APPLICATIONS

This application claims the benefit of Japanese Priority Patent Application JP2013-123321 filed Jun. 12, 2013, the entire contents of which are incorporated herein by reference.

BACKGROUND

The present technology relates to an interface control circuit, a memory system, and a method of controlling the interface control circuit. Specifically, the present technology relates to an interface control circuit, a memory system, and a method of controlling the interface control circuit for detecting and correcting errors in data.

Up until now, memories have been used to retain data in information processing systems. The memories may be classified into non-volatile memories and volatile memories. NAND type flash memories and NOR type flash memories have been widely used as non-volatile memories. In addition, DRAMs (Dynamic Random Access Memories), SRAMs (Static Random Access Memories), or the like have been used as volatile memories.

It has been indicated in recent years that NAND type flash memories and DRAMs among these memories have a limitation in their miniaturization, and thus next-generation memories have been positively proposed and developed as alternatives to existing memories. Examples of the next-generation memories include ReRAMs (Resistive RAMs), PCRAMs (Phase-Change RAMs), and MRAMs (Magnet Resistive RAMs).

One of the characteristics of next-generation non-volatile memories is that they have a higher access speed than those of known NAND type flash memories and NOR type flash memories. In order to suit the high speed performance, the next-generation memories desirably use a high-speed interface such as a DDR (Double-Data-Rate) interface used in DRAMs or the like. JEDEC (Joint Electron Device Engineering Council) as a standards body has also proposed and discussed new standards for applying high-speed interfaces to non-volatile memories. Specifically, a LPDDR (Low-Power Double Data rate) 2-NVM (Non-Volatile Memory) and a LPDDR4-NVM have been, for example, proposed as new standards.

Under these new standards, it is desirable to adjust the phase of a transfer clock and impedance with an interface. This is because, when a phase and impedance are made different from their reference value due to fluctuations in manufacturing process, operation temperature, or the like, there is a high likelihood of a transfer error occurring when data is transferred via the interface. For example, under the standard of a DDR3 interface widely used in DRAMs, a ZQCAL command is prepared to adjust the impedance of the interface (see, for example, "JEDEC STANDARD DDR3 SDRAM Specification JESD79-3B"). Under this standard, a memory system desirably adjusts impedance using a ZQCAL long command immediately after the initialization of a memory. In addition, a memory system is recommended to adjust impedance at regular intervals using a ZQCAL long command and a ZQCAL short command after the initialization of a memory.

SUMMARY

In the above related art, however, the communication speed between a memory controller and a memory may be reduced. The adjustment of a phase and impedance takes certain time, and the memory and the memory controller are not allowed to transmit and receive data via an interface during the time. Therefore, under a configuration in which an adjustment is periodically executed, time during which the transmission/reception of data is not allowed becomes longer in proportion to the frequency of the adjustment, which reduces the communication speed.

When the adjustment is executed at a high frequency, the communication speeds of non-volatile memories are particularly likely to be reduced. DRAMs may prevent the reduction of the communication speeds to some extent in such a way as to execute the adjustment in synchronism with periodical refresh processing, but the non-volatile memories may not execute the refresh processing periodically.

In view of the above circumstances, it is desirable to increase the communication speed between a memory controller and a memory.

According to a first embodiment of the present technology, there is provided an interface control circuit and a method of controlling the interface control circuit. The interface control circuit includes an error detection unit, an error correction unit, and an adjustment control unit. The error detection unit is configured to detect whether an error occurs in error correction coded data transmitted via an interface. The error correction unit is configured to execute error correction processing of correcting the error when the error occurs. The adjustment control unit is configured to start adjustment processing of adjusting a transmission characteristic of the interface when the error occurs. Thus, the adjustment processing is started when an error occurs.

In addition, in the first embodiment, the adjustment control unit may be configured to start the adjustment processing while the error correction processing is executed. Thus, the adjustment processing is started while the error correction processing is executed.

In addition, in the first embodiment, the interface may include a transmission circuit configured to transmit the error correction coded data, and a reception circuit configured to receive the error correction coded data, and the adjustment control unit may be configured to start processing of matching impedances of the transmission circuit and the reception circuit as the adjustment processing. Thus, the processing of matching the impedances of the transmission circuit and the reception circuit is started as the adjustment processing.

In addition, in the first embodiment, the adjustment control unit may be configured to start processing of adjusting a transmission timing of the data as the adjustment processing. Thus, the transmission timing of data is adjusted.

In addition, in the first embodiment, the interface control circuit may further include an adjustment unit configured to execute the adjustment processing according to control of the adjustment control unit. Thus, the adjustment processing is executed according to the control of the adjustment control unit.

In addition, in the first embodiment, the adjustment processing may be processing of adjusting the transmission timing based on a reference clock signal. Thus, the transmission timing is adjusted based on the reference clock signal.

In addition, in the first embodiment, the interface control circuit may further include a delay circuit configured to delay the transmission timing according to control of the adjustment control unit, and the adjustment processing may be processing of controlling the delay circuit to adjust the transmission timing. Thus, the transmission timing is adjusted by the control of the delay circuit.

In addition, in the first embodiment, the adjustment processing may be processing of adjusting a phase of a control signal for controlling the transmission timing based on a reference clock signal to adjust the transmission timing. Thus, the timing of the control signal for controlling the transmission timing is adjusted based on the reference clock signal.

In addition, in the first embodiment, the interface control circuit may further include a delay circuit configured to delay a phase of a control signal for controlling the transmission timing according to control of the adjustment control unit, and the adjustment processing may be processing of controlling the delay circuit to adjust the phase of the control signal. Thus, the phase of the control signal is adjusted by the control of the delay circuit.

In addition, in the first embodiment, the interface may include a transmission circuit configured to transmit the error correction coded data in synchronism with a transmission clock signal, and a reception circuit configured to receive the error correction coded data in synchronism with a reception clock signal, and the adjustment processing may be processing of adjusting a phase of at least one of the transmission clock signal and the reception clock signal to adjust the transmission timing. Thus, the phase of at least one of the transmission clock signal and the reception clock signal is adjusted.

In addition, in the first embodiment, the adjustment processing may be processing of adjusting the phase of one of the transmission clock signal and the reception clock signal based on the other of the transmission clock signal and the reception clock signal to adjust the transmission timing. Thus, the phase of one of the transmission clock signal and the reception clock signal is adjusted based on the other of the transmission clock signal and the reception clock signal.

In addition, in the first embodiment, the data may include read data read from a memory cell, the transmission clock signal may include a read data transmission clock signal for transmitting the read data, the reception clock signal may include a read data reception clock signal for receiving the read data, and the adjustment processing may include processing of adjusting the phase of at least one of the read data transmission clock signal and the read data reception clock signal. Thus, the processing of adjusting the phase of at least one of the read data transmission clock signal and the read data reception clock signal is started.

In addition, in the first embodiment, the data may include write data to be written in a memory cell, the transmission clock signal may include a write data transmission clock signal for transmitting the write data, the reception clock signal may include a write data reception clock signal for receiving the write data, and the adjustment processing may include processing of adjusting the phase of at least one of the write data transmission clock signal and the write data reception clock signal. Thus, the processing of adjusting the phase of at least one of the write data transmission clock signal and the write data reception clock signal is started.

In addition, in the first embodiment, the adjustment processing may be processing of adjusting the phase based on the transmission timing of the error correction coded data. Thus, the phase is adjusted based on the transmission timing of the error correction coded data.

In addition, in the first embodiment, the adjustment control unit may include a test data generation part configured to generate prescribed test data, and a phase control part configured to start processing of transmitting and returning the test data to and from the interface and adjusting the phase based on whether the transmitted test data and the returned test data match each other as the adjustment processing. Thus, a phase is adjusted based on whether the transmitted test data and the returned test data match each other.

In addition, in the first embodiment, the interface may include a plurality of data lines for transmitting the data. Thus, the transmission characteristics of the plurality of data lines are adjusted.

In addition, in the first embodiment, the adjustment processing may be processing of adjusting the transmission characteristic for each of the data lines. Thus, the transmission characteristic is adjusted for each of the data lines.

In addition, in the first embodiment, the data lines may each belong to any of a plurality of groups, and the adjustment processing may be processing of adjusting the transmission characteristic for each of the groups. Thus, the transmission characteristic is adjusted for each of the groups.

In addition, in the first embodiment, the adjustment control unit may be configured to start the adjustment processing when the errors in excess of a prescribed threshold occur in the data. Thus, the adjustment processing is started when the errors in excess of a prescribed threshold occur in the data.

In addition, in the first embodiment, the interface control circuit may further include a refresh processing unit configured to execute refresh processing of rewriting data where the error is corrected into an address at which the data is read. Thus, the refresh processing is executed.

In addition, in the first embodiment, the refresh processing unit may be configured to execute the refresh processing when the number of the corrected errors is greater than a prescribed allowance within error correction capability of the error correction code. Thus, the refresh processing is executed when the number of the corrected errors is greater than a prescribed allowance within the error correction capability of the error correction code.

In addition, in the first embodiment, the interface control circuit may further include a retry processing unit configured to execute retry processing of reading the data and the error correction code again after the adjustment of the transmission characteristic when the errors beyond error correction capability of the error correction code occur in the data. Thus, the retry processing is executed when the errors beyond error correction capability of the error correction code occur in the data.

In addition, in the first embodiment, the retry processing unit may be configured to issue a prescribed command to read the data and the error correction code again while informing a host computer of the prescribed command. Thus, the host computer is informed of the issued command again.

In addition, in the first embodiment, the retry processing unit may be configured to read the data and the error correction code again while informing a host computer of an address at which the data is read. Thus, the host computer is informed of the address.

In addition, in the first embodiment, the retry processing unit may be configured to read the data and the error correction code again while informing a host computer of the occurrence of the errors. Thus, the host computer is informed of the occurrence of the errors.

In addition, in the first embodiment, the adjustment control unit may be configured to start the adjustment processing when a power supply is input to the interface control circuit or when the error occurs. Thus, the adjustment processing is started when a power supply is input to the interface control circuit or when the error occurs.

In addition, in the first embodiment, the data is data read from a non-volatile memory cell. Thus, the adjustment processing is started while the error correction processing of the data read from the non-volatile memory cell is executed.

According to a second embodiment of the present technology, there is provided a memory system including an interface, an error detection unit, an error correction unit, and an adjustment control unit. The interface is configured to transmit error correction coded data. The error detection unit is configured to detect whether an error occurs in the data. The error correction unit is configured to execute error correction processing of correcting the error when the error occurs. The adjustment control unit is configured to start adjustment processing of adjusting a transmission characteristic of the interface when the error occurs. Thus, the adjustment processing is started when an error occurs.

According to an embodiment of the present technology, it is possible to produce an excellent effect in which the communication speed between a memory controller and a memory is increased.

These and other objects, features and advantages of the present disclosure will become more apparent in light of the following detailed description of best mode embodiments thereof, as illustrated in the accompanying drawings.

DETAILED DESCRIPTION OF EMBODIMENTS

Next, modes (hereinafter referred to as embodiments) for carrying out the present technology will be described. The description will be given in the following order.

1. First Embodiment (an example in which impedance is adjusted at error detection)
2. Second Embodiment (an example in which a phase is adjusted at error detection)
3. Third Embodiment (an example in which impedance and a phase are adjusted at error detection)
4. Fourth Embodiment (an example in which impedance is adjusted and refresh processing is executed at error detection)
5. Fifth Embodiment (an example in which impedance is adjusted and reading is executed again at error detection)

1. First Embodiment (Configuration Example of Memory System)

Figure 1:
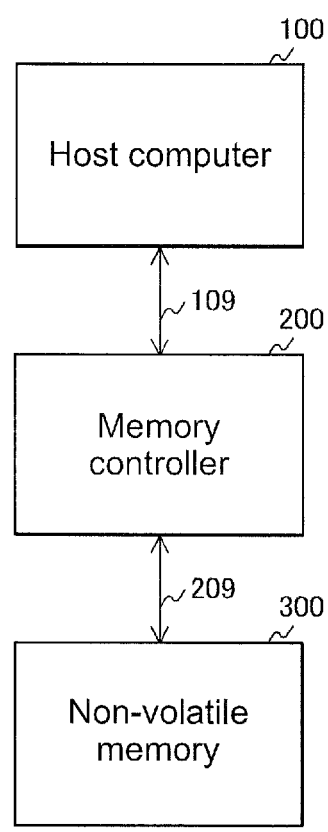
FIG. 1 is a block diagram showing a configuration example of a memory system according to a first embodiment.

FIG. 1 is a block diagram showing a configuration example of a memory system according to a first embodiment. The memory system includes a host computer 100, a memory controller 200, and a non-volatile memory 300.

The host computer 100 controls the entirety of the memory system. Specifically, the host computer 100 generates a command, a logical address, and write data and transmits them to the memory controller 200 via a signal line 109. In addition, the host computer 100 receives read data and a status from the memory controller 200 via the signal line 109. Here, the command serves to control the memory system and includes, for example, a write command for instructing the write processing of data and a read command for instructing the read processing of data. The logical address is an address in address space defined by the host computer 100. The status is information for informing the execution result of the command and the condition of the memory system.

The memory controller 200 controls the non-volatile memory 300. When receiving a logical address from the host computer 100, the memory controller 200 converts the logical address into a physical address allocated to a memory cell in the non-volatile memory 300. Then, the memory controller 200 transmits the physical address to the non-volatile memory 300 via a signal line 209.

Here, the signal line 209 includes a command/address line for transmitting an address and a command and a data line for transmitting and receiving data. In addition, a reference clock signal is transmitted from the memory controller 200 to the non-volatile memory 300 via the signal line 209. The clock signal will be described later. Note that although the embodiment explicitly describes a reference clock as a separate signal, an embedded clock system in which a clock is superposed on a data line may be used. In addition, an interface for transmitting and receiving an address, a command, data, or the like in a multiplexed form as in a NAND flash memory or the like may be used instead of the command/address line and the data line.

When receiving a write command and write data from the host computer 100, the memory controller 200 generates an ECC (Error Correction Code) from the write data. For example, a BCH (Bose-Chaudhuri-Hocquenghem) code and a RS (Reed-Solomon) code are used as ECCs. The memory controller 200 adds generated parity to the write data and transmits an ECC including the write data and the parity to the non-volatile memory 300 via the data line. The write command is transmitted via the command/address line.

When receiving a read command or the like from the host computer 100, the memory controller 200 interprets and translates the command and transfers the translated command to the non-volatile memory 300 via the command/address line. For example, a read command from the host computer 100 is divided into (i.e., translated into) a plurality of commands based on the access unit of the memory controller 200. Then, when receiving read data with parity (i.e., error correction coded read data) from the non-volatile memory 300 via the data line, the memory controller 200 detects whether an error has occurred in the read data using the parity. When an error has occurred in the read data, the memory controller 200 corrects the error using the parity. Then, the memory controller 200 transmits the corrected read data to the host computer 100.

In addition, when an error has occurred in the read data, the memory controller 200 issues an adjustment command for adjusting the transmission characteristics of the interface between the memory controller 200 and the non-volatile memory 300 during the correction processing of the error. For example, an impedance adjustment command for adjusting the impedance of the interface is issued as an adjustment command. The memory controller 200 transmits the impedance adjustment command to the non-volatile memory 300 via the command/address line. Here, the "interface" to be adjusted includes at least one of a control interface 260 on the side of the memory controller 200 that will be described later, a memory interface 400 on the side of the non-volatile memory 300 that will be described later, and the signal line 209 such as the data line.

In addition, the memory controller 200 receives a status from the non-volatile memory 300 via the signal line 209, updates the status as occasion demands, and transmits the updated status to the host computer 100.

Note that the memory controller 200 is an example of an interface control circuit described in the claims.

In addition, the memory controller 200 may issue an adjustment command other than an impedance adjustment command at error detection. For example, the memory controller 200 may issue a phase adjustment command for adjusting the phase (timing) of the transfer clock of the interface or issue both a phase adjustment command and an impedance adjustment command.

The non-volatile memory 300 stores data according to the control of the memory controller 200. The non-volatile memory 300 receives a command, an address, and data from the memory controller 200. The non-volatile memory 300 writes data in a specified address when a command represents a write command and reads data from a specified address when a command represents a read command. Then, the non-volatile memory 300 generates a status and transmits the generated status to the memory controller 200. In addition, the non-volatile memory 300 transmits read data to the memory controller 200.

In addition, the non-volatile memory 300 adjusts the impedance of the interface when a command represents an impedance adjustment command.

Note that a memory in the memory system is not limited to a non-volatile memory but a volatile memory may be used instead.

In addition, the non-volatile memory 300 adjusts impedance in the memory system, but the memory controller 200 may adjust impedance instead of the non-volatile memory 300.

Moreover, the memory controller 200 executes error detection, error correction, and the issuance of an adjustment command, but other configurations may be employed. For example, the host computer 100 may execute error detection, error correction, and the issuance of an adjustment command instead of the memory controller 200.

(Configuration Example of Memory Controller)

Figure 2:
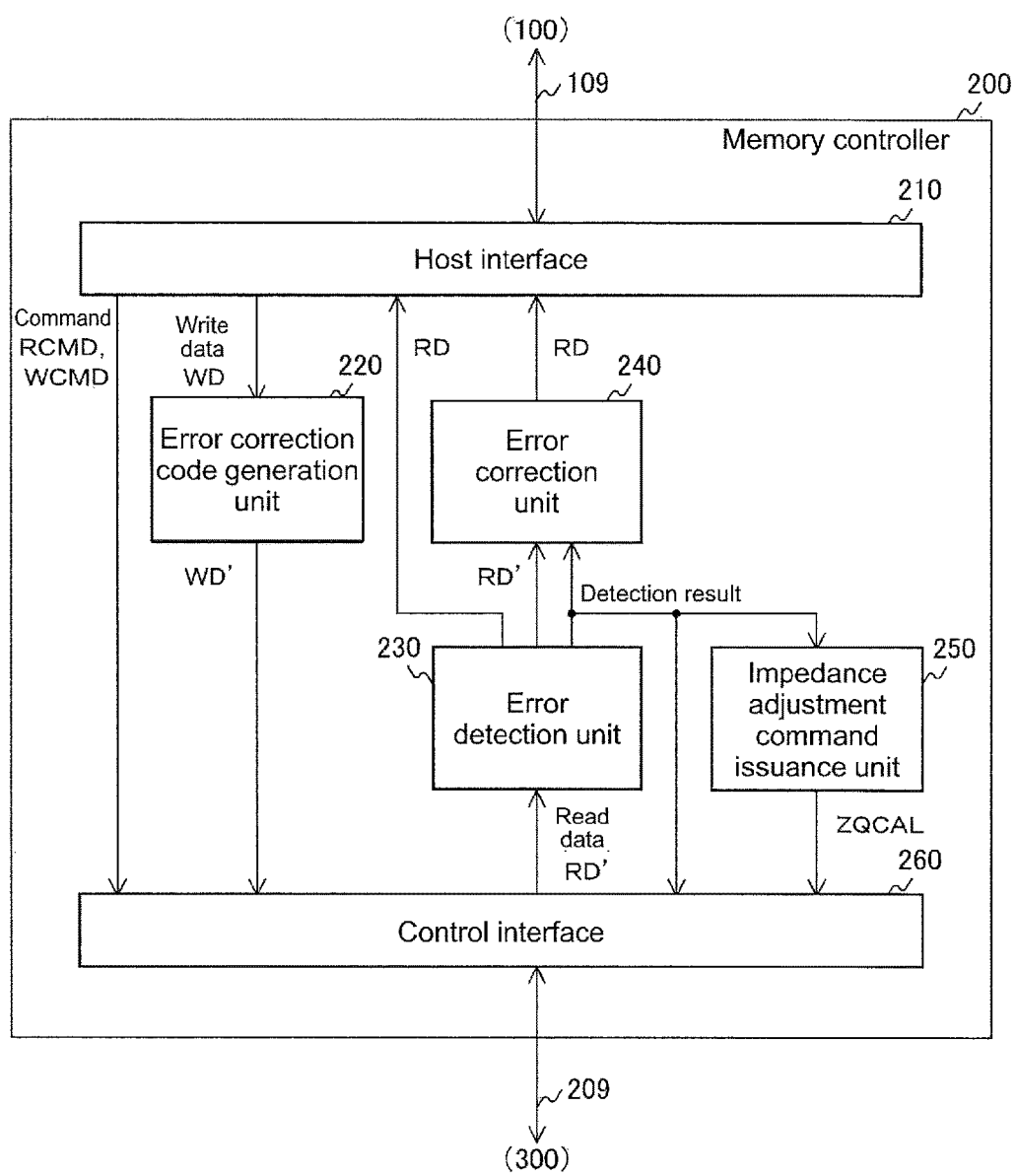
FIG. 2 is a block diagram showing a configuration example of a memory controller according to the first embodiment.

FIG. 2 is a block diagram showing a configuration example of the memory controller 200 according to the first embodiment. The memory controller 200 includes a host interface 210, an error correction code generation unit 220, an error detection unit 230, an error correction unit 240, an impedance adjustment command issuance unit 250, and a control interface 260.

The host interface 210 transmits and receives a command, an address, data, and a status to and from the host computer 100. A command received by the host interface 210 is interpreted and translated and then supplied to the control interface 260. In addition, a logical address received by the host interface 210 is converted into a physical address and then supplied to the control interface 260. Note that a decoder that interprets and translates a command, an address conversion unit that converts a logical address into a physical address, and a status generation unit that generates a status are omitted in FIG. 2.

The host interface 210 supplies write data WD received from the host computer 100 to the error correction code generation unit 220. In addition, the host interface 210 receives read data RD from the error detection unit 230 or the error correction unit 240. When no error is detected by the error detection unit 230, the host interface 210 transmits read data RD without parity to the host computer 100. On the other hand, when an error is detected by the error detection unit 230, the host interface 210 transmits read data RD, of which the error is corrected by the error correction unit 240, to the host computer 100.

When receiving write data WD from the host interface 210, the error correction code generation unit 220 generates parity from the write data WD. Then, the error correction code generation unit 220 adds the parity to the write data WD and supplies the same to the control interface 260 as write data WD'.

The error detection unit 230 detects whether an error has occurred in read data. The error detection unit 230 receives read data RD' with parity from the control interface 260. The error detection unit 230 detects whether an error has occurred in read data using parity and then supplies the detection result to the error correction unit 240, the impedance adjustment command issuance unit 250, and the control interface 260. In addition, when no error is detected, the error detection unit 230 supplies data obtained by removing parity from read data RD' to the host interface 210 as read data RD. On the other hand, when an error is detected, the error detection unit 230 supplies read data RD' with parity to the error correction unit 240. Note that when there are lots of errors beyond the error correction performance of an ECC, the adjustment of impedance and read retry processing may be executed as in a fifth embodiment that will be described later.

The error correction unit 240 corrects an error in read data RD using parity when the error is detected. The error correction unit 240 supplies corrected read data RD to the host interface 210.

The impedance adjustment command issuance unit 250 issues an impedance adjustment command ZQCAL. The impedance adjustment command issuance unit 250 issues an impedance adjustment command ZQCAL at the input of a power supply to the memory controller 200 or at error detection. At error detection, the impedance adjustment command issuance unit 250 issues an impedance adjustment command ZQCAL, for example, when at least time corresponding to $T_R - T_S + T_M$ has elapsed since the transmission of the last read command. Here, $T_R$ represents latency time from the transmission of a read command to the end of receiving corresponding read data, and $T_s$ represents latency time from the transmission of an impedance adjustment command to the start of adjusting impedance. $T_M$ represents the time of a margin. With the transmission of an impedance adjustment command at the time, the adjustment of impedance is started after the end of receiving read data.

Here, as an impedance adjustment command ZQCAL issued at the input of a power supply, a ZQCAL long command in a DDR3 interface is, for example, used. In addition, as an impedance adjustment command ZQCAL issued at error detection, a ZQCAL long command or a ZQCAL short command in a DDR3 interface is, for example, used.

Note that the impedance adjustment command issuance unit 250 is an example of an adjustment control unit described in the claims.

The control interface 260 transmits and receives a command, an address, data, and a status to and from the non-volatile memory 300. The control interface 260 transmits a command, an address, and write data WD' to the non-volatile memory 300 via the signal line 209. However, when an error is detected, the control interface 260 suspends the transmission of a new command and an address accompanying data transfer until both the correction processing of the error and the adjustment processing of impedance are ended. Specifically, the control interface 260 suspends the transmission of a new command or the like until time Ti shown in the following formula 1 has elapsed after the detection of an error.

$$Ti = \max\{(T_R - T_S + T_M + T_Z), (T_C + T_M)\} - T_R \qquad \text{(Formula 1)}$$

Where, $T_Z$ represents time from the start to the end of adjusting impedance. $T_c$ represents time from the start to the end of correction. max(A,B) represents a function for returning a greater one of values A and B.

In addition, the control interface 260 receives read data RD' and a status and then supplies the read data RD' to the error detection unit 230.

(Configuration Example of Control Interface)

Figure 3:
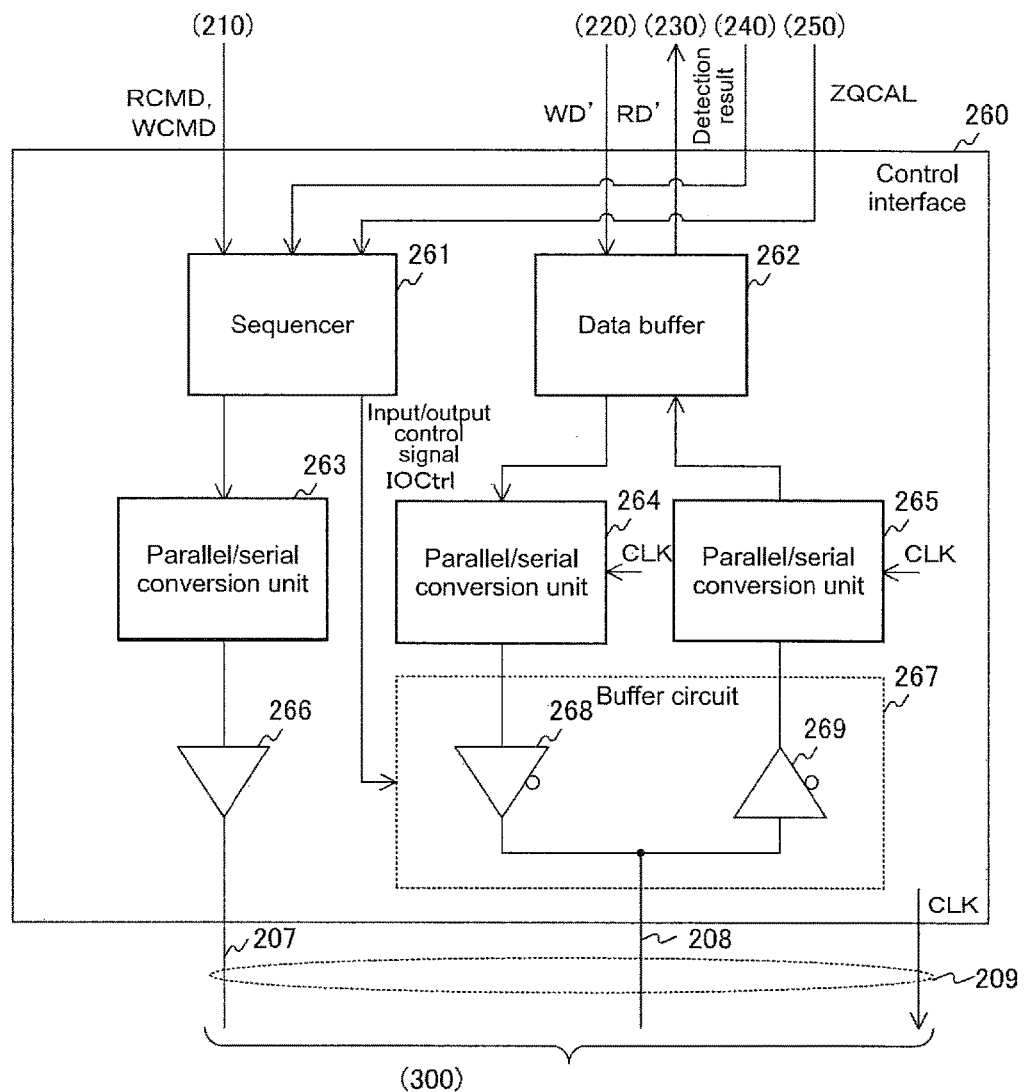
FIG. 3 is a block diagram showing a configuration example of a control interface according to the first embodiment.

FIG. 3 is a block diagram showing a configuration example of the control interface 260 according to the first embodiment. The control interface 260 includes a sequencer 261, a data buffer 262, parallel/serial conversion units 263 to 265, and buffer circuits 266 and 267. The buffer circuit 267 includes a driver 268 and a receiver 269. Note that although the buffer circuit 267 has a terminating resistor connected thereto, the terminating resistor is omitted for the purpose of description.

The sequencer 261 controls the input/output operation of the buffer circuit 267 based on the type of a command. The sequencer 261 receives a command and an address from the host interface 210 or the impedance adjustment command issuance unit 250. In addition, the sequencer 261 receives a detection result from the error detection unit 230. Then, the sequencer 261 determines whether the command represents a write command WCMD, a read command RCMD, or an impedance adjustment command ZQCAL. Note that the sequencer 261 may be implemented by hardware or software. Alternatively, the sequencer 261 may be implemented by the combination of hardware and software.

When the command represents a write command WCMD, the sequencer 261 supplies the command and an address to the parallel/serial conversion unit 263 and controls the buffer circuit 267 with an input/output control signal IOCtrl to activate the driver 268.

When the command represents a read command RCMD or an impedance adjustment command ZQCAL, the sequencer 261 supplies the command and an address to the parallel/serial conversion unit 263. However, when the detection result shows that an error has occurred, the sequencer 261 suspends the issuance of a new command (such as a read command RCMD) accompanying data transfer for a certain period of time until both the correction processing of the error and the adjustment processing of impedance are ended. In addition, the sequencer 261 controls the buffer circuit 267 with an input/output control signal IOCtrl to activate the receiver 269.

The parallel/serial conversion unit 263 converts a command and an address serving as parallel data into serial data in synchronism with a clock signal CLK. The parallel/serial conversion unit 263 sequentially supplies each of the serial data to the buffer circuit 266. Here, the clock signal CLK represents a clock signal generated by the control interface 260. In addition, the clock signal CLK is transmitted to the non-volatile memory 300 as a reference clock signal to be referred. Note that a clock generation circuit that generates a clock signal CLK is omitted in FIG. 3.

The buffer circuit 266 transmits serial data from the parallel/serial conversion unit 263 via a command/address line 207.

The data buffer 262 retains read data RD' or write data WD'. The retained write data WD' is supplied to the parallel/serial conversion unit 264, and the retained read data RD' is supplied to the error detection unit 230.

The parallel/serial conversion unit 264 converts write data WD' serving as parallel data into serial data in synchronism with a transmission clock signal TxCLK. The parallel/serial conversion unit 264 sequentially supplies each of the serial data to the driver 268.

The parallel/serial conversion unit 265 converts serial data from the receiver 269 into read data RD' serving as parallel data in synchronism with a clock signal CLK. The parallel/serial conversion unit 265 causes the data buffer 262 to retain the converted read data RD'.

The driver 268 transmits serial data from the parallel/serial conversion unit 264 via a data line 208.

The receiver 269 supplies serial data received via the data line 208 to the parallel/serial conversion unit 265. Note that the data line 208 may include a plurality of data lines to ensure desirable transfer throughput. In this case, a plurality of pairs of the parallel/serial conversion units 264 and 265 and the buffer circuits 267 are provided.

(Configuration Example of Non-Volatile Memory)

Figure 4:
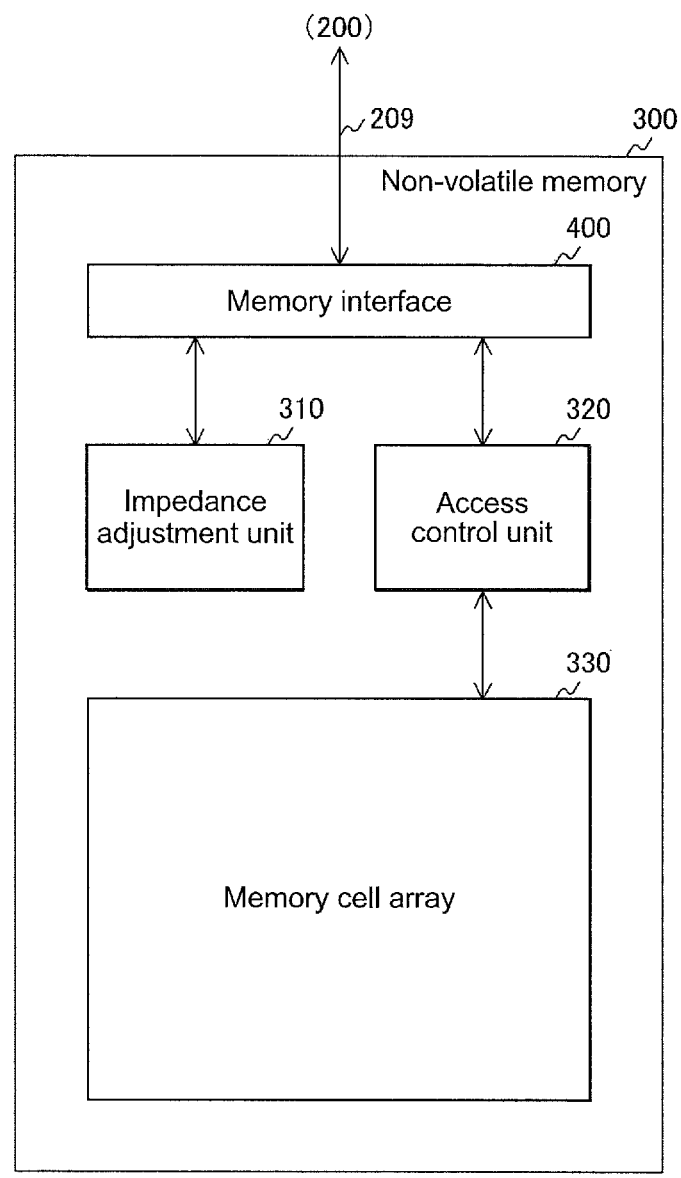
FIG. 4 is a block diagram showing a configuration example of a non-volatile memory according to the first embodiment.

FIG. 4 is a block diagram showing a configuration example of the non-volatile memory 300 according to the first embodiment. The non-volatile memory 300 includes a memory interface 400, an impedance adjustment unit 310, and an access control unit 320.

The memory interface 400 transmits and receives data to and from the memory controller 200. The memory interface 400 receives a command and an address via the signal line 209. In addition, the memory interface 400 receives write data WD' via the signal line 209 in synchronism with a reception clock signal. The memory interface 400 supplies the command and the like to the access control unit 320. Moreover, the memory interface 400 receives read data RD' from the access control unit 320. Then, the memory interface 400 transmits the read data RD' via the signal line 209 in synchronism with a transmission clock signal.

In addition, the memory interface 400 receives an impedance adjustment command ZQCAL via the signal line 209 and transmits and receives an adjustment start signal and an adjustment end signal to and from the impedance adjustment unit 310 according to the command. These signals will be described in detail later.

The impedance adjustment unit 310 adjusts an impedance mismatch in the memory interface 400.

The access control unit 320 accesses a memory cell array 330 and writes or reads data. When receiving a write command WCMD, an address, and write data WD', the access control unit 320 accesses the specified address in the memory cell array 330 and writes the write data WD' according to the command. In addition, when receiving a read command RCMD and an address, the access control unit 320 accesses the specified address in the memory cell array 330 and reads read data RD' according to the command. The access control unit 320 supplies the read data RD' thus read to the memory interface 400. In addition, the access control unit 320 generates a status based on an access condition and supplies the generated status to the memory interface 400.

The memory cell array 330 includes a plurality of memory cells arranged in a matrix pattern. As each of the memory cells, a ReRAM using a variable resistive element is, for example, used. Note that a non-volatile storage element other than a ReRAM may be used as a memory cell. For example, a NAND flash memory or a NOR flash memory may be used, and a ReRAM, a PCRAM, an MRAM, or the like may be used.

(Configuration Example of Memory Interface)

Figure 5:
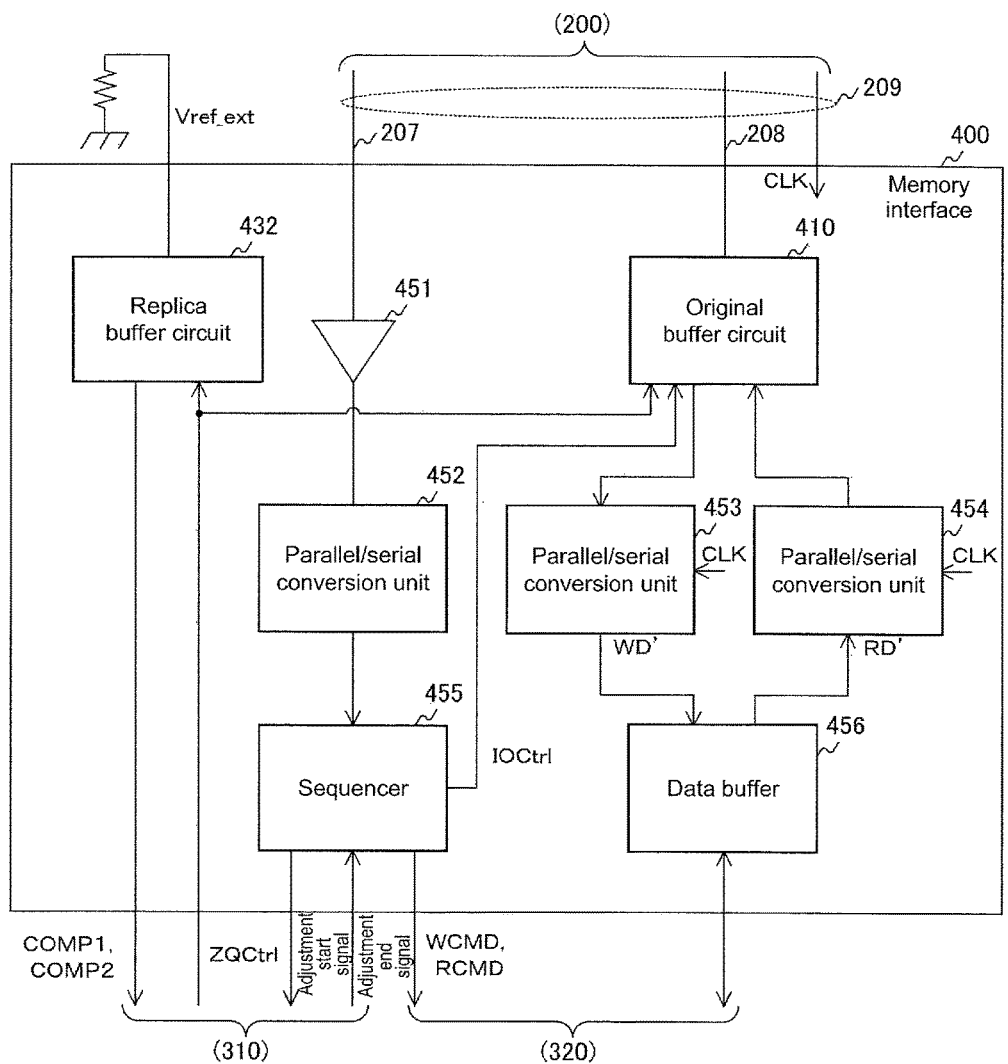
FIG. 5 is a block diagram showing a configuration example of a memory interface according to the first embodiment.

FIG. 5 is a block diagram showing a configuration example of the memory interface 400 according to the first embodiment. The memory interface 400 includes an original buffer 410, a replica buffer circuit 432, a buffer circuit 451, parallel/serial conversion units 452 to 454, a sequencer 455, and a data buffer 456.

The original buffer circuit 410 transmits and receives serial data via the data line 208. The original buffer circuit 410 supplies the received serial data to the parallel/serial conversion unit 453 and receives serial data to be transmitted from the parallel/serial conversion unit 454. In addition, the impedance of the original buffer circuit 410 is controlled with an impedance control signal ZQCtrl from the impedance adjustment unit 310.

The replica buffer circuit 432 is a circuit similar to the original buffer circuit 410. The impedance of the replica buffer circuit 432 is controlled with an impedance control signal ZQCtrl. In addition, the replica buffer circuit 432 supplies comparison results COMP1 and COMP2 to the impedance adjustment unit 310. These signals will be described in detail later.

The buffer circuit 451 receives serial data via the command/address line 207 and supplies the received serial data to the parallel/serial conversion unit 452.

The parallel/serial conversion unit 452 converts serial data from the buffer circuit 451 into a command and an address serving as parallel data. The parallel/serial conversion unit 452 supplies the command and the address to the sequencer 455.

The sequencer 455 controls the input/output operation of the original buffer circuit 410 based on the type of a command. The sequencer 455 receives a command and an address from the parallel/serial conversion unit 452 and determines whether the command represents a write command WCMD, a read command RCMD, or an impedance adjustment command ZQCAL.

When the command represents a write command WCMD, the sequencer 455 supplies the command and the address to the access control unit 320 and controls the original buffer circuit 410 with an input/output control signal IOCtrl to cause write data to be received.

When the command represents a read command RCMD, the sequencer 455 supplies the command and the address to the access control unit 320 and controls the original buffer circuit 410 with an input/output control signal IOCtrl to cause read data to be transmitted.

When the command represents an impedance adjustment command ZQCAL, the sequencer 455 generates an adjustment start signal and supplies the generated adjustment start signal to the impedance adjustment unit 310. Then, the sequencer 455 receives an adjustment end signal from the impedance adjustment unit 310. The sequencer 455 suspends the issuance of a new command accompanying data transfer until the adjustment end signal is received after an adjustment start signal.

The parallel/serial conversion unit 453 converts serial data from the original buffer circuit 410 into write data WD' serving as parallel data in synchronism with a reference clock signal CLK. The parallel/serial conversion unit 453 causes the data buffer 456 to retain the write data WD'.

The parallel/serial conversion unit 454 acquires read data RD' serving as parallel data from the data buffer 456 and converts the acquired read data RD' into serial data in synchronism with a reference clock signal CLK. The parallel/serial conversion unit 454 sequentially supplies the serial data to the original buffer circuit 410.

The data buffer 456 retains read data RD' or write data WD'. The retained write data WD' is supplied to the access control unit 320, and the retained read data RD' is supplied to the parallel/serial conversion unit 454.

(Configuration Example of Original Buffer Circuit)

Figure 6:
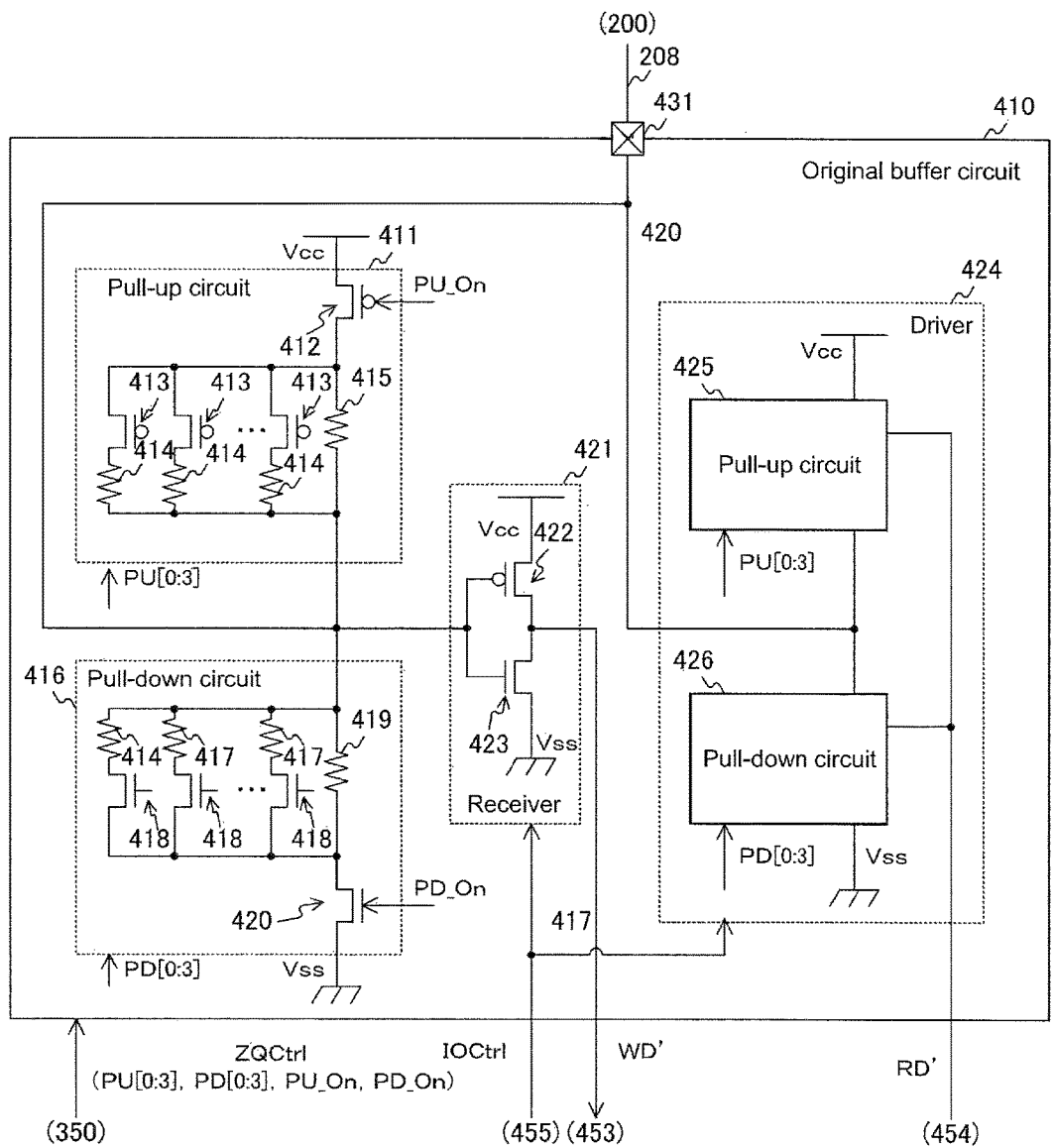
FIG. 6 is a block diagram showing a configuration example of an original buffer circuit according to the first embodiment.

FIG. 6 is a block diagram showing a configuration example of the original buffer circuit 400 according to the first embodiment. The original buffer circuit 410 includes a pull-up circuit 411, a pull-down circuit 416, a receiver 421, and a driver 424.

The pull-up circuit 411 is a circuit on the side of a power supply inserted between a terminal to which power supply voltage Vcc is applied and an external terminal 431. The pull-up circuit 411 includes a transistor 412, a resistor 415, and a certain number of transistors 413 and resistors 414. One end of the resistor 415 is connected to the transistor 412, and the other end thereof is connected to the receiver 421, the pull-down circuit 416, and the external terminal 431. The transistors 413 and the resistors 414 are connected in series, and each of the transistors 413 and the resistors 414 connected in series is connected to the resistor 415 in parallel.

As the transistor 412, a pMOS (Metal-Oxide Semiconductor) transistor is, for example, used. The power supply voltage Vcc is applied to the source electrode of the transistor 412, the resistor 413 is connected to the drain electrode thereof, and a pull-up control signal PU_On is input to the gate electrode thereof. Here, the pull-up control signal PU_On is a signal set at a high or low level to control a pull-up resistor and included in an impedance control signal ZQCtrl.

With this configuration, when the pull-up control signal PU_On is set at a low level, the transistor 412 is brought into an on-state, which creates a state in which the combined resistor of the resistors 414 and 415 is connected as a pull-up resistor. On the other hand, when the pull-up control signal PU_On is set at a high level, the pull-up resistor is brought into a non-connected state.

As the transistor 413, a pMOS transistor is, for example, used. In addition, any bit of a pull-up control signal PU[0:3] is input to the gate electrode of the transistor 413. The pull-up control signal PU[0:3] is four-bit data and included in an impedance control signal ZQCtrl. Since the pull-up control signal PU[0:3] has four bits, four pairs of the transistors 413 and the resistors 414 may be provided at a maximum.

With this configuration, the resistance of the pull-up circuit 411 is controlled according to the pull-up control signal PU[0:3]. Specifically, the larger the number of the bits "1" of the pull-up control signal PU[0:3], the more the transistors 413 are brought into an off-state and the higher the combined resistance of the resistors 414 and 415 connected in parallel (i.e., resistance of the pull-up circuit 411) becomes.

The pull-down circuit 416 is a circuit on the side of the ground inserted between a terminal to which reference voltage Vss is applied and the external terminal 431. The pull-down circuit 416 includes a certain number of resistors 417 and transistors 418, a resistor 419, and a transistor 420. One end of the resistor 419 is connected to the receiver 421, the pull-up circuit 411, and the external terminal 431, and the other end thereof is connected to the transistor 420. The resistors 417 and the transistors 418 are connected in series, and each of the resistors 417 and the transistors 418 connected in series is connected to the resistor 419 in parallel.

As the transistor 420, an nMOS transistor is, for example, used. The resistor 419 is connected to the source electrode of the transistor 420, the reference voltage Vss is applied to the drain electrode thereof, and a pull-down control signal PD_On is input to the gate electrode thereof. Here, the pull-down control signal PD_On is a signal set at a high or low level to control a pull-down resistor and included in an impedance control signal ZQCtrl.

With this configuration, when the pull-down control signal PD_On is set at a high level, the transistor 420 is brought into an on-state, which creates a state in which the combined resistor of the resistors 417 and 419 is connected as a pull-down resistor. On the other hand, when the pull-down control signal PD_On is set at a low level, the pull-down resistor is brought into a non-connected state.

As the transistor 418, an nMOS transistor is, for example, used. In addition, any bit of a pull-down control signal PD[0:3] is input to the gate electrode of the transistor 418. The pull-down control signal PD[0:3] is four-bit data and included in an impedance control signal ZQCtrl. Since the pull-down control signal PD[0:3] has four bits, four pairs of the transistors 417 and the resistors 418 may be provided at a maximum.

With this configuration, the resistance of the pull-down circuit 416 is controlled according to the pull-down control signal PD[0:3]. Specifically, the larger the number of the bits "0" of the pull-down control signal PU[0:3], the more the transistors 418 are brought into an off-state and the higher the combined resistance of the resistors 418 and 419 connected in parallel (i.e., resistance of the pull-down circuit 416) becomes.

The resistors of the pull-up circuit 411 and the pull-down circuit 416 are used as terminating resistors connected to the termination of the data line 208. Since the terminating resistors are provided on the chip of the non-volatile memory 300, they are also called ODTs (On Die Terminations).

The receiver 421 receives serial data from the memory controller 200. The receiver 421 includes transistors 422 and 423. A pMOS transistor is, for example, used as the transistor 422, and an nMOS transistor is, for example, used as the transistor 423.

The power supply voltage Vcc is applied to the source electrode of the transistor 422, and the drain electrode of the transistor 422 is connected to the source electrode of the transistor 423 and the parallel/serial conversion unit 453. In addition, the gate electrode of the transistor 422 is connected to the external terminal 431.

The source electrode of the transistor 423 is connected to the drain electrode of the transistor 422 and the parallel/serial conversion unit 453, and the reference voltage Vss is applied to the drain electrode of the transistor 422. In addition, the gate electrode of the transistor 423 is connected to the external terminal 431.

With this configuration, the receiver 421 receives serial data transmitted via the data line 208 and then supplies the received data to the parallel/serial conversion unit 453. In addition, the receiver 421 is activated or deactivated according to an input/output control signal IOCtrl. Note that elements and wiring for activating or deactivating the receiver 421 are omitted in FIG. 6.

The driver 424 includes a pull-up circuit 425 and a pull-down circuit 426. The configuration of the pull-up circuit 425 is the same as that of the pull-up circuit 411. In the pull-up circuit 425, however, the gate electrode of a transistor corresponding to the transistor 412 is connected to the parallel/serial conversion unit 454. The configuration of the pull-down circuit 426 is the same as that of the pull-down circuit 416. In the pull-down circuit 426, however, the gate electrode of a transistor corresponding to the transistor 420 is connected to the parallel/serial conversion unit 454.

With this configuration, the driver 424 transmits serial data from the parallel/serial conversion unit 454 to the memory controller 200. In addition, the driver 424 is activated or deactivated according to an input/output control signal IOCtrl. Note that elements and wiring for activating or deactivating the driver 424 are omitted in FIG. 6.

(Configuration Example of Replica Buffer Circuit)

Figure 7:
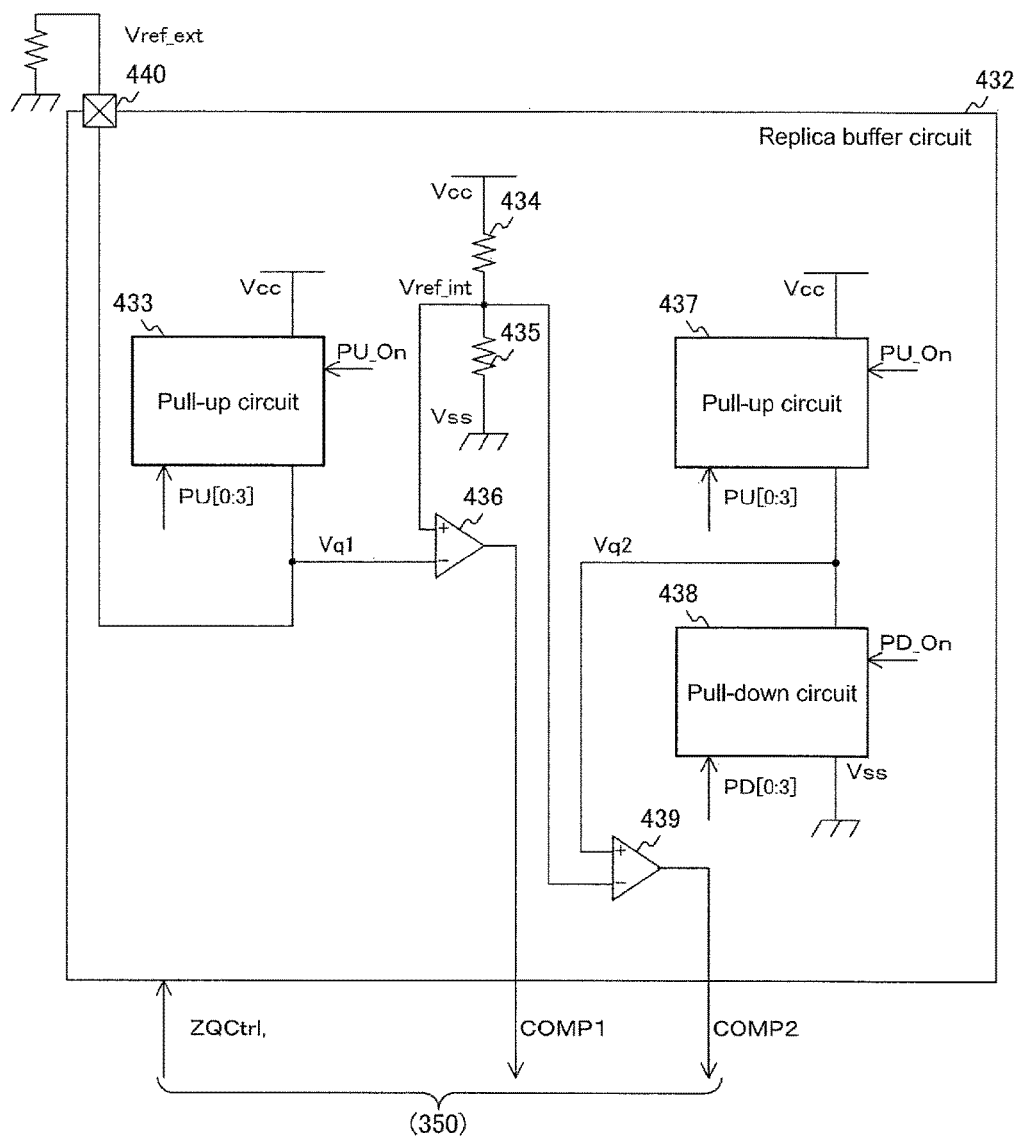
FIG. 7 is a block diagram showing a configuration example of a replica buffer circuit according to the first embodiment.

FIG. 7 is a block diagram showing a configuration example of the replica buffer circuit 432 according to the first embodiment. The replica buffer circuit 432 includes an external terminal 440, a pull-up circuit 433, resistors 434 and 435, and a comparator 436. In addition, the replica buffer circuit 432 includes a pull-up circuit 437, a pull-down circuit 438, and a comparator 439.

The external terminal 440 is connected to an external resistor provided external to the non-volatile memory 300. The reference voltage Vss is applied to one end of the external resistor, and the resistance is set at substantially the same value as that of a pull-down resistor on the side of the memory controller 200.

The pull-up circuit 433 is inserted between a terminal to which the power supply voltage Vcc is applied and the external terminal 440. The configuration of the pull-up circuit 433 is the same as that of the pull-up circuit 411 shown in FIG. 6. The power supply voltage Vcc is supplied to one end of the pull-up circuit 433, and the other end of the pull-up circuit 433 is connected to the external terminal 440 and the input terminal of the comparator 436.

With this configuration, when a pull-up control signal PU_On is set at a low level, voltage Vq1 obtained by dividing the potential difference between the power supply voltage Vcc and the reference voltage Vss with the resistance ratio between the pull-up circuit 433 and the external resistor is applied to the input terminal of the comparator 436. On the other hand, when a pull-up control signal PU_On is set at a high level, the pull-up circuit 433 is brought into a non-connected state, which makes the value of the voltage Vq1 be the same as prescribed reference voltage Vref_ext depending on the value of the external resistor.

In addition, the resistors 434 and 435 connected in series are inserted between the power supply voltage Vcc and the reference voltage Vss. Moreover, the node between these resistors is connected to the input terminals of the comparators 436 and 439. With this configuration, voltage obtained by dividing the potential difference between the power supply voltage Vcc and the reference voltage Vss with the resistance ratio between the resistors 434 and 435 is applied to the input terminals of the comparators 436 and 439 as reference voltage Vref_int.

When the voltage of the reference voltage Vref_int is made substantially the same as the voltage Vq1, the value of the reference voltage Vref_int is set at a value such that the impedance of the transmission circuit of one of the memory controller 200 and the non-volatile memory 300 matches the impedance of the reception circuit of the other thereof. The transmission circuit includes a driver or the like, and the reception circuit includes a receiver, a terminating resistor, a signal line, or the like.

The comparator 436 compares the voltage Vq1 with the reference voltage Vref_int. The comparator 436 supplies the comparison result to the impedance adjustment unit 310 as a comparison result COMP1. The comparison result COMP1 represents a signal that is set at a high level when the voltage Vq1 is less than the reference voltage Vref_inf and set at a low level when the voltage Vq1 is greater than the reference voltage Vref_inf.

The configuration of the pull-up circuit 437 is the same as that of the pull-up circuit 411 shown in FIG. 6. The power supply voltage Vcc is supplied to one end of the pull-up circuit 437, and the other end of the pull-up circuit 437 is connected to the pull-down circuit 438 and the input terminal of the comparator 439.

The configuration of the pull-down circuit 438 is the same as that of the pull-down circuit 416 shown in FIG. 6. One end of the pull-down circuit 438 is connected to the pull-up circuit 437 and the input terminal of the comparator 439, and the other end of the pull-down circuit 438 is connected to the reference voltage Vss.

With this configuration, when a pull-up control signal PU_On is set at a low level and a pull-down control signal PD_On is set at a high level, voltage Vq2 corresponding to the resistance ratio between the pull-up circuit 437 and the pull-down circuit 438 is applied to the input terminal of the comparator 439.

The comparator 439 compares the voltage Vq2 with the reference voltage Vref_int. The comparator 439 supplies the comparison result to the impedance adjustment unit 310 as a comparison result COMP2. The comparison result COMP2 represents a signal that is set at a high level when the reference voltage Vref_inf is less than the voltage Vq2 and set at a low level when the reference voltage Vref_inf is greater than the voltage Vq2.

(Configuration Example of Impedance Adjustment Unit)

Figure 8:
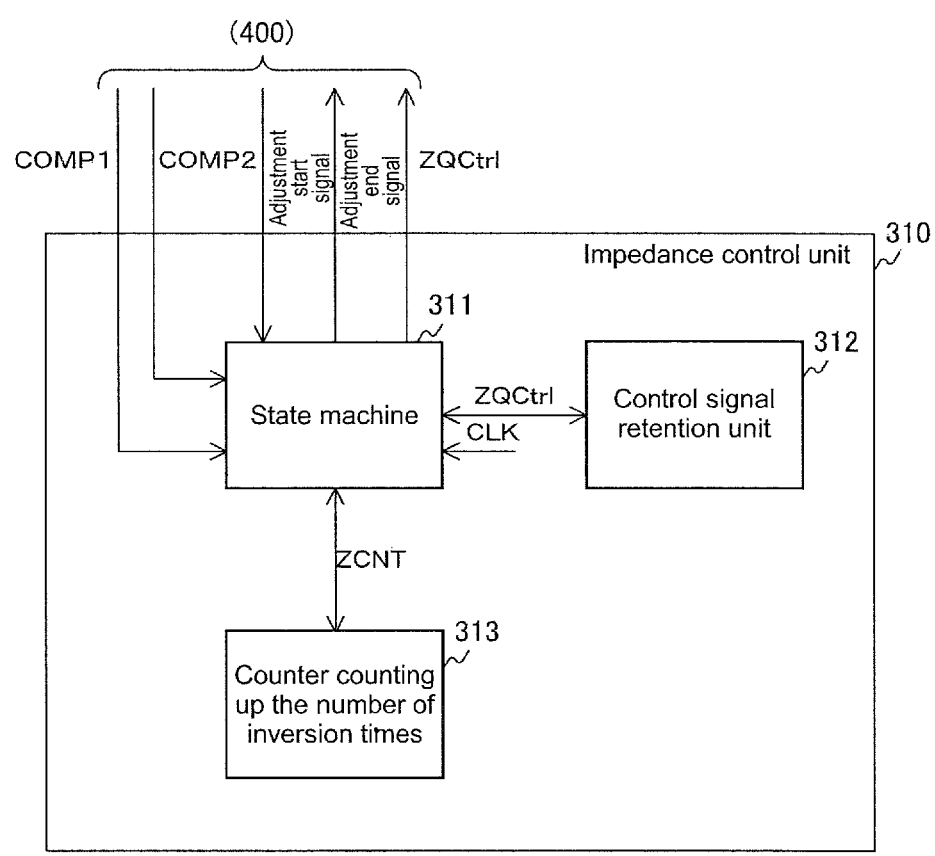
FIG. 8 is a block diagram showing an example of an impedance adjustment unit according to the first embodiment.

FIG. 8 is a block diagram showing an example of the impedance adjustment unit 310 according to the first embodiment. The impedance adjustment unit 310 includes a state machine 311, a control signal retention unit 312, and a counter 313 that counts up the number of the inverted times.

The state machine 311 adjusts impedance in the memory interface 400. When receiving an adjustment start signal from the memory interface 400, the state machine 311 starts the adjustment of impedance.

First, the state machine 311 outputs a pull-up control signal PU_On set at a low level to the memory interface 400. Thus, the adjustment of the value of a pull-up resistor is made possible.

In synchronism with an internal clock signal CLK, the state machine 311 controls the value of the pull-up resistor according to the value of a comparison result COMP1. The control amount of the pull-up resistor is set at a constant value every clock cycle. Specifically, when the comparison result COMP1 is set at a high level, a voltage Vq1 of an object to be controlled is less than a reference voltage Vref_int. Therefore, the state machine 311 decreases the value of the pull-up resistor with a pull-up control signal PU[0:3]. As a result, the voltage Vq1 is increased. On the other hand, when the comparison result COMP1 is set at a low level, the state machine 311 increases the value of the pull-up resistor.

In addition, the state machine 311 causes the counter 313 to count up the number of the inverted times of the comparison result COMP1. When a counter value ZCNT reaches a constant number (for example, "four"), the state machine 311 determines that the adjustment of the pull-up resistor has been ended.

When the adjustment of the pull-up resistor is ended, the state machine 311 outputs a pull-up control signal PU_On set at a low level and a pull-down control signal PD_On set at a high level to the memory interface 400. Thus, the adjustment of the value of a pull-down resistor is made possible. In addition, the state machine 311 sets the counter value ZCNT at an initial value (for example, "zero").

In synchronism with an internal clock signal CLK, the state machine 311 controls the value of the pull-down resistor according to the value of a comparison result COMP2. The control amount of the pull-down resistor is set at a constant value every clock cycle. Specifically, when the comparison result COMP2 is set at a low level, a voltage Vq2 of an object to be controlled is less than or equal to a reference voltage Vref_int. Therefore, the state machine 311 increases the value of the pull-down resistor with a pull-down control signal PD[0:3]. As a result, the voltage Vq2 is increased. On the other hand, when the comparison result COMP2 is set at a high level, the state machine 311 decreases the value of the pull-down resistor.

In addition, the state machine 311 causes the counter 313 to count up the number of the inverted times of the comparison result COMP2. When a counter value ZCNT reaches a constant number (for example, "four"), the state machine 311 determines that the adjustment of the pull-down resistor has been ended.

When the adjustments of the pull-up resistor and the pull-down resistor are ended or when adjustment time has elapsed, the state machine 311 generates an adjustment end signal and outputs the generated adjustment end signal to the memory interface 400. Here, for example, the adjustment time is set at 64 clocks for a ZQCAL short command and set at 256 clocks for a ZQCAL long command. In addition, the state machine 311 sets the counter value ZCNT at an initial value. Moreover, the state machine 311 causes the control signal retention unit 312 to retain an impedance control signal ZQCtrl (PU_On, PD_On, PU[0:3], and PU_[0:3]). Then, the state machine 311 continuously supplies the control signal to the memory interface 400.

Note that although the state machine 311 initially adjusts the pull-up resistor, it may initially adjust the pull-down resistor. In addition, although the state machine 311 adjusts both the pull-up resistor and the pull-down resistor, it may adjust only one of the pull-up resistor and the pull-down resistor.

The control signal retention unit 312 retains the impedance control signal ZQCtrl.

The counter 313 counts up the number of the inverted times of the comparison result COMP1 or the comparison result COMP2.

Figure 9:
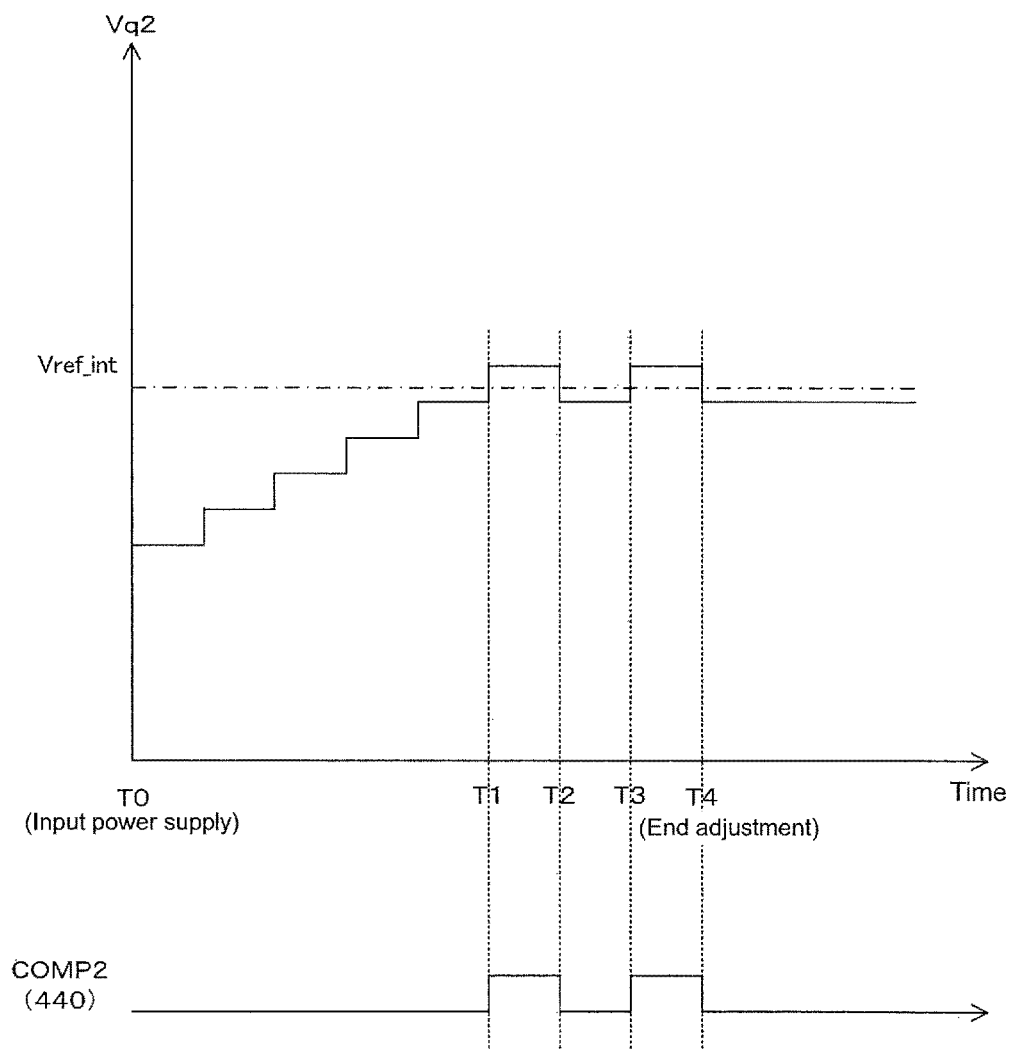
FIG. 9 is a graph showing an example of a method of controlling impedance at the input of a power supply according to the first embodiment.

FIG. 9 is a graph showing an example of a method of controlling impedance at the input of a power supply according to the first embodiment. In FIG. 9, the vertical axis represents voltage Vq2, and the horizontal axis represents time. At the input of a power supply, the pull-down resistor on the side of the non-volatile memory 300 is set at a minimum value. As a result, the Vq2 to be controlled becomes minimum. In synchronism with an internal clock signal CLK, the non-volatile memory 300 controls the pull-down resistor to make the voltage Vq2 be substantially the same as a reference voltage Vref_int. Specifically, it is determined that the pull-down resistor is made substantially the same as the reference voltage Vref_int when a comparison result COMP2 is inverted a certain number of times (for example, four times). Here, the control amount of impedance every clock cycle is set at a constant value. Note that the adjustment of the pull-up resistor executed before the adjustment of the pull-down resistor is omitted in FIG. 9.

For example, when a power supply is input at time T0 and the voltage Vq2 exceeds the reference voltage Vref_int at time T1, the comparison result COMP2 is inverted from a low level to a high level. Then, at time T2, when the non-volatile memory 300 controls the impedance to decrease the voltage Vq2 and the voltage Vq becomes less than the reference voltage Vref_int, the comparison result COMP2 is inverted from a high level to a low level. Subsequently, at time T3 and time T4, it is assumed that the comparison result COMP2 is inverted with an increase and decrease in the voltage Vq. Since the number of the inverted times reaches four times at time T4, the non-volatile memory 300 determines that the adjustment processing of the impedance has been ended.

The reference voltage Vref_int is set at a value such that the impedance matches between a circuit on the transmission side and a circuit on the reception side of the interface 400. Therefore, when the impedance is controlled based on the reference voltage Vref_int, the impedance matches between the transmission side and the reception side, which reduces a transfer error in the interface 400.

Figure 10:
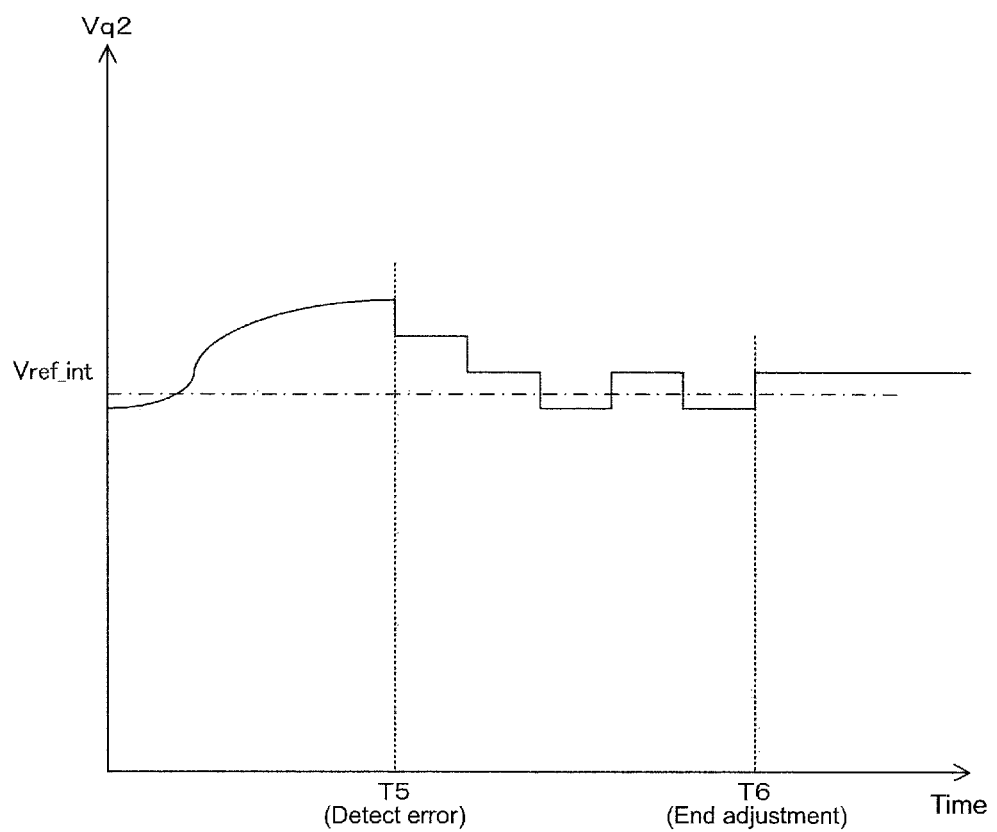
FIG. 10 is a graph showing an example of a method of controlling impedance at error correction according to the first embodiment.

FIG. 10 is a graph showing an example of a method of controlling impedance at error correction according to the first embodiment. In FIG. 10, the vertical axis represents voltage Vq2, and the horizontal axis represents time. After the input of a power supply, the value of impedance is fluctuated with a change in temperature or the like in the interface 400. This phenomenon is called a temperature drift. As a result, the impedance does not match between the transmission side and the reception side of the interface 400. The impedance mismatch causes the reflection of a signal, and an error is detected at time T5. The memory controller 200 issues an impedance adjustment command ZQCAL, and the non-volatile memory 300 starts the adjustment of the impedance. Here, the control amount of the impedance every clock cycle is set at a constant value. At time T6, when the number of the inverted times of a comparison result COMP2 reaches a certain number of times, the non-volatile memory 300 determines that the adjustment processing has been ended and maintains the matching state of the impedance.

(Operation Example of Memory Controller)

Figure 11:
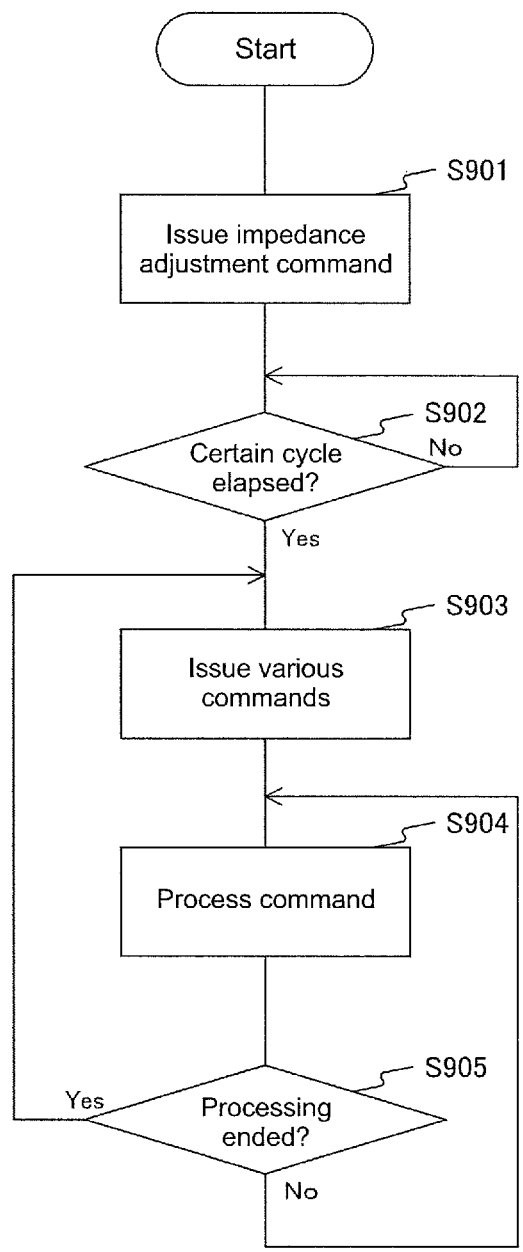
FIG. 11 is a flowchart showing an operation example of the memory controller according to the first embodiment.

FIG. 11 is a flowchart showing an operation example of the memory controller 200 according to the first embodiment. The operation is started, for example, when a power supply is input to the memory controller 200.

Immediately after the input a the power supply, the memory controller 200 issues an impedance adjustment command and transmits the issued impedance adjustment command to the non-volatile memory 300 (step S901). The memory controller 200 determines whether a certain cycle has elapsed (step S902). The time is set to execute the adjustment processing of impedance. When the certain cycle has not elapsed (No in step S902), the memory controller 200 returns to step S902.

When the certain cycle has elapsed (Yes in step S902), the memory controller 200 receives a command from the host computer 100, translates and interprets the received command, and issues various commands (step S903).

The memory controller 200 executes the processing (such as write processing and read processing) of the interpreted command (step S904). When an error is detected in the read processing, an impedance adjustment command is issued as will be described later in FIGS. 13 and 14.

The memory controller 200 determines whether the processing of the command has been ended (step S905). When the processing has not been ended (No in step S905), the memory controller 200 returns to step S904. When the processing has been ended (Yes in step S905), the memory controller 200 returns to step S903.

Figure 12:
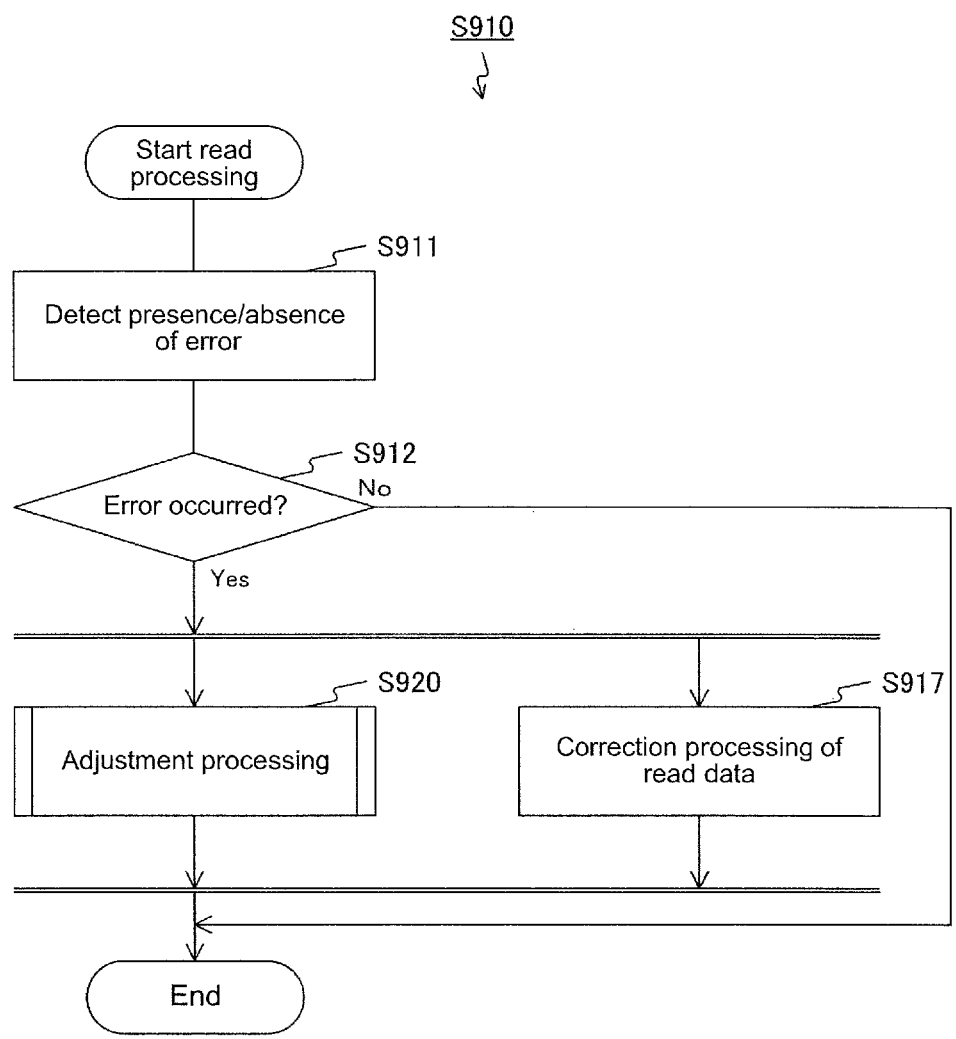
FIG. 12 is a flowchart showing an example of read processing according to the first embodiment.

FIG. 12 is a flowchart showing an example of the read processing according to the first embodiment. The memory controller 200 transmits a read command and an address to the non-volatile memory 300 and receives read data and parity. Then, the memory controller 200 detects the presence or absence of an error in the read data using the parity (step S911).

Using the parity, the memory controller 200 determines whether an error has occurred in the read data (step S912).

When an error has occurred (Yes in step S912), the memory controller 200 executes both adjustment processing (step S920) and the correction processing of the read data (step S917) in parallel. After both the adjustment processing and the correction processing are ended or when no error has occurred (No in step S912), the memory controller 200 transmits the read data to the host computer 100 to end the read processing.

Figure 13:
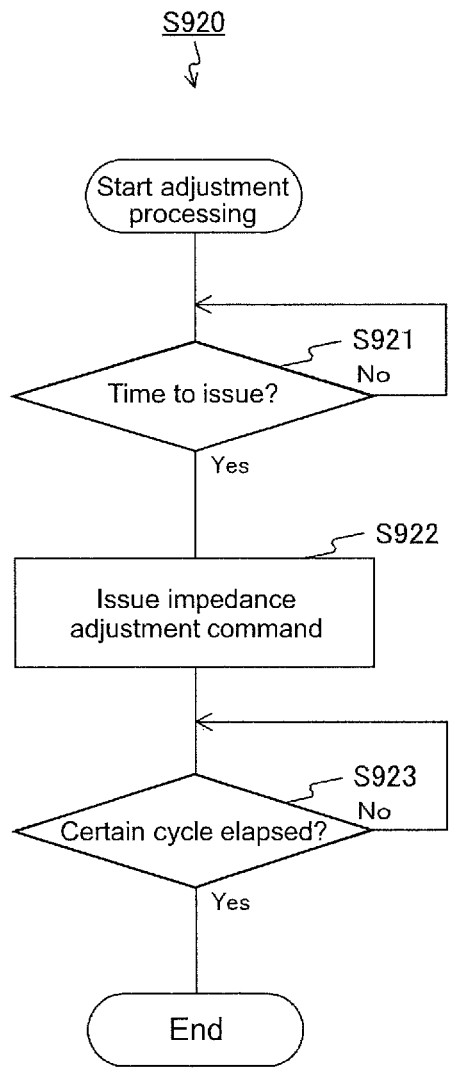
FIG. 13 is a flowchart showing an example of adjustment processing according to the first embodiment.

FIG. 13 is a flowchart showing an example of the adjustment processing according to the first embodiment. The memory controller 200 determines whether now is the time to issue an impedance adjustment command (step S921). For example, the time is such that the adjustment processing of impedance is started when the transmission of all read data is ended. When the time has not elapsed (No in step S921), the memory controller 200 returns to step S921.

On the other hand, when now is the time to issue an impedance adjustment command (Yes in step S921), the memory controller 200 issues the impedance adjustment command (step S922). Then, the memory controller 200 determines whether a certain cycle has elapsed (step S923). The certain cycle represents time until the adjustment processing of impedance is ended. When the certain cycle has not elapsed (No in step S923), the memory controller 200 returns to step S923. When the certain cycle has elapsed (Yes in step S923), the memory controller 200 ends the adjustment processing.

(Operation Example of Non-Volatile Memory)

Figure 14:
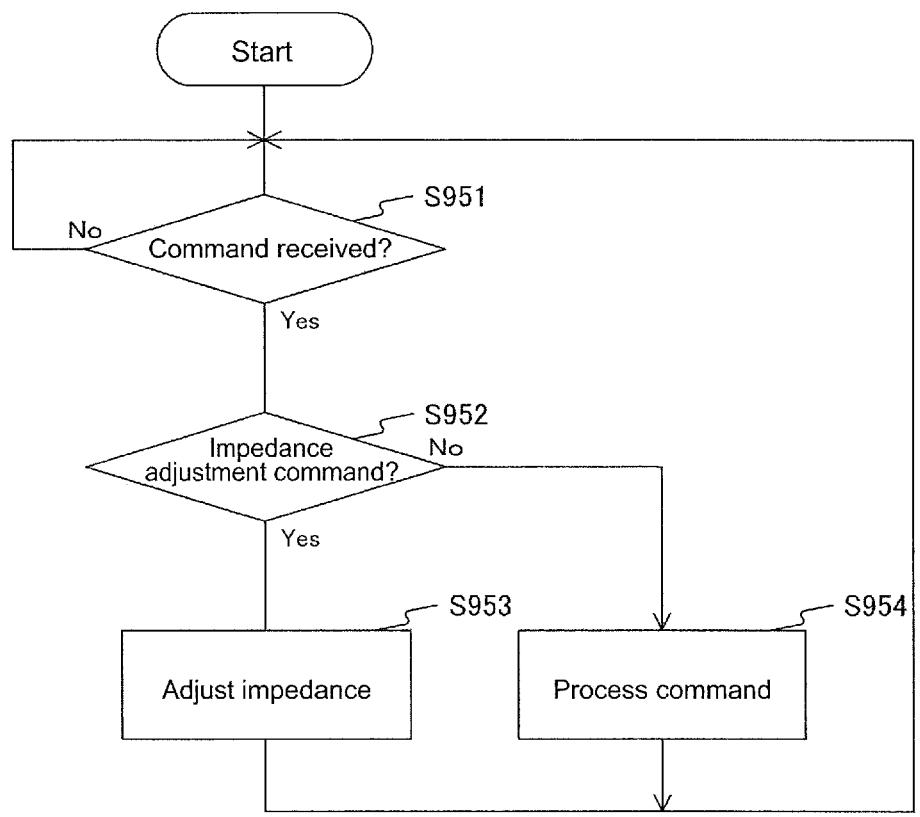
FIG. 14 is a flowchart showing an operation example of the non-volatile memory according to the first embodiment.

FIG. 14 is a flowchart showing an operation example of the non-volatile memory 300 according to the first embodiment. The operation is started, for example, when a power supply is input to the non-volatile memory 300.

The non-volatile memory 300 determines whether various commands have been received from the memory controller 200 (step S951). When the commands have not been received (No in step S951), the non-volatile memory 300 returns to step S951. When the commands have been received (Yes in step S951), the non-volatile memory 300 determines whether the commands include an impedance adjustment command (step S952). When the commands include an impedance adjustment command (Yes in step S952), the non-volatile memory 300 adjusts the impedance of the interface 400 (step S953).

When the commands do not include an impedance adjustment command (No in step S952), the non-volatile memory 300 executes various processing (such as read processing and write processing) according to the commands (step S954). After step S953 or step S954, the non-volatile memory 300 returns to step S951.

Figure 15:
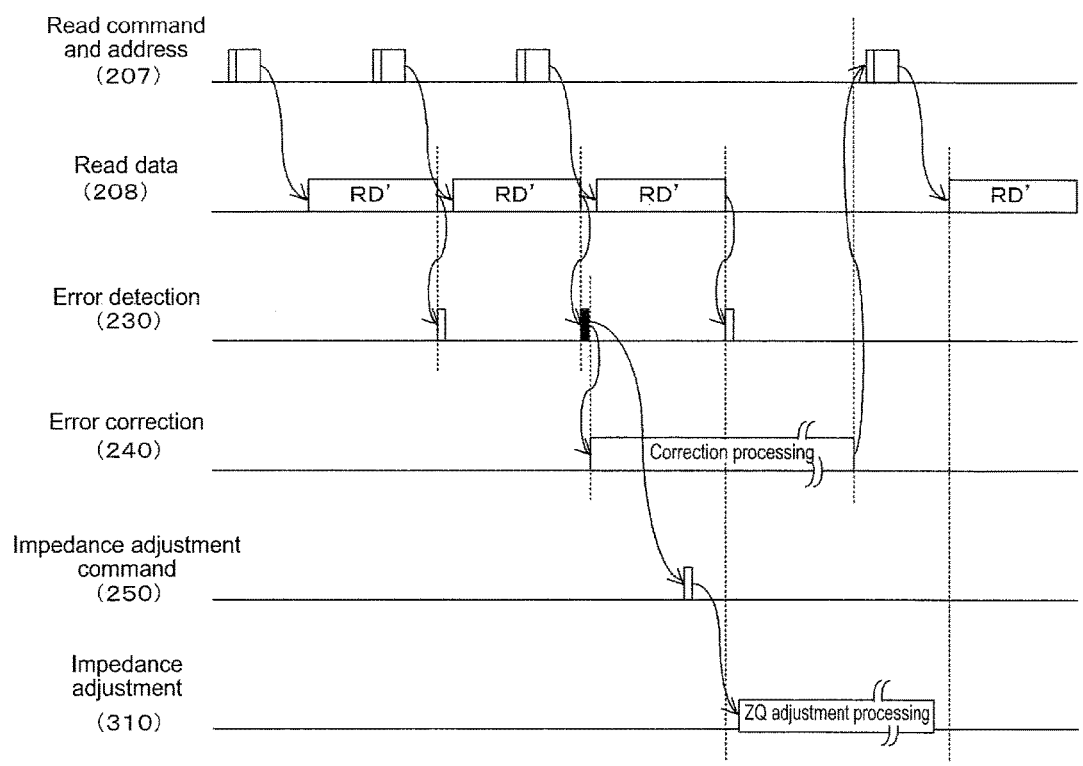
FIG. 15 is a timing chart showing an operation example of the memory system according to the first embodiment.

FIG. 15 is a timing chart showing an operation example of the memory system according to the first embodiment.

It is assumed that the memory controller 200 sequentially transmits four read commands and addresses to the non-volatile memory 300 via the command/address line 207.

The non-volatile memory 300 reads read data RD' according to the read commands and then transmits the read data RD' thus read to the memory controller 200 via the data line 208.

The error detection unit 230 of the memory controller 200 detects the presence or absence of an error in each of the read data RD' using parity. Here, it is assumed that a transfer error occurs in the transfer of the second read data RD'. In this case, the error correction unit 240 of the memory controller 200 executes the correction processing of the error.

When detecting the error, the memory controller 200 suspends the issuance of a new command accompanying data transfer. However, if the third read command has been issued at this stage, the third read data RD' is transferred during the correction processing. Note that the issuance of a new command may be suspended at any time so long as it is possible to suspend the transfer of data for the adjustment of impedance.

The impedance adjustment command issuance unit 250 of the memory controller 200 issues an impedance adjustment start command such that the adjustment of impedance is started after the transfer of the third read data RD' is ended.

The impedance adjustment unit 310 of the non-volatile memory 300 starts the adjustment processing of the impedance (ZQ adjustment processing) according to the impedance adjustment command. Since the correction processing and the adjustment processing are executed in parallel as described above, at least part of the time of the adjustment processing is overlapped with the time of the correction processing.

The memory controller 200 transmits a read command and an address to the non-volatile memory 300 such that the reading of the next read data RD' is started after both the correction processing and the adjustment processing are ended.

Note that although the memory controller 200 starts the adjustment processing of impedance during the error correction processing, other configurations may be employed. For example, the memory controller 200 may start the adjustment processing of impedance before the correction processing of an error.

In addition, although the memory controller 200 has an impedance adjustment command interrupted before the issuance of a command accompanying the data transfer, other configurations may be employed. For example, the memory controller 200 may have an impedance adjustment command interrupted before read data RD' is output from the non-volatile memory 300. Specifically, when an error has occurred in read data RD' read by a read command, the memory controller 200 discards a read command subsequent to the read command and executes the correction processing of the error. Then, after ending the correction processing of the error, the memory controller 200 executes again the read command once discarded and issues an impedance adjustment command before read data RD' is read.

In addition, the memory controller 200 may issue a write command and have an impedance adjustment command interrupted before outputting write data. Specifically, when an error has occurred in read data RD' read by a read command, the memory controller 200 discards a write command subsequent to the read command and executes the correction processing of the error. Then, after ending the correction processing of the error, the memory controller 200 executes again the write command once discarded and issues an impedance adjustment command before outputting write data.

In addition, the memory controller 200 may switch between the control of issuing an impedance adjustment command at regular intervals and the control of issuing an impedance adjustment command at error detection exemplified in FIG. 12. For example, the memory controller 200 switches to the control exemplified in FIG. 12 when prescribed conditions are satisfied. As such, there are a case in which an uncorrectable error occurs and a case in which the number of errors exceeds a threshold.

In addition, every reception of a certain number of write commands, the controller 200 may read read data RD' to detect the presence or absence of an error and confirm whether the adjustment processing is desired.

Since the memory controller 200 executes the correction processing when an error occurs and starts the adjustment processing of impedance according to the first embodiment of the present technology, at least part of the time of the adjustment processing may be overlapped with the time of the correction processing. This configuration reduces adjustment time at which the transmission and reception of data is not allowed and increases the communication speed between the memory controller 200 and the non-volatile memory 300.

First Modified Example

According to the first embodiment, the adjustment processing is necessarily executed when an error is detected. However, the adjustment processing may not be executed when an error is relatively small. The memory controller 200 of a first modified example is different from that of the first embodiment in that the adjustment processing is executed when the number of errors exceeds a threshold.

The error correction code generation unit 220 of the first modified example calculates the number of errors in read data RD' using parity.

The impedance adjustment command issuance unit 250 issues an impedance adjustment command when the number of errors exceeds a prescribed threshold Th1. Here, a number less than the number of errors capable of being corrected by parity (i.e., error correction capability) is set as the threshold Th1.

Figure 16:
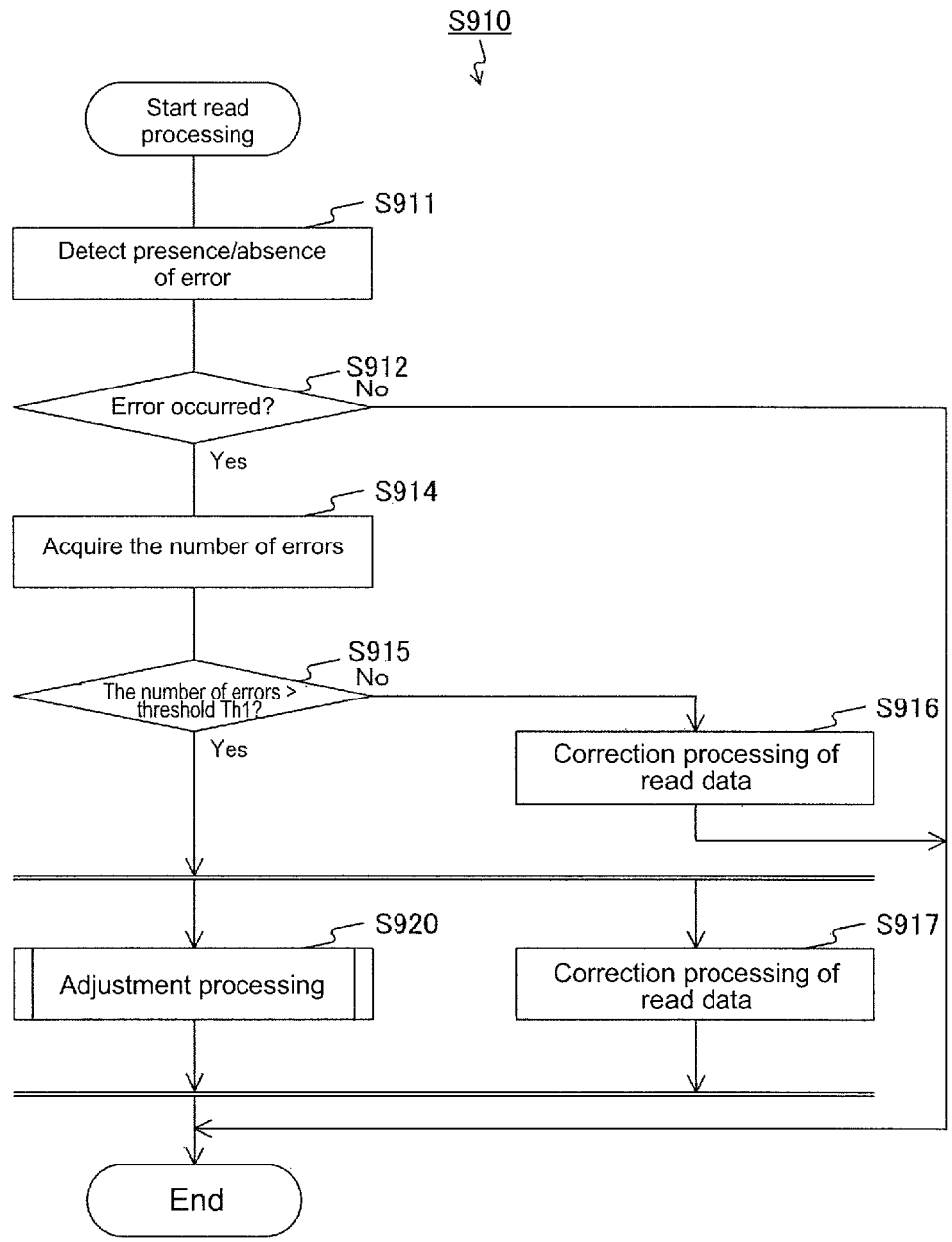
FIG. 16 is a flowchart showing an operation example of the memory controller according to a first modified example of the first embodiment.

FIG. 16 is a flowchart showing an operation example of the memory controller 200 according to the first modified example of the first embodiment. The operation of the modified example is different from that of the first embodiment in that the memory controller 200 further executes the processing of steps S914, S915, and S916.

When errors have occurred (Yes in step S912), the memory controller 200 acquires the number of the errors using parity (step S914). Then, the memory controller 200 determines whether the number of the errors exceeds a threshold Th1 (step S915).

When the number of the errors exceeds the threshold Th1 (Yes in step S915), the memory controller 200 executes the adjustment processing (step S920) and the correction processing (step S917) in parallel. On the other hand, when the number of the errors is less than or equal to the threshold Th1 (No in step S915), the memory controller 200 executes only the correction processing (step S916). After ending both the processing of steps S920 and S917 or the processing of step S916, the memory controller 200 transmits read data RD' to the host computer 100 to end the read processing.

Since the memory controller 200 executes the adjustment processing when the number of errors exceeds a threshold according to the first modified example as described above, the number of the times of the adjustment processing may be reduced. This configuration reduces adjustment time at which the transmission and reception of data is not allowed and increases the communication speed between the memory controller 200 and the non-volatile memory 300.

Second Modified Example

The control amount of impedance every clock cycle is set at a constant value according to the first embodiment, but it may be changed during the adjustment of the impedance. The non-volatile memory 300 of a second modified example is different from that of the first embodiment in that the control amount of impedance is changed during the adjustment of the impedance. Specifically, in the adjustment processing executed after the input of a power supply, the memory controller 200 starts the adjustment processing with a relatively large control amount and then gradually decreases the control amount. For example, the memory controller 200 decreases the control amount of impedance every inversion of a comparison result COMP1 or COMP2. Thus, time from the start to the end of the adjustment processing is reduced.

Figure 17:
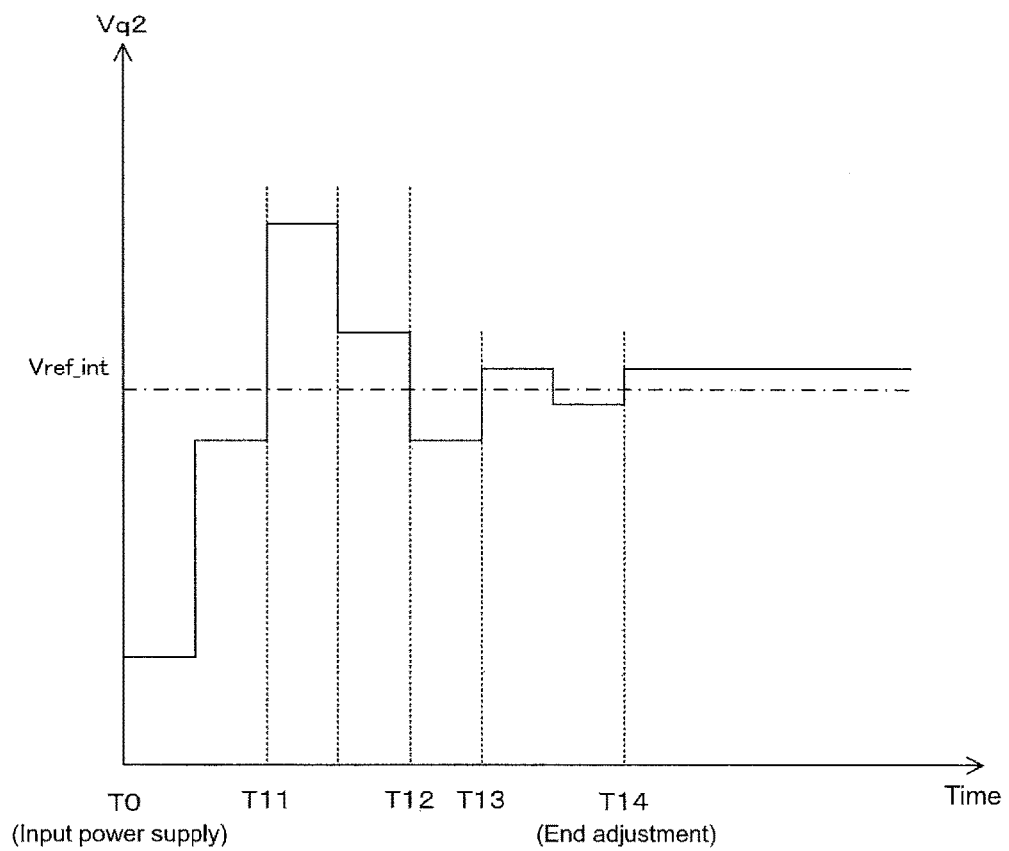
FIG. 17 is a graph showing an example of a method of controlling impedance at the input of a power supply according to a second modified example of the first embodiment.

FIG. 17 is a graph showing an example of a method of controlling impedance at the input of a power supply according to the second modified example of the first embodiment. In FIG. 17, the vertical axis represents voltage Vq2, and the horizontal axis represents time. After the input of the power supply at time T0, the non-volatile memory 300 starts the adjustment processing with the control amount of impedance every clock cycle maximized. Then, when a comparison result COMP2 is inverted at time T11, the non-volatile memory 300 decreases the control amount. When the comparison result COMP2 is inverted again at subsequent time T12, the non-volatile memory 300 further decreases the control amount. When the comparison result COMP2 is inverted again at time T13, the non-volatile memory 300 decreases the control amount. As a result, the control amount is minimized. Then, when the number of the inverted times reaches a certain number of times at time T14, the non-volatile memory 300 determines that the adjustment has been ended.

Note that as in the first embodiment, the adjustment processing is executed at a certain control amount every clock cycle when an error is detected.

Since the non-volatile memory 300 gradually decreases the control amount of impedance from a maximum value according to the second modified example as described above, time from the start to the end of the adjustment processing may be reduced.

2. Second Embodiment (Configuration Example of Memory Controller)

According to the first embodiment, the memory system adjusts impedance at error detection. However, transmission characteristics other than impedance may be adjusted by an interface. Examples of the transmission characteristics other than impedance include the transmission timing of data. Here, the transmission timing of data indicates the transmission timing of data from one of a memory controller 200 and a non-volatile memory 300 to the other thereof or the reception timing of transmitted data by the other of the memory controller 200 and the non-volatile memory 300. The memory system of a second embodiment is different from that of the first embodiment in that the transmission timing of data is adjusted at error detection. The memory system adjusts the transmission timing of data, for example, by adjusting the phase of a reception clock signal.

Figure 18:
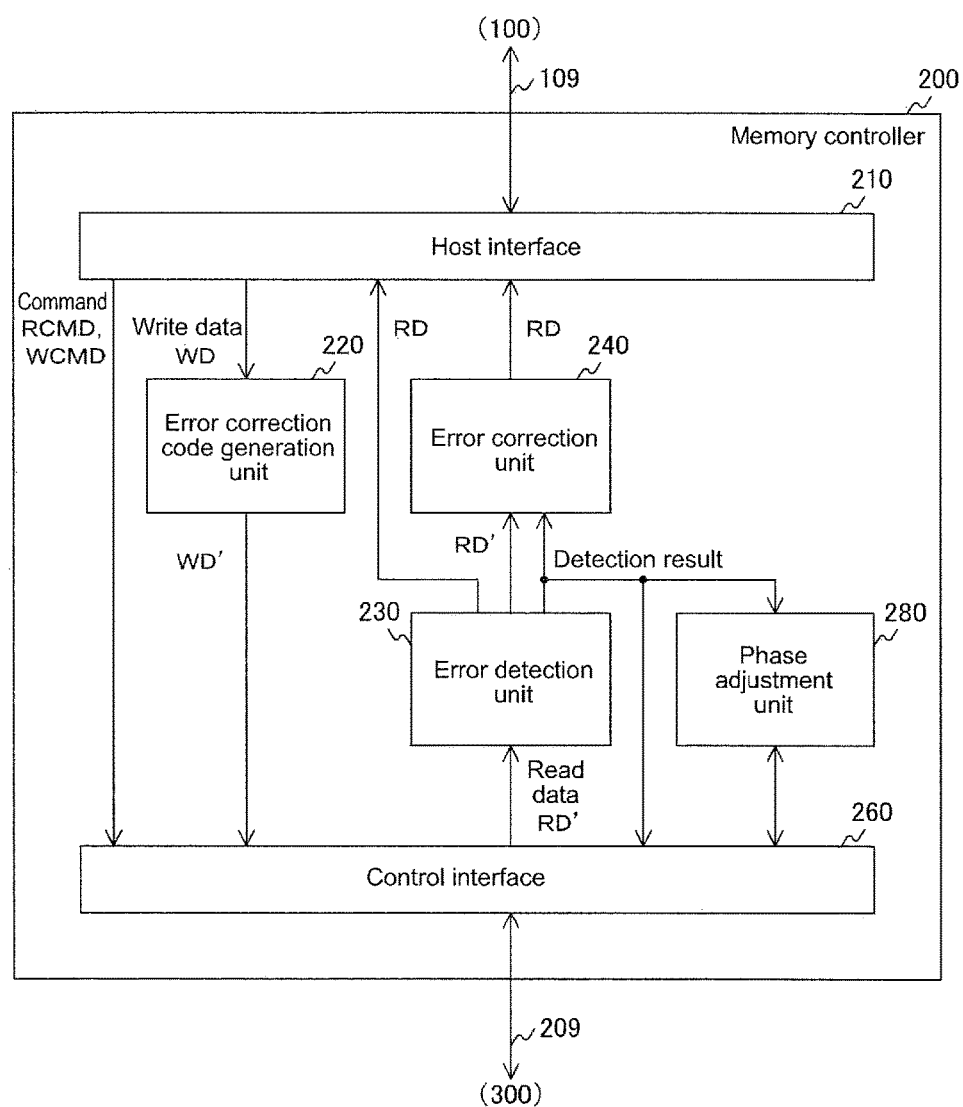
FIG. 18 is a block diagram showing a configuration example of a memory controller according to a second embodiment.

FIG. 18 is a block diagram showing a configuration example of the memory controller 200 according to the second embodiment. The memory controller 200 of the second embodiment is different from that of the first embodiment in that a phase adjustment unit 280 is provided instead of an impedance adjustment command issuance unit 250.

The phase adjustment unit 280 adjusts the phase of the transfer clock signal of a control interface 260. The transfer clock signal of the control interface 260 includes a transmission clock signal for transmitting write data and a reception clock signal for receiving read data. The phase adjustment unit 280 adjusts, for example, the phase of a reception clock signal among these signals.

The phase adjustment unit 280 receives an error detection result from an error detection unit 230. When an error is detected, the phase adjustment unit 280 adjusts the phase of a reception clock signal. Here, if there are a plurality of data lines, the phase adjustment unit 280 may adjust the phase of a reception clock signal for each of the data lines. In addition, if each of the data lines belongs to a plurality of groups, the phase adjustment unit 280 may adjust the phase of a reception clock signal for each of the groups. Read data synchronized with a transmission clock signal output from the non-volatile memory 300 is caused to have a transmission delay until the read data is received by the memory controller 200. Therefore, the reception clock signal of the memory controller 200 is desirably delayed by a transmission delay with respect to the transmission clock signal of the non-volatile memory 300. The phase adjustment unit 280 adjusts the phase of a reception clock signal based on a transmission delay.

Note that although the memory controller 200 adjusts the phase of a transfer clock signal, other configurations may be employed. Instead of the memory controller 200, the phase of a transfer clock signal may be adjusted by an interface on the side of the non-volatile memory 300.

(Configuration Example of Phase Adjustment Unit)

Figure 19:
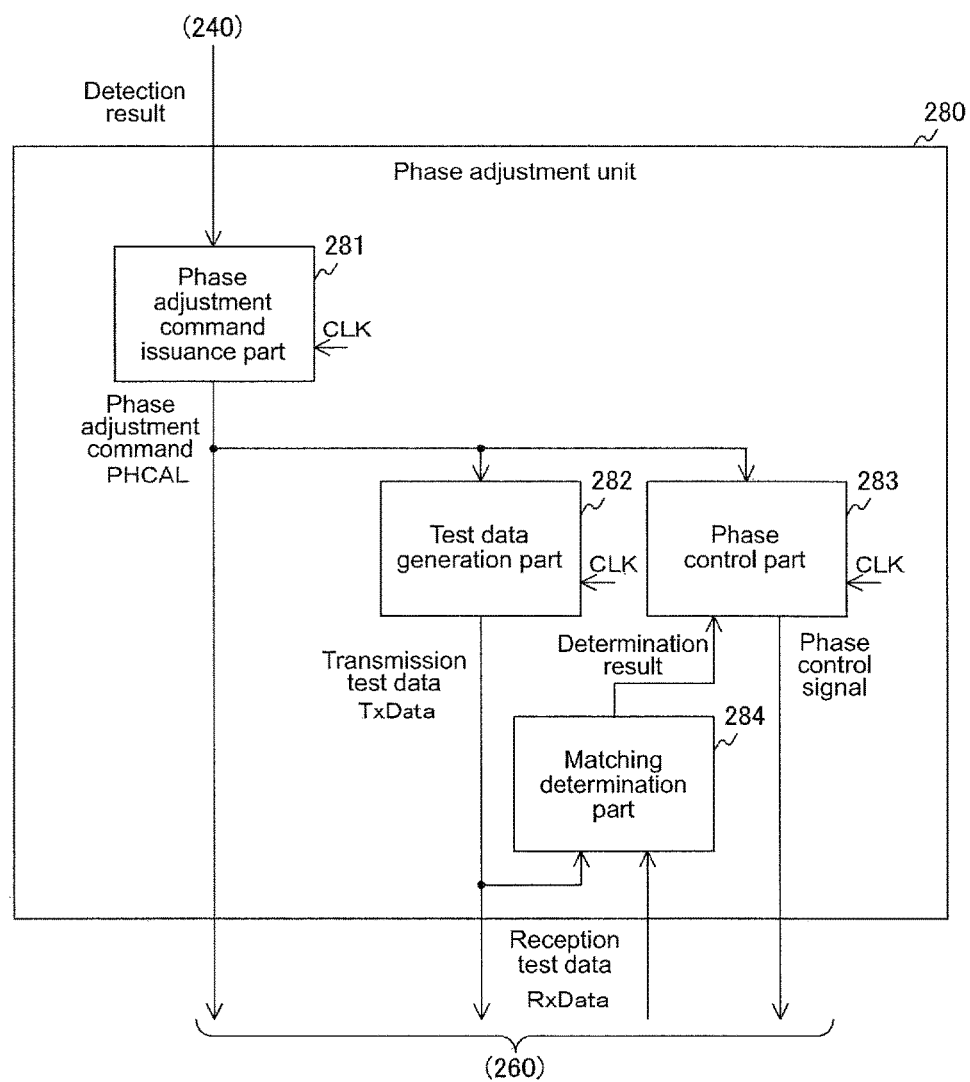
FIG. 19 is a block diagram showing a configuration example of a phase adjustment unit according to the second embodiment.

FIG. 19 is a block diagram showing a configuration example of the phase adjustment unit 280 according to the second embodiment. The phase adjustment unit 280 includes a phase adjustment command issuance part 281, a test data generation part 282, a phase control part 283, and a matching determination part 284.

The phase adjustment command issuance part 281 issues a phase adjustment command PHCAL. The phase adjustment command issuance part 281 issues a phase adjustment command PHCAL at the input of a power supply to the memory controller 200 or at error detection. The issuance timing of a phase adjustment command PHCAL at error detection is, for example, the same as the issuance timing of an impedance adjustment command of the first embodiment. The phase adjustment command issuance part 281 supplies an issued phase adjustment command PHCAL to the test data generation part 282, the phase control part 283, and the control interface 260.

The test data generation part 282 generates test data. The test data represents data for executing a loopback test, and a PRBS (Pseudo-Random it Sequence) is, for example, used as such. The loopback test represents a test in which known data is transmitted and returned to and from an interface (i.e., loopback) and the transmitted data and the returned data are compared with each other to confirm whether the interface normally operates.

When receiving a phase adjustment command PHCAL, the test data generation part 282 generates test data N times in synchronism with an internal clock signal CLK. N represents the number of times to execute the loopback test, and an integer of greater than or equal to two is, for example, set as such. Every generation of test data, the test data generation part 282 supplies the data to the control interface 260 and the matching determination part 284 as transmission test data TxData.

The matching determination part 284 determines whether transmitted test data and returned test data match each other. The matching determination part 284 receives a transmission test data TxData from the test data generation part 282 and reception test data RxData from the control interface 260. The reception test data RxData represents returned test data.

The matching determination part 284 compares transmission test data TxData and reception test data RxData with each other in units of bits and determines whether they match each other. The matching determination part 284 supplies the determination result to the phase control part 283. Since test data is generated N times, N determination results are generated.

The phase control part 283 controls the phase of a reception clock signal based on a determination result. When receiving a phase adjustment command PHCAL, the phase control part 283 starts the adjustment processing of a phase. In the adjustment processing of a phase, the phase control part 283 is caused, by a phase control signal for controlling the phase, to sequentially control the phase of a reception clock signal to N different phases in synchronism with an internal clock signal CLK. Then, the phase control part 283 refers to a determination result in each of the phases and selects any of the phases in which transmission test data TxData and reception test data RxData match each other. If there are a plurality of phases in which the transmission test data TxData and the reception test data RxData match each other, the phase control part 283 selects, for example, an intermediate phase from among the phases. The phase control part 283 fixes the phase of the reception clock signal to the selected phase and ends the adjustment processing of the phase.

(Configuration Example of Control Interface)

Figure 20:
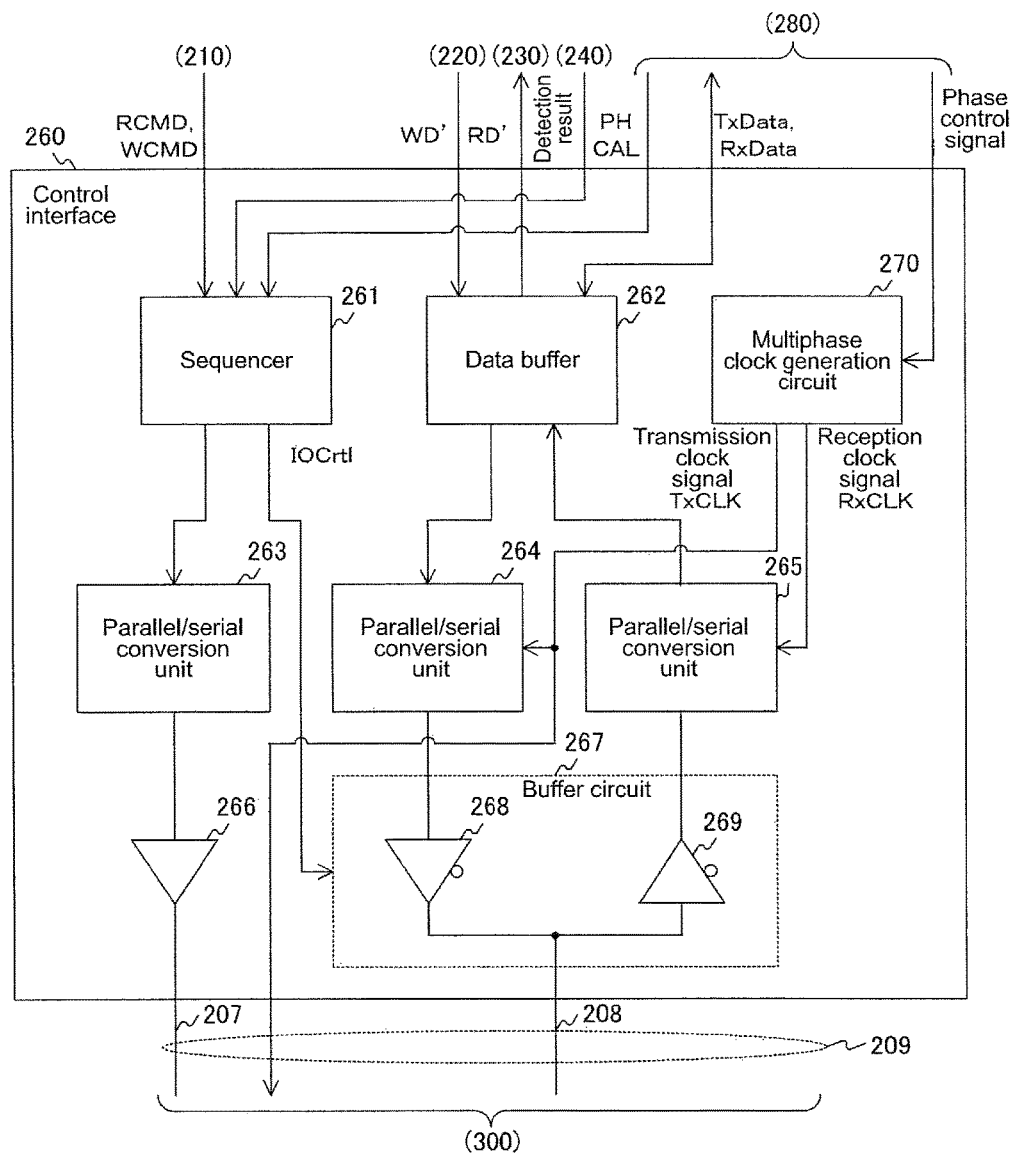
FIG. 20 is a block diagram showing a configuration example of a control interface according to the second embodiment.

FIG. 20 is a block diagram showing a configuration example of the control interface 260 according to the second embodiment. The control interface 260 of the second embodiment is different from that of the first embodiment in that a multiphase clock generation circuit 270 is further provided.

The multiphase clock generation circuit 270 generates a plurality of clock signals having different phases. The multiphase clock generation circuit 270 generates N clock signals having different phases by, for example, a PLL (Phase Locked Loop), a multiplexer, or the like. These clock signals represent signals having larger frequencies than that of an internal clock signal CLK and are generated by, for example, the multiplication of the internal clock signal CLK.

The multiphase clock generation circuit 270 selects any of the N clock signals as a reception clock signal RxCLK by a multiplexer or the like according to a phase control signal and then transmits the selected clock signal to a parallel/serial conversion unit 265. In addition, the multiphase clock generation circuit 270 generates a transmission clock signal TxCLK of a prescribed phase and then transmits the generated transmission clock signal to the non-volatile memory 300 as a reference clock signal to be referred while supplying the same to a parallel/serial conversion unit 264. The reference clock signal and write data are delayed by the same degree when being transmitted to the non-volatile memory 300. Since the non-volatile memory 300 transmits read data in synchronism with the delayed reference clock signal, the transmission delay of the read data is caused in the reception of the read data besides the transmission delay of the reference clock signal. The phase control part 283 adjusts such delays by controlling the phase of a reception clock signal RxCLK. Note that although a transmission clock signal is transmitted as a reference clock signal, a transmission clock and a reference clock may separately be supplied from the multiphase clock generation circuit 270. In addition, the phases of a transmission clock signal and a reference clock signal may separately be adjusted.

Note that the multiphase clock generation circuit 270 may be implemented by configurations other than a PLL and a multiplexer. For example, the multiphase clock generation circuit 270 may be implemented by a phase mixer that mixes together input clock signals having a plurality of different phases to generate an output clock signal having a phase different from the plurality of phases.

(Configuration Example of Non-Volatile Memory)

Figure 21:
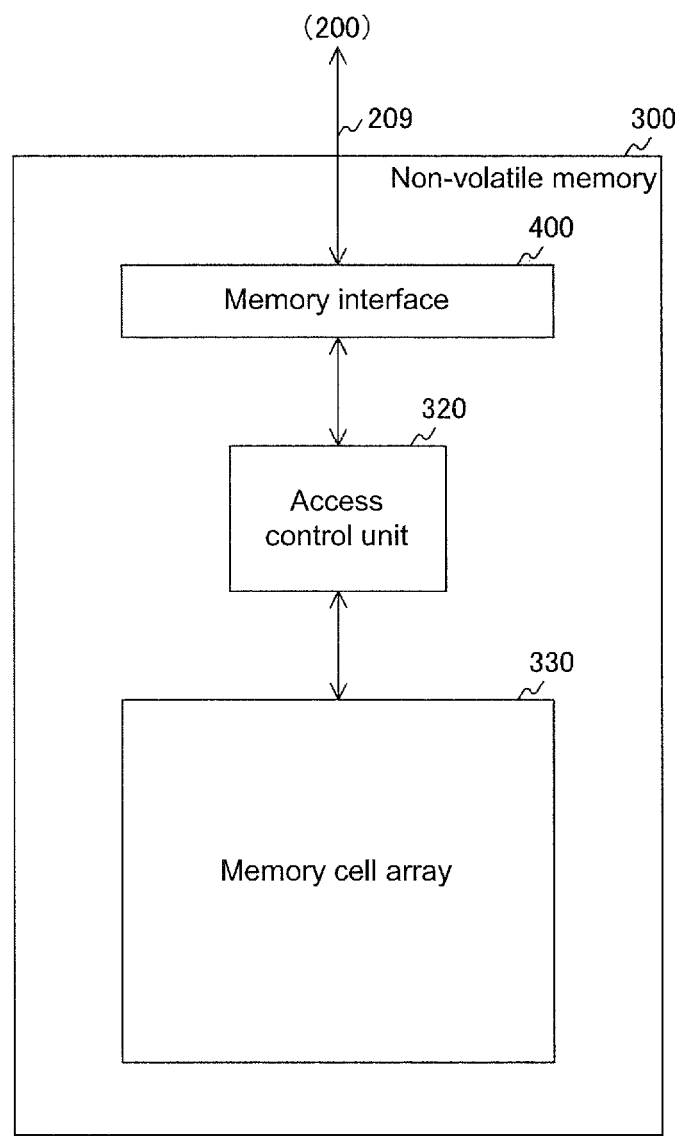
FIG. 21 is a block diagram showing a configuration example of a non-volatile memory according to the second embodiment.

FIG. 21 is a block diagram showing a configuration example of the non-volatile memory 300 according to the second embodiment. The configuration of the non-volatile memory 300 of the second embodiment is the same as that of the non-volatile memory 300 of the first embodiment except that an impedance adjustment unit 310 is not provided.

Figure 22:
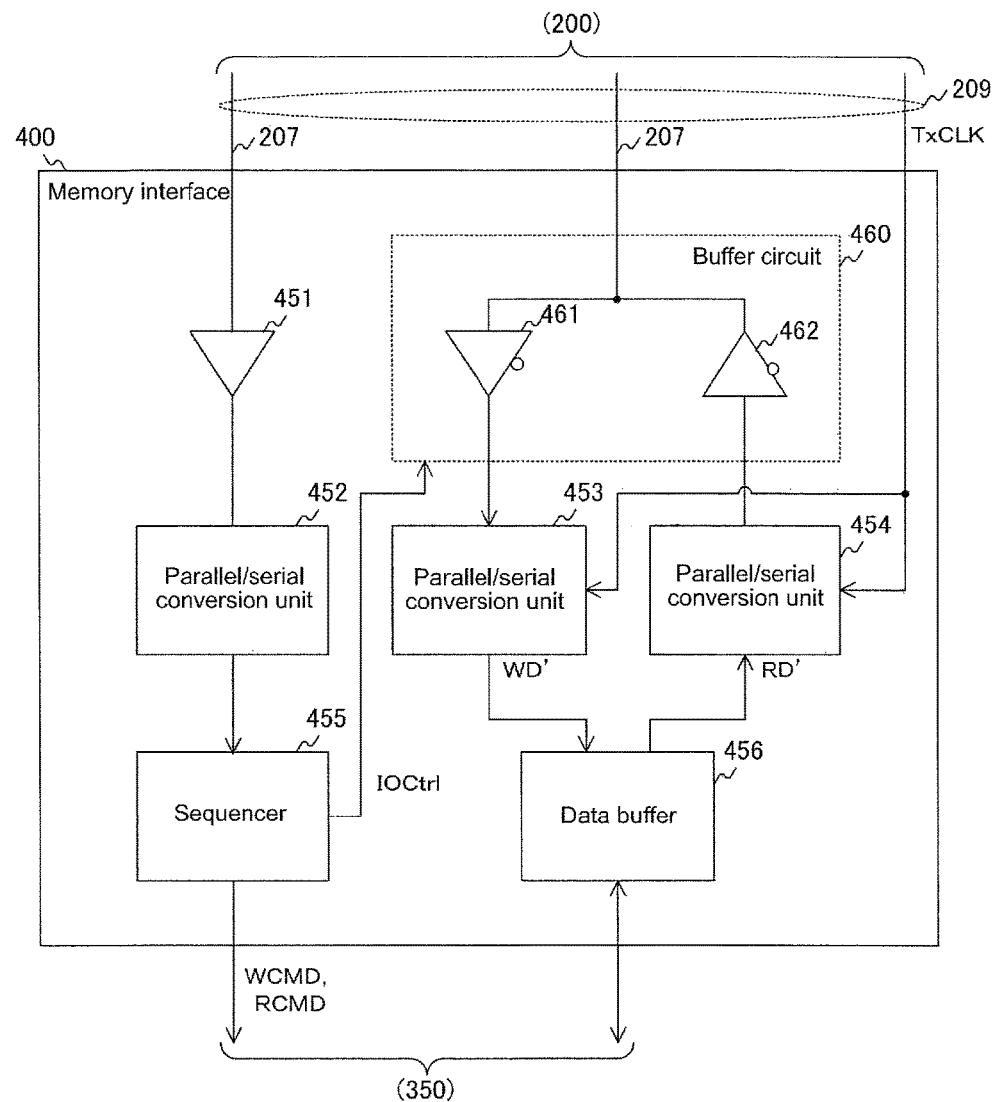
FIG. 22 is a block diagram showing a configuration example of a memory interface according to the second embodiment.

FIG. 22 is a block diagram showing a configuration example of a memory interface 400 according to the second embodiment. The memory interface 400 of the second embodiment is different from that of the first embodiment in that a buffer circuit 460 is provided instead of an original buffer circuit 410 and a replica buffer circuit 432.

The buffer circuit 460 includes a receiver 461 and a driver 462. The configurations of the receiver 461 and the driver 462 are the same as those of the driver 268 and the receiver 269 on the side of the memory controller 200 of the first embodiment.

A parallel/serial conversion unit 453 converts serial data into write data WD' in synchronism with a reference clock signal (transmission clock signal TxCLK). A parallel/serial conversion unit 454 sequentially transmits serial data converted from read data RD' in synchronism with a reference clock signal (transmission clock signal TxCLK).

A sequencer 455 controls the buffer circuit 460 with an input/output control signal IOCtrl to cause transmitted test data to be directly returned without being written when a command represents a phase adjustment command PHCAL.

Note that although the non-volatile memory 300 executes a loopback according to a phase adjustment command PHCAL, other configurations may be employed. For example, there may be employed a configuration in which the memory controller 200 issues a loopback command with a phase adjustment command and the non-volatile memory 300 executes a loopback according to the loopback command.

(Operation Example of Memory Controller)

Figure 23:
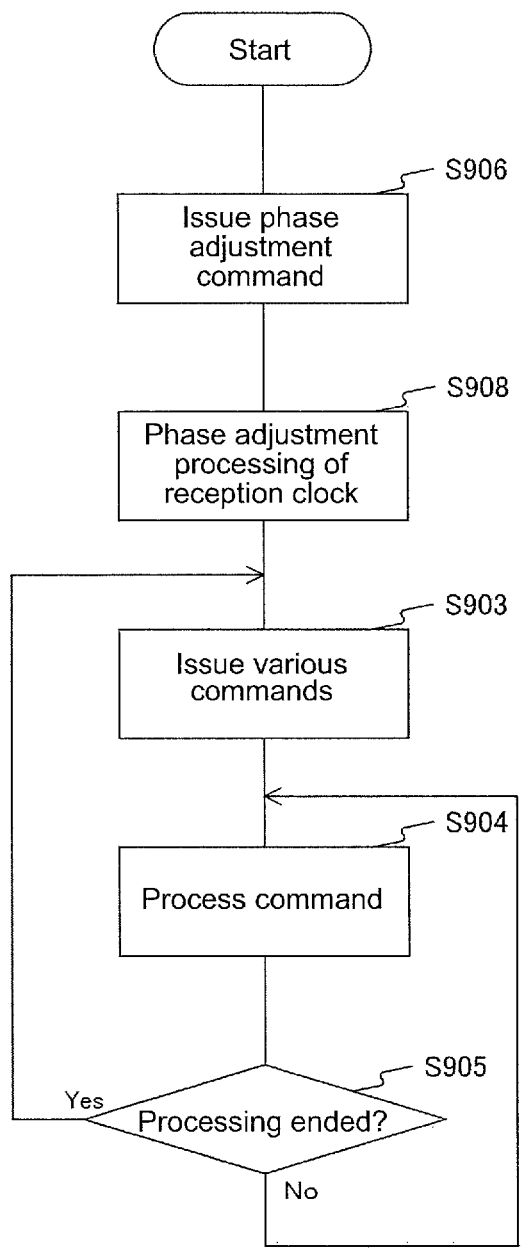
FIG. 23 is a flowchart showing an operation example of a memory controller according to the second embodiment.

FIG. 23 is a flowchart showing an operation example of the memory controller 200 according to the second embodiment. The operation of the memory controller 200 of the second embodiment is different from that of the memory controller 200 of the first embodiment in that the processing of steps S906 and S908 is executed instead of the processing of steps S901 and S902.

When a power supply is input, the memory controller 200 issues a phase adjustment command PHCAL (step S906). Then, the memory controller 200 adjusts the phase of a reception clock signal (step S908). After the processing of step S908, the memory controller 200 executes the processing of steps S903 to S905.

Figure 24:
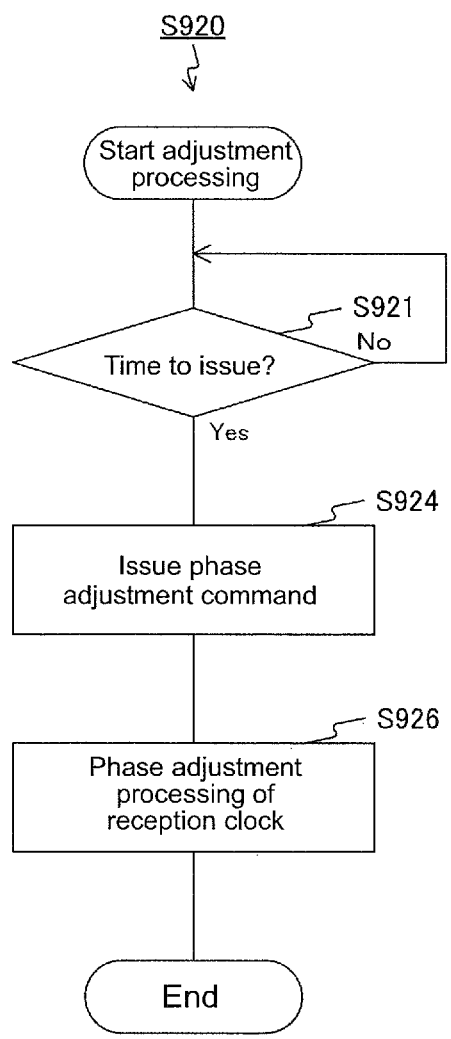
FIG. 24 is a flowchart showing an example of adjustment processing according to the second embodiment.

FIG. 24 is a flowchart showing an example of adjustment processing according to the second embodiment. The memory controller 200 determines whether now is the time to issue a phase adjustment command (step S921). For example, the time is such that the adjustment of a phase is started when the transmission of all read data is ended. When the time has not elapsed (No in step S921), the memory controller 200 returns to step S921.

On the other hand, when now is the time to issue a phase adjustment command (Yes in step S921), the memory controller 200 issues the phase adjustment command (step S924). Then, the memory controller 200 executes the adjustment processing of the phase of a reception clock (step S926). After the processing of step S926, the memory controller 200 ends the adjustment processing.

(Operation Example of Non-Volatile Memory)

Figure 25:
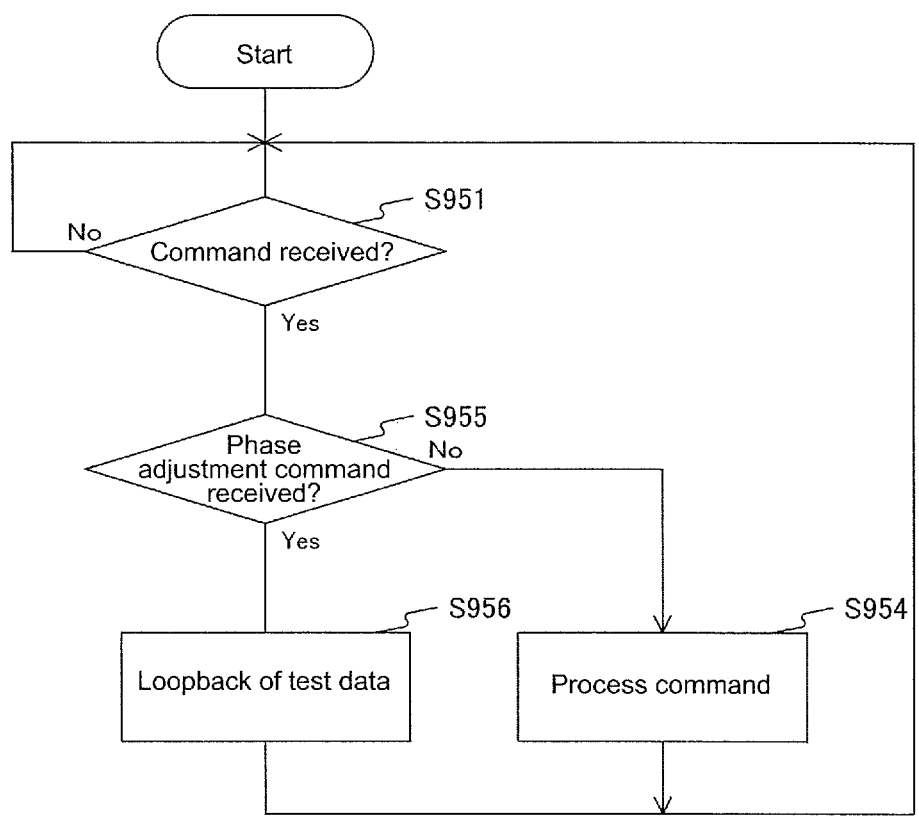
FIG. 25 is a flowchart showing an operation example of a non-volatile memory according to the second embodiment.

FIG. 25 is a flowchart showing an operation example of the non-volatile memory 300 according to the second embodiment. The operation of the non-volatile memory 300 of the second embodiment is different from that of the non-volatile memory 300 of the first embodiment in that the processing of steps S955 and S956 is executed instead of the processing of steps S952 and S953.

When a command has been received (Yes in step S951), the non-volatile memory 300 determines whether the command represents a phase adjustment command (step S955). When the command represents a phase adjustment command (Yes in step S955), the non-volatile memory 300 executes the loopback of test data (step S956).

When the command does not represent a phase adjustment command (No in step S955), the non-volatile memory executes the processing of step S954. After the processing of step S954 or step S956, the non-volatile memory 300 returns to step S951.

Figure 26:
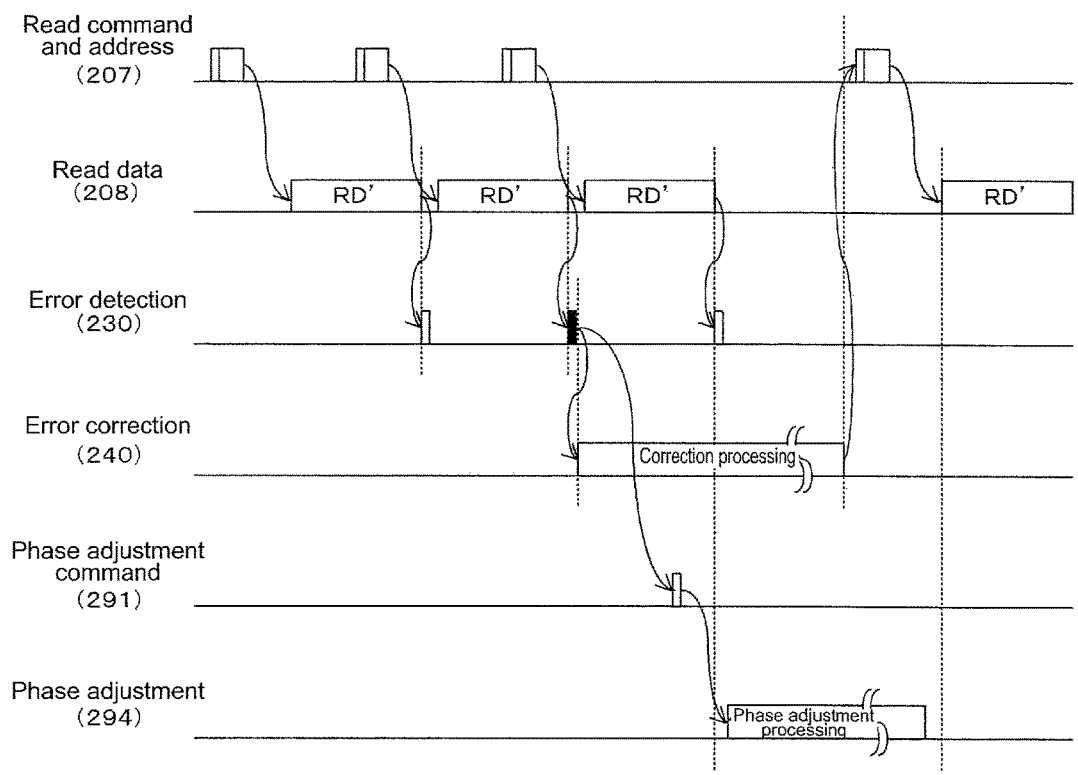
FIG. 26 is a timing chart showing an operation example of a memory system according to the second embodiment.

FIG. 26 is a timing chart showing an operation example of the memory system according to the second embodiment.

The phase adjustment command issuance unit 281 of the memory controller 200 issues a phase adjustment start command such that the adjustment processing of a phase is started after the transfer of the third read data RD' is ended.

The phase control unit 283 of the memory controller 200 starts the adjustment processing of the phase of a reception clock signal according to the phase adjustment command.

Since the memory controller 200 executes the correction processing when an error occurs and starts the adjustment processing of a phase according to the second embodiment as described above, at least part of the time of the adjustment processing may be overlapped with the time of the correction processing. This configuration reduces adjustment time at which the transmission and reception of data is not allowed and increases the communication speed between the memory controller 200 and the non-volatile memory 300.

First Modified Example

According to the second embodiment, the memory controller 200 adjusts only the phase of the reception clock of read data. However, the memory controller 200 may further adjust the phase of the transmission clock signal of write data. The memory controller 200 of a first modified example of the second embodiment is different from that of the second embodiment in that the phase of the transmission clock signal of write data is further adjusted.

The phase control unit 283 of the first modified example controls the phase of a transmission clock signal with a phase control signal and then controls the phase of a reception clock signal with a phase control signal. Note that although the phase control unit 283 controls the phase of a reception clock signal after the phase of a transmission clock signal, it may control the phase of a transmission clock signal after the phase of a reception clock signal. Moreover, if there are a plurality of data lines, the phase control unit 283 may separately phase-control the transmission clock of each of the data lines. For example, the transmission timing of a plurality of data may be adjusted so as to synchronize with a timing at which a reference clock reaches the memory interface 400.

The multiphase clock generation circuit of the first modified example is different from that of the second embodiment in that a transmission clock signal TxCLK is further generated according to a phase control signal while a reception clock signal RxCLK is generated according to a phase control signal.

(Operation Example of Memory Controller)

Figure 27:
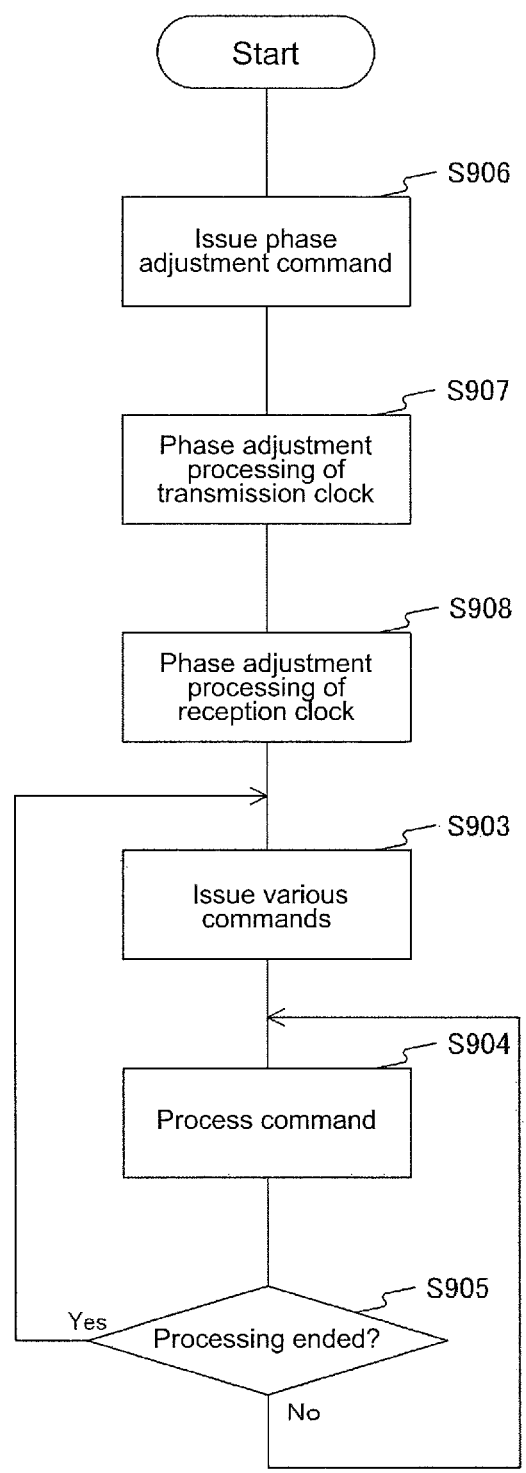
FIG. 27 is a flowchart showing an operation example of the memory controller according to a first modified example of the second embodiment.

FIG. 27 is a flowchart showing an operation example of the memory controller 200 according to the first modified example of the second embodiment. The operation of the memory controller 200 of the first modified example is different from that of the memory controller 200 of the first embodiment in that the processing of step S907 is further executed.

After issuing a phase adjustment command (step S906), the memory controller 200 adjusts the phase of a transmission clock signal (step S907). Then, the memory controller 200 adjusts the phase of a reception clock signal (step S908).

After the processing of step S908, the memory controller 200 executes the processing of steps S903 to S905.

Figure 28:
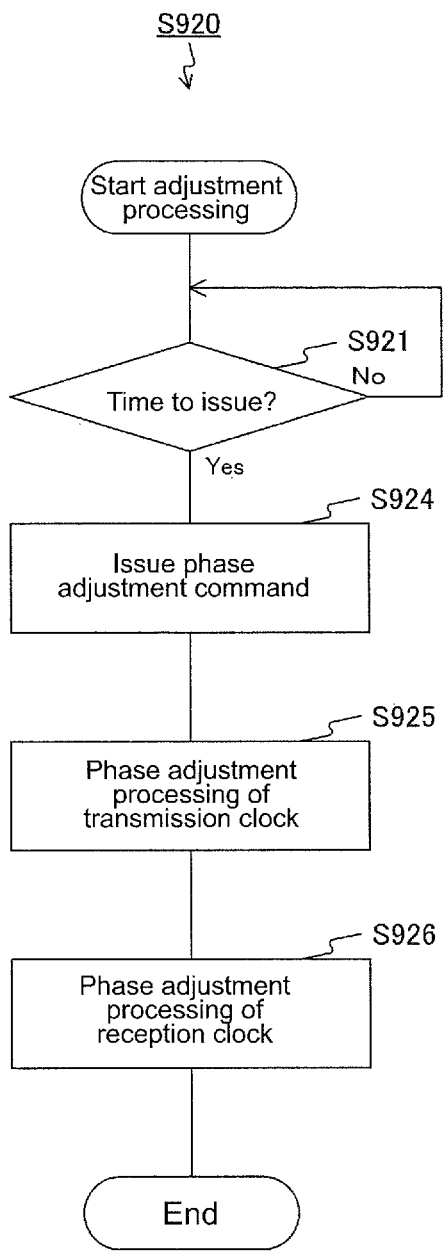
FIG. 28 is a flowchart showing an example of adjustment processing according to the first modified example of the second embodiment.

FIG. 28 is a flowchart showing an example of the adjustment processing according to the first modified example of the second embodiment. The adjustment processing of the first modified example is different from that of the second embodiment in that the processing of step S925 is further executed.

After issuing a phase adjustment command (step S924), the memory controller 200 executes the adjustment processing of the phase of a transmission clock (step S925). Then, the memory controller 200 executes the adjustment processing of the phase of a reception clock (step S926). After the processing of step S926, the memory controller 200 ends the adjustment processing.

Since the memory controller 200 adjusts not only the phase of a reception clock signal but the phase of a transmission clock signal according to the first modified example as described above, the adjustment processing may be executed more flexibly compared with the case of the processing in which only the phase of a reception clock signal is adjusted.

Second Modified Example

According to the second embodiment, only the memory controller 200 executes the adjustment processing of a phase. However, the non-volatile memory 300 may also execute the adjustment processing a phase. The memory system of the second modified example is different from that of the second embodiment in that both the memory controller 200 and the non-volatile memory 300 execute the adjustment processing of a phase.

(Configuration Example of Non-Volatile Memory)

Figure 29:
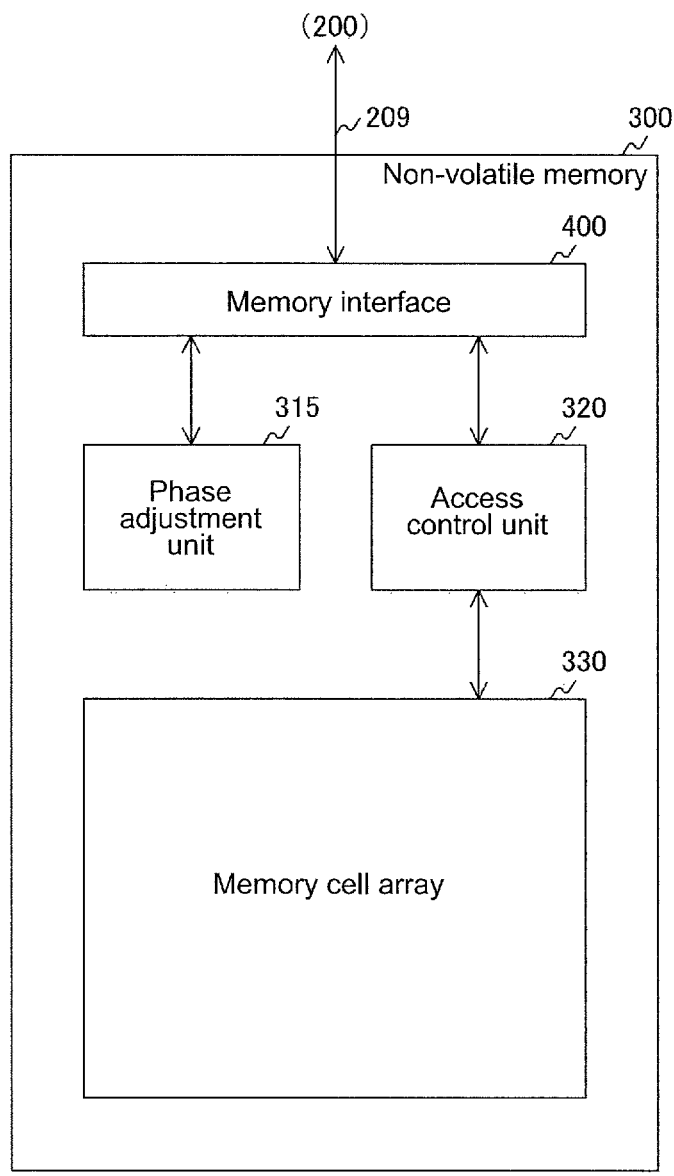
FIG. 29 is a block diagram showing a configuration example of the non-volatile memory according to a second modified example of the second embodiment.

FIG. 29 is a block diagram showing a configuration example of the non-volatile memory 300 according to the second modified example. The configuration of the non-volatile memory 300 of the second modified example is different from that of the non-volatile memory 300 of the first embodiment in that a phase adjustment unit 315 is provided instead of an impedance adjustment unit 310. The configuration of the phase adjustment unit 315 is the same as that of the phase adjustment unit 280 on the side of the memory controller 200. In addition, the memory interface 400 of the second modified example is different from that of the first embodiment in that the same circuit as the multiphase clock generation circuit 270 on the side of the memory controller 200 is further provided.

Here, although not shown in the figure, a clock and data recovery circuit may be further desirably provided on the side of the non-volatile memory 300 to separate and reproduce a clock and data overlapped with each other. The timing adjustment on the side of the non-volatile memory 300 is executed with respect to reproduced data or clock. As described above, a modification may be made without departing from the spirit of the present technology.

Since not only the memory controller 200 but the non-volatile memory 300 execute the adjustment processing of a phase according to the second modified example as described above, a transfer error may be reduced to a greater extent than a case in which only the memory controller 200 executes the adjustment processing of a phase.

Third Modified Example

According to the second embodiment, the memory system adjusts the phase of the transfer clock of data transmitted and received via a data line. However, the memory system may adjust the phases of other signals. For example, the memory system may adjust the phase of a control signal such as a strobe signal. Here, the strobe signal represents a signal for controlling a timing at which a receiver receives data. The memory system of a third modified example is different from that of the second embodiment in that the phase of a strobe signal is adjusted.

Figure 30:
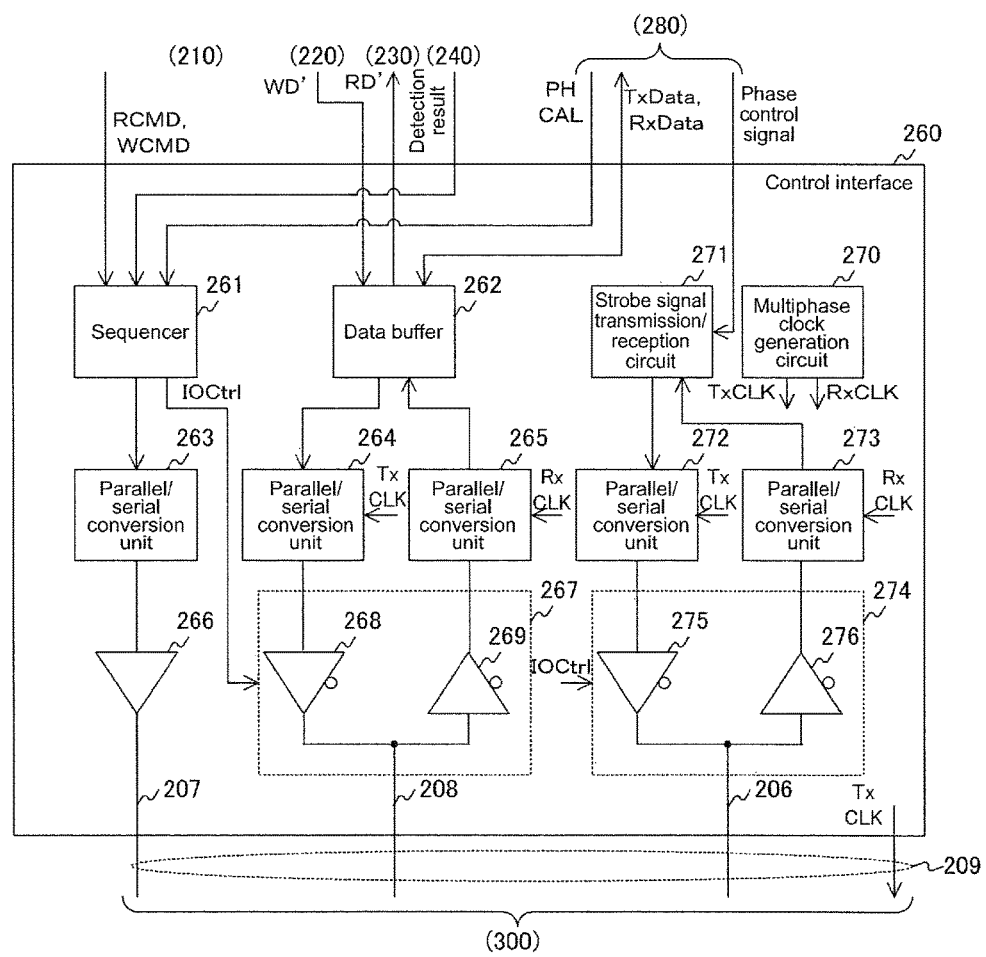
FIG. 30 is a block diagram showing a configuration example of the control interface according to a third modified example of the second embodiment.

FIG. 30 is a block diagram showing a configuration example of a control interface 260 according to the third modified example. The control interface 260 of the third modified example is different from that of the second embodiment in that a strobe signal transmission/reception circuit 271, parallel/serial conversion units 272 and 273, and a buffer circuit 274 are further provided.

The strobe signal transmission/reception circuit 271 transmits/receives a strobe signal. The strobe signal transmission/reception circuit 271 generates the strobe signal of a phase specified by a phase control signal. In addition, the strobe signal generation circuit 271 generates a strobe signal at the transmission of data to the non-volatile memory 300 and then transmits the generated strobe signal to the non-volatile memory 300 via the parallel/serial conversion unit 272 and the buffer circuit 274. On the other hand, the strobe signal generation circuit 271 receives a strobe signal from the non-volatile memory 300 via the parallel/serial conversion unit 273 and the buffer circuit 274 at the reception of data from the non-volatile memory 300. The transmission timing of data (such as read data) from the non-volatile memory 300 is controlled by a strobe signal.

The parallel/serial conversion unit 272 converts a strobe signal transmitted from the memory controller 200 into a serial signal in synchronism with a transmission clock signal TxCLK (reference clock signal) and then supplies the converted serial signal to the buffer circuit 274. The parallel/serial conversion unit 273 converts a serial signal from the non-volatile memory 300 into a strobe signal in synchronism with a reception clock signal RxCLK and then supplies the converted strobe signal to the strobe signal transmission/reception circuit 271. The buffer circuit 274 includes a driver 275 and a receiver 276. The configurations of the driver 275 and the receiver 276 are the same as those of the driver 268 and the receiver 269.

The provision of the strobe signal transmission/reception circuit 271 or the like eases a hard timing condition at reading time or the like and facilitates the design of a substrate or a LSI (Large Scale Integration) in the memory system. Note that not only the memory controller 200 but the non-volatile memory 300 may adjust the phase of a strobe signal. In addition, the strobe signal line 206 is further connected to a parallel/serial conversion unit and a buffer circuit. Moreover, the memory system may adjust the phase of a control signal other than a strobe signal.

In addition, although the memory system adjusts the phases of a transmission clock signal and a reception clock signal to adjust the transmission timing of data and the phase of a control signal, other configurations may be employed. For example, the memory system may include a delay circuit that has a buffer or the like inserted in a signal line to delay data and a control signal. In this case, the memory controller 200 or the non-volatile circuit 300 adjusts the transmission timing of data and the phase of a control signal with respect to a reference clock signal by controlling the delay circuit.

Since the memory controller 200 adjusts the phase of a strobe signal according to the third modified example as described above, a transfer error may be reduced in the memory system that controls the transmission and reception of data with the strobe signal.

3. Third Embodiment (Operation Example of Memory Controller)

According to the first embodiment, the memory system adjusts impedance at error detection. However, the memory system may adjust not only impedance but the phase of the transfer clock of an interface. The memory system of a third embodiment is different from that of the first embodiment in that both impedance and the phase of a transfer clock are adjusted at error detection.

A memory controller 200 of the third embodiment is different from that of the first embodiment in that the phase adjustment unit 280 of the second embodiment is further provided.

After issuing an impedance adjustment command, a phase adjustment unit 280 of the third embodiment issues a phase adjustment command such that the adjustment processing of a phase is started after the adjustment processing of impedance is ended. Specifically, the phase adjustment unit 280 issues a phase adjustment command when the time of $T_R - T_S + T_M + T_Z$ has elapsed since the issuance of the last read command.

In addition, the configuration of a control interface 260 of the third embodiment is the same as that of the control interface 260 of the second embodiment.

(Operation Example of Memory Controller)

Figure 31:
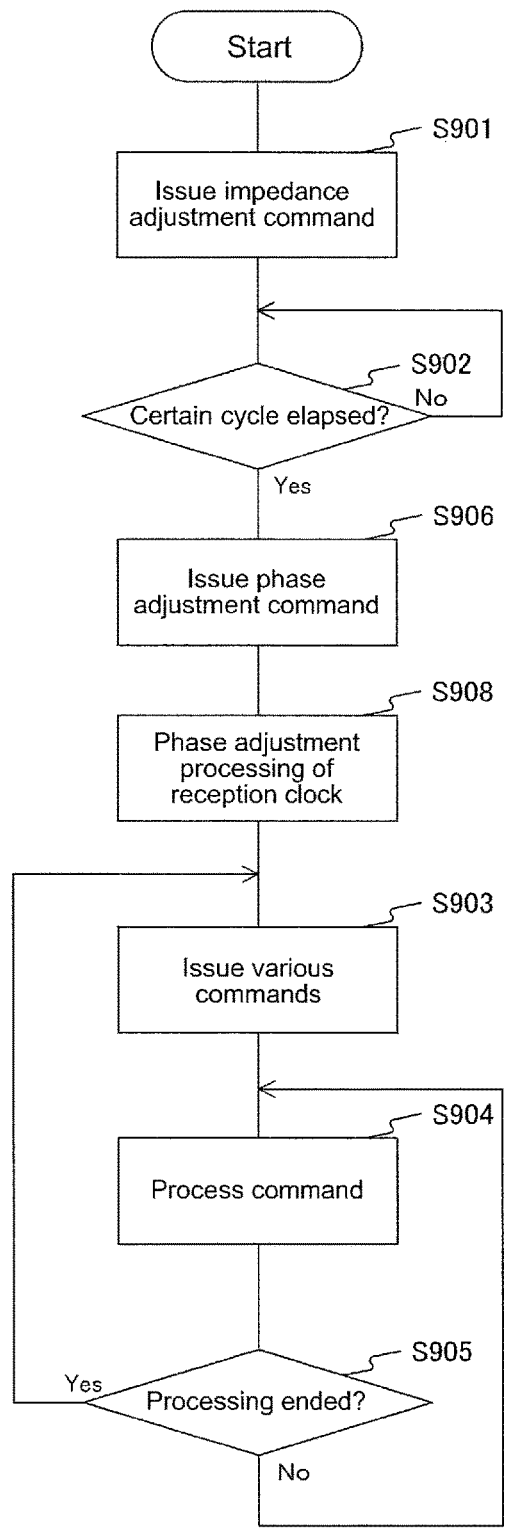
FIG. 31 is a flowchart showing an operation example of a memory controller according to the third embodiment.

FIG. 31 is a flowchart showing an operation example of the memory controller 200 according to the third embodiment. The operation of the memory controller 200 of the third embodiment is the same as that of the memory controller 200 of the first embodiment except that the processing of steps S906 and S908 of the second embodiment is further executed after the processing of step S902.

Figure 32:
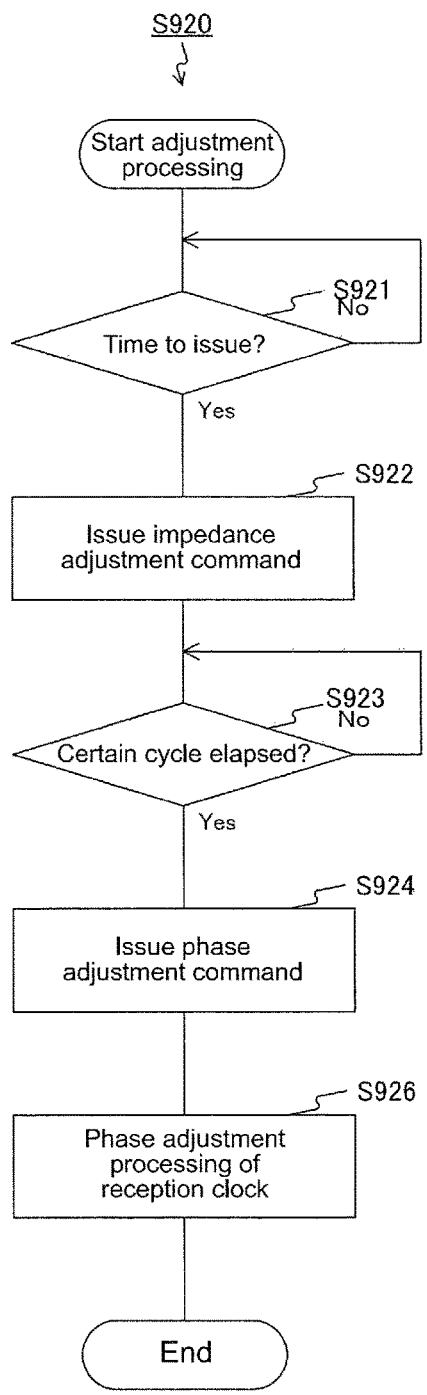
FIG. 32 is a flowchart showing an example of adjustment processing according to the third embodiment.

FIG. 32 is a flowchart showing an example of adjustment processing according to the third embodiment. The adjustment processing of the third embodiment is the same as that of the first embodiment except that the processing of steps S924 and S926 of the second embodiment is further executed after the processing of step S923.

(Operation Example of Non-Volatile Memory)

Figure 33:
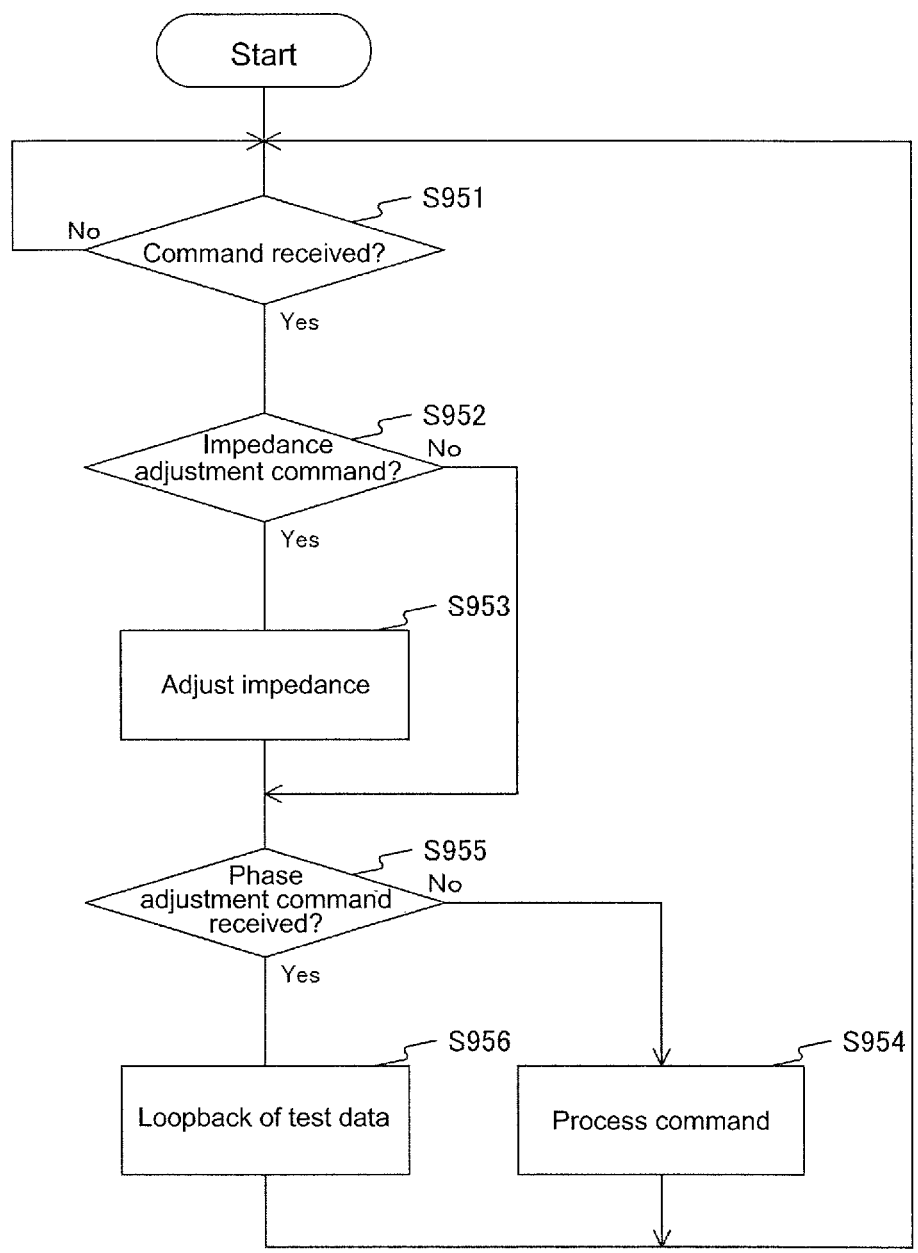
FIG. 33 is a flowchart showing an operation example of a non-volatile memory according to the third embodiment.

FIG. 33 is a flowchart showing an operation example of a non-volatile memory 300 according to the third embodiment. The non-volatile memory 300 of the third embodiment further executes the processing of steps S955, S956, and S954 when a command does not represent an impedance adjustment command (No in step S952) or after the processing of step S953.

Since the memory controller 200 executes correction processing when an error occurs and starts the adjustment processing of a phase and impedance according to the third embodiment of the present technology as described above, at least part of the time of the adjustment processing may be overlapped with the time of the correction processing. This configuration reduces adjustment time at which the transmission and reception of data is not allowed and increases the communication speed between the memory controller 200 and the non-volatile memory 300.

4. Fourth Embodiment

According to the first embodiment, the memory controller 200 transmits corrected read data to the host computer 100. However, with the execution of refresh processing in which corrected read data is rewritten into a read address at which the data has been read, the reliability of the rewritten data is improved. A memory controller 200 according to a fourth embodiment is different from that of the first embodiment in that the refresh processing is further executed.

(Configuration Example of Memory Controller)

Figure 34:
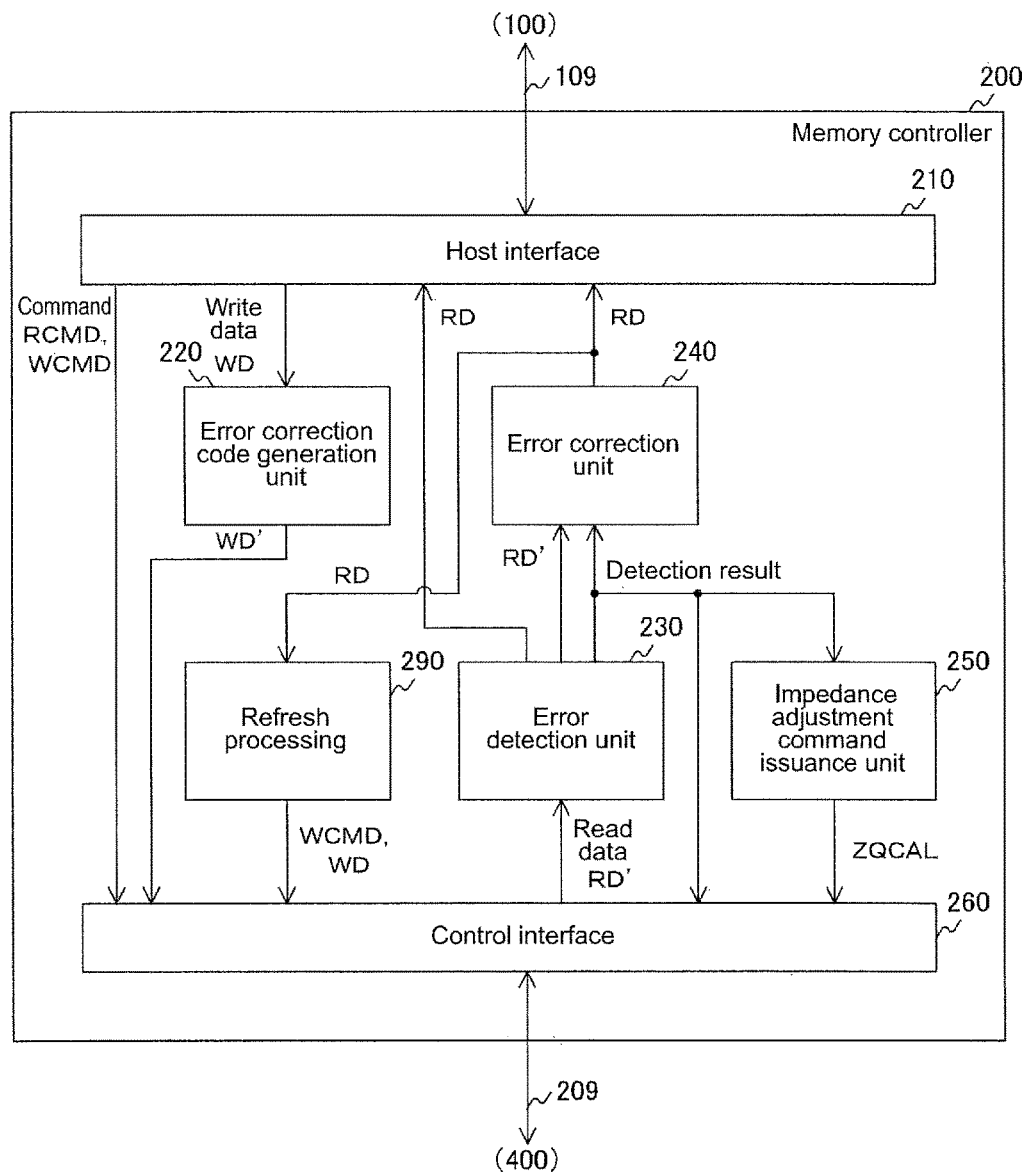
FIG. 34 is a block diagram showing a configuration example of a memory controller according to a fourth embodiment.

FIG. 34 is a block diagram showing a configuration example of the memory controller 200 according to the fourth embodiment. The configuration of the memory controller 200 of the fourth embodiment is different from that of the memory controller 200 of the first embodiment in that a refresh processing unit 290 is further provided.

The refresh processing unit 290 executes the refresh processing. The refresh processing unit 290 retains each of issued read commands RCMD. Then, the refresh processing unit 290 receives corrected read data RD from an error correction unit 240. The refresh processing unit 290 reissues, based on the retained read commands RCMD, a write command WCMD that specifies an address at which the read data RD has been read. Next, the refresh processing unit 290 supplies the corrected read data RD serving as write data WD to a control interface 260 together with the write command WCMD. The reissuance timing of the write command WCMD is calculated by formula 1 or the like. Thus, the corrected read data RD is rewritten into the address at which the data has been read.

(Operation Example of Memory Controller)

Figure 35:
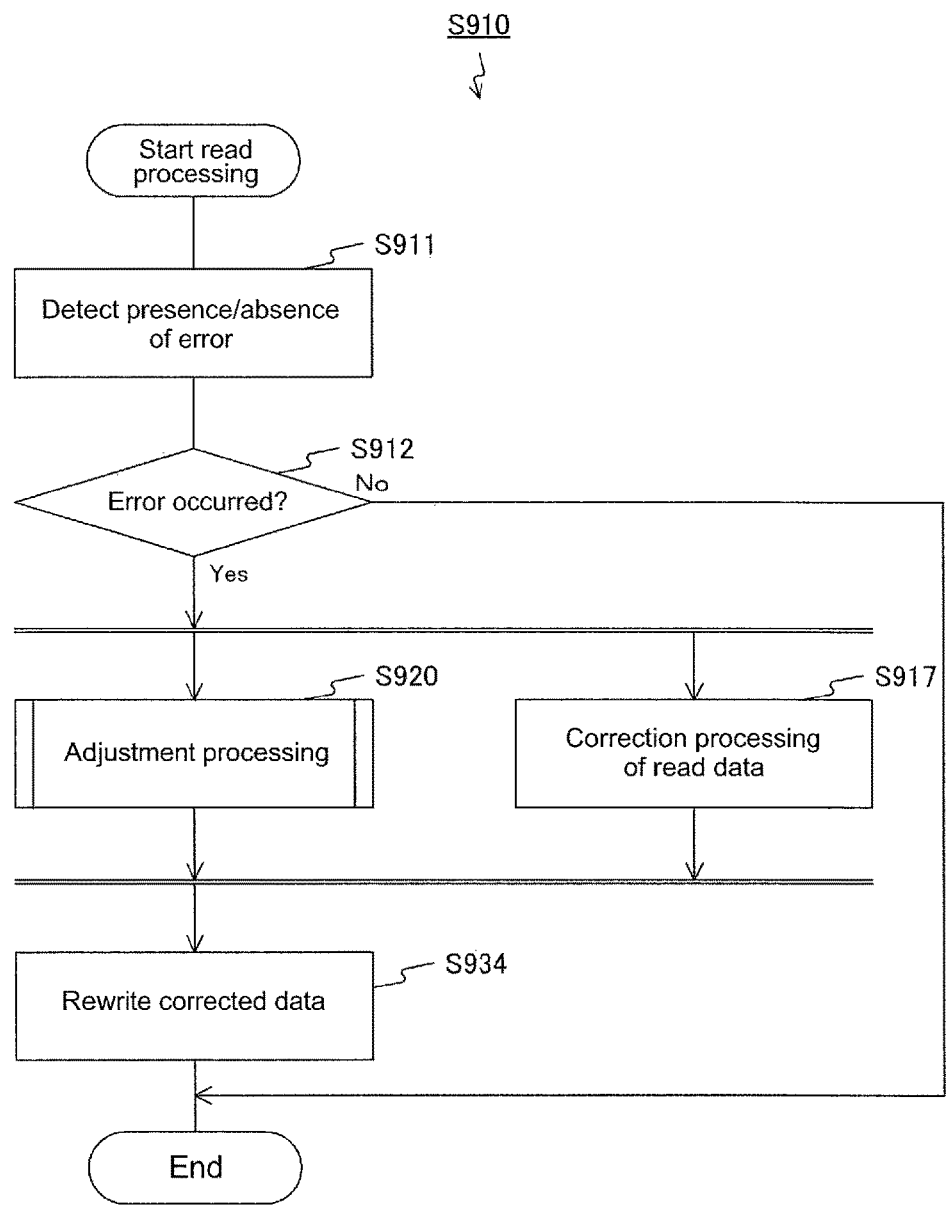
FIG. 35 is a flowchart showing an example of read processing according to the fourth embodiment.

FIG. 35 is a flowchart showing an example of read processing according to the fourth embodiment. The read processing of the fourth embodiment is different from that of the first embodiment in that the processing of step S934 is further executed. The memory controller 200 executes the rewrite processing of corrected data (step S934) when both adjustment processing (step S920) and correction processing (step S917) are ended. When no error has occurred (No in step S912) or after the processing of step S934, the memory controller 200 transmits read data to a host system to end the read processing.

Figure 36:
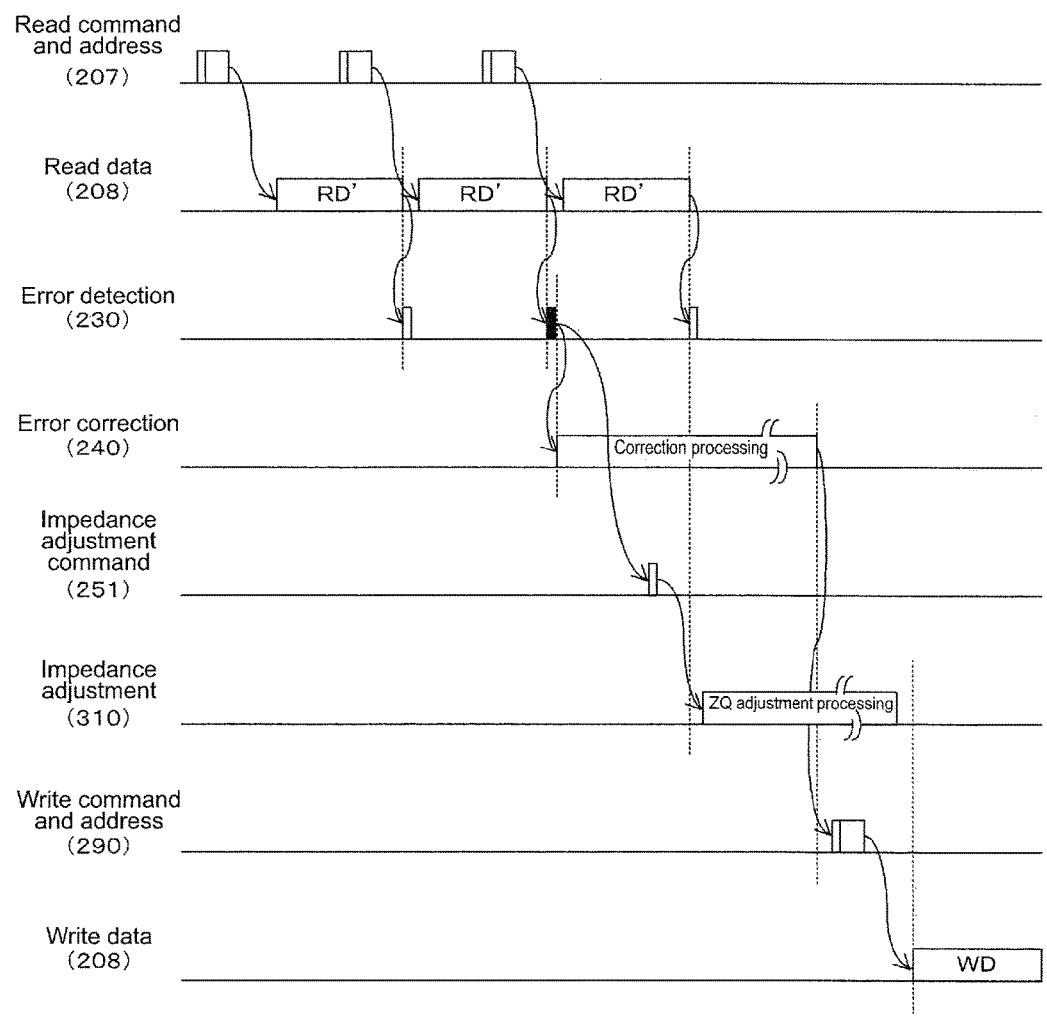
FIG. 36 is a timing chart showing an operation example of a memory system according to the fourth embodiment.

FIG. 36 is a timing chart showing an operation example of a memory system according to the fourth embodiment.

The refresh processing unit 290 of the memory controller 200 reissues a write command WCMD such that refresh processing is started after correction processing and adjustment processing are ended. Corrected read data RD is supplied as write data WD to the non-volatile memory 300 via a data line 208 and rewritten into an address at which the data has been read.

Since the memory controller 200 rewrites corrected read data into an address at which the data has been read according to the fourth embodiment as described above, the reliability of the data may be improved.

5. Fifth Embodiment

According to the fourth embodiment, it is assumed that errors do not occur to such an extent that they may not be corrected by parity. However, there is a likelihood of such a number of errors occurring. In this case, with the execution of retry processing in which uncorrectable read data is read again, the number of errors may be reduced. A memory controller 200 of a fifth embodiment is different from that of the fourth embodiment in that the retry processing is further executed.

(Configuration Example of Memory Controller)

Figure 37:
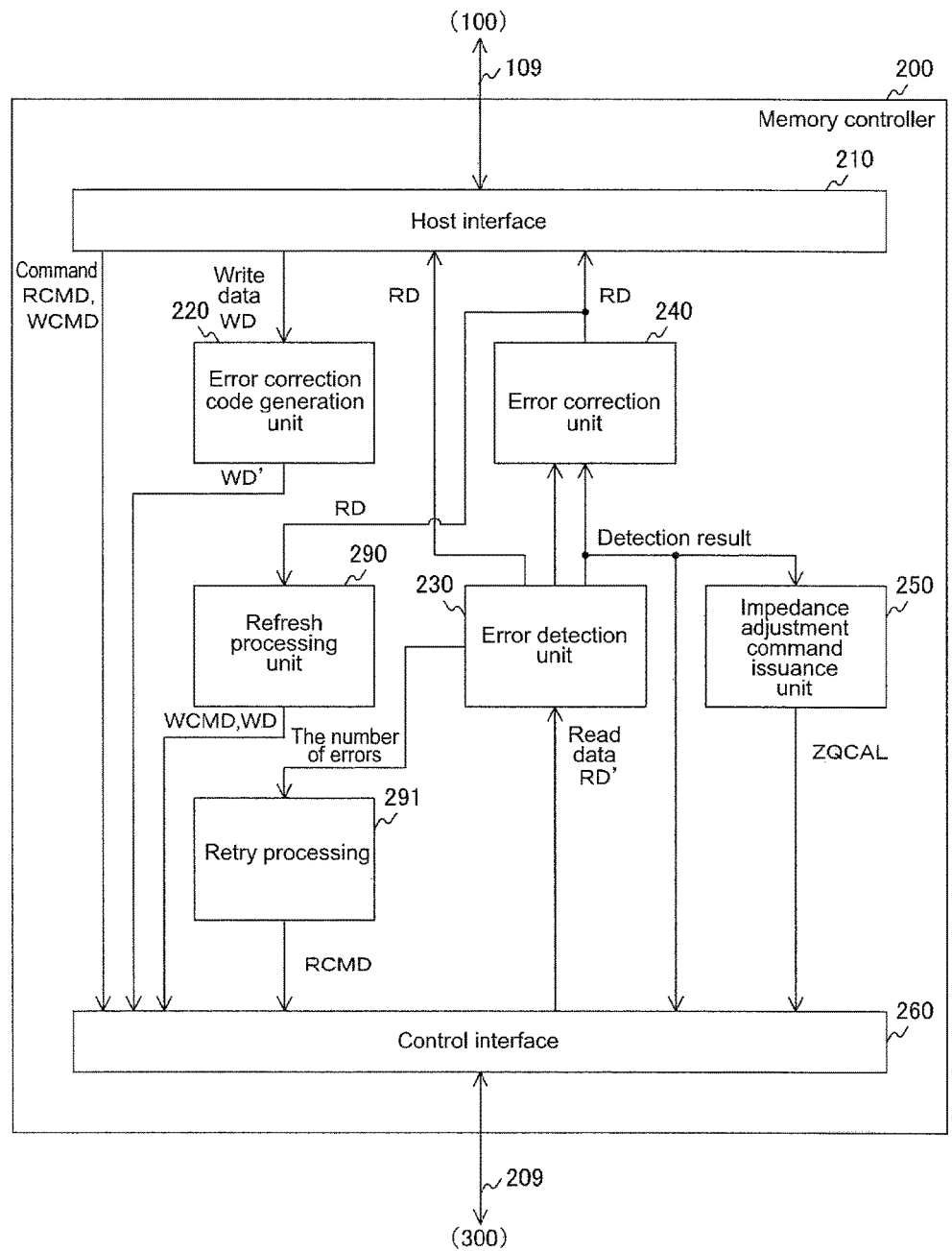
FIG. 37 is a block diagram showing a configuration example of a memory controller according to a fifth embodiment.

FIG. 37 is a block diagram showing a configuration example of a memory controller 200 according to the fifth embodiment. The memory controller 200 of the fifth embodiment is different from that of the fourth embodiment in that a retry processing unit 291 is further provided.

The retry processing unit 291 executes the retry processing. The retry processing unit 291 retains each of issued read commands RCMD. The retry processing unit 291 receives the number of errors detected in read data from an error detection unit 230. The retry processing unit 291 determines whether the number of the errors falls within ECC error correction capability.

Here, the error correction capability is determined by a minimum Hamming distance dmin of the code of an ECC. The minimum Hamming distance dmin of the code represents the minimum value of the Hamming distance between optional different codes relating to the code. When the maximum value of t (where t is an integer) satisfying $2t+1 \leq dmin$ is tmax, tmax code elements may be corrected by parity at a maximum. The rule is called a bounded distance decoding rule.

When the number of the errors exceeds the error correction capability tmax, the retry processing unit 291 supplies a command corresponding to read data RD from which an error has been detected among the retained read commands RCMD to a control interface 260. The retry processing is repeatedly executed every time uncorrectable number of errors occur until the number of the retry times reaches a prescribed number of times.

Note that the retry processing unit 291 may inform a host computer 100 of a command executed in the retry processing. The host computer 100 handles the informed command as a command that may cause a problem and executes prescribed processing such as the suspension of running processing.

In addition, an error correction unit 240 of the fifth embodiment does not execute error correction processing when the number of errors goes beyond the error correction capability tmax. On the other hand, an impedance adjustment command issuance unit 250 issues an impedance adjustment command at error detection regardless of the number of errors.

In addition, the refresh processing unit 290 of the fifth embodiment further receives the number of corrections as the number of corrected errors from the error correction unit 240. The refresh processing unit 290 executes the refresh processing when the number of corrections exceeds a threshold Th2. Here, a value within the error correction capability of the ECC is set as the threshold Th2.

(Operation Example of Memory Controller)

Figure 38:
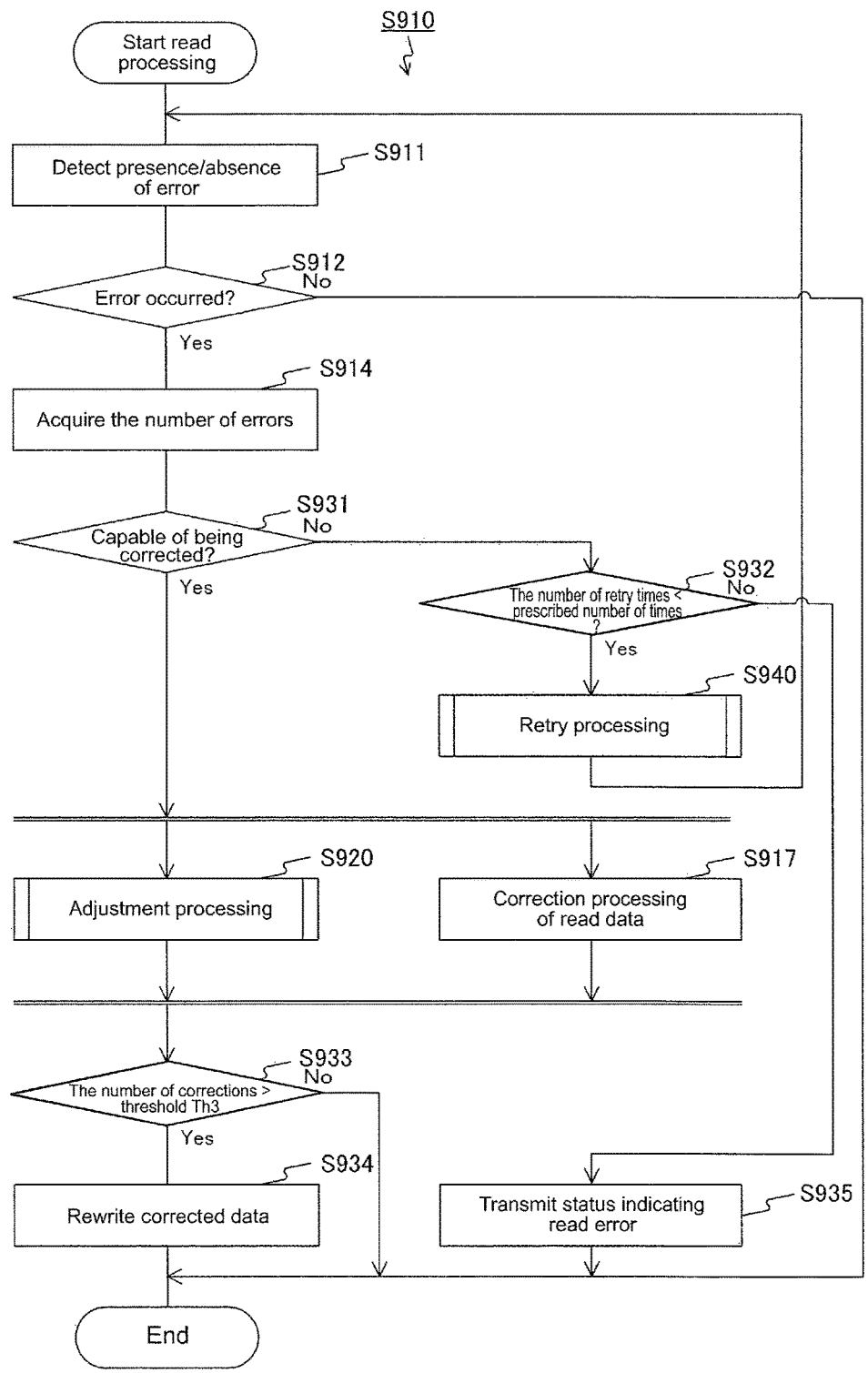
FIG. 38 is a flowchart showing an example of read processing according to the fifth embodiment.

FIG. 38 is a flowchart showing an example of read processing according to the fifth embodiment. The read processing of the fifth embodiment is different from that of the fourth embodiment in that the processing of steps S914, S931, S932, S933, S934, S935, and S940 is further executed.

When errors have occurred (Yes in step S912), the memory controller 200 acquires the number of the errors (step S914) and then determines whether the errors are capable of being corrected (step S931).

When the errors are capable of being corrected (Yes in step S931), the memory controller 200 executes adjustment processing (step S920) and correction processing (step S917) in parallel.

On the other hand, when the errors are not capable of being corrected (No in step S931), the memory controller 200 determines whether the number of retry times is less than a certain number of times (step S932). When the number of the retry times is less than the certain number of times, the memory controller 200 executes the retry processing (step S940). When the number of the retry times is greater than or equal to the certain number of times (No in step S932), the memory controller 200 generates a status indicating a read error and transmits the generated status to the host computer 100. The status includes information indicating that the read error is not capable of being corrected by an ECC, the type of a command in which the error has occurred, an address relating to the command, or the like. The address represents a logical address when the memory controller 200 executes the conversion between the logical address and a physical address. Otherwise, the address represents the physical address. After the processing of step S935, the memory controller 200 ends the read processing.

In addition, after both the adjustment processing (step S920) and the correction processing (step S917) are executed, the memory controller 200 determines whether the number of corrections exceeds a threshold Th2 (step S933). When the number of the corrections exceeds the threshold Th2 (Yes in step S933), the memory controller 200 rewrites corrected data (step S934).

When no error has occurred (No in step S912), when the number of the corrections is less than or equal to the threshold Th2 (No in step S933), or after the processing of step S934, the memory controller 200 transmits read data to the host computer 100 to end the read processing.

Figure 39:
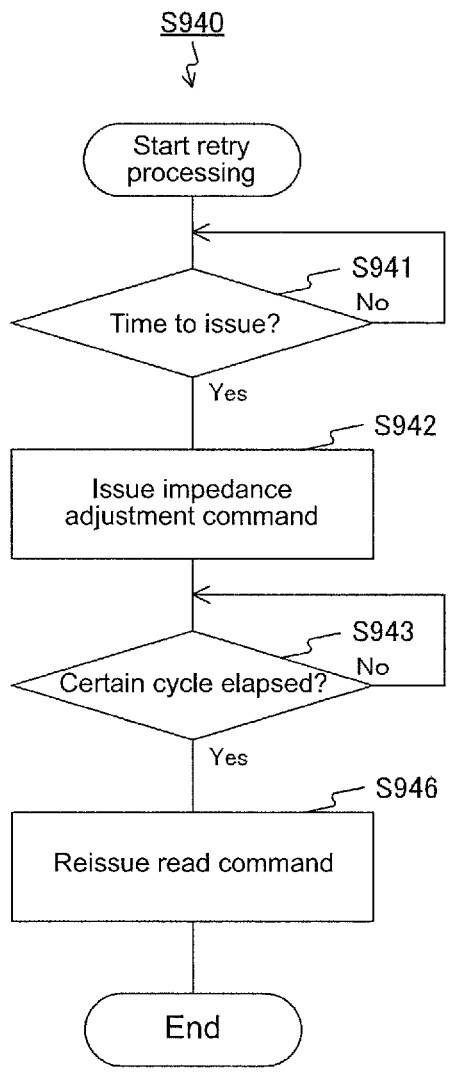
FIG. 39 is a flowchart showing an example of retry processing according to the fifth embodiment.

FIG. 39 is a flowchart showing an example of the retry processing according to the fifth embodiment. The memory controller 200 determines whether now is the time to issue an impedance adjustment command (step S941). When the time has not elapsed (No in step S941), the memory controller 200 returns to step S941.

On the other hand, when now is the time to issue an impedance adjustment command (Yes in step S941), the memory controller 200 issues the impedance adjustment command (step S942). Then, the memory controller 200 determines whether a certain cycle has elapsed (step S943). When the certain cycle has not elapsed (No in step S943), the memory controller 200 returns to step S943 (No in step S943). When the certain cycle has elapsed (Yes in step S943), the memory controller 200 reissues a read command (step S946). After the processing of step S946, the memory controller 200 ends the retry processing.

Since the memory controller 200 adjusts impedance and reads read data again when errors are not capable of being corrected according to the fifth embodiment of the present technology as described above, the likelihood of reading normal read data may be increased.

First Modified Example

According to the fifth embodiment, the memory system adjusts impedance at error detection. However, the memory system may adjust the phase of the transfer clock of an interface. The memory system of a first modified example is different from that of the fifth embodiment in that the phase of a transfer clock is adjusted at error detection.

The operation of the memory controller 200 of the first modified example is the same as that of the memory controller 200 of the fifth embodiment exemplified in FIG. 38. In addition, the adjustment processing of the first modified example is the same as that of the second embodiment.

(Operation Example of Memory Controller)

Figure 40:
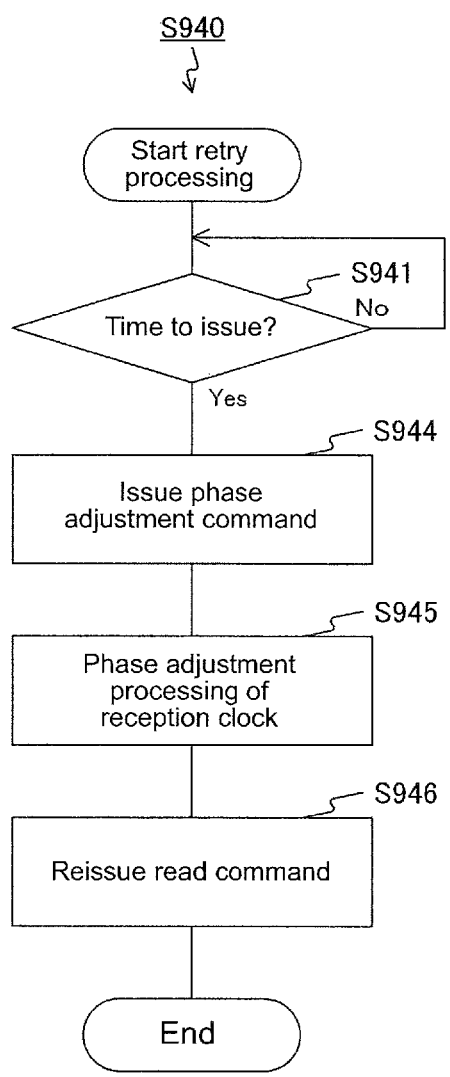
FIG. 40 is a flowchart showing an example of the retry processing according to a first modified example of the fifth embodiment.

FIG. 40 is a flowchart showing an example of retry processing according to the first modified example of the fifth embodiment. The retry processing of the first modified example is different from that of the fifth embodiment in that the processing of steps S944 and S945 is executed instead of the processing of steps S942 and S943.

When now is the time to issue a phase adjustment command (Yes in step S941), the memory controller 200 issues the phase adjustment command (step S944). Then, the memory controller 200 executes the adjustment processing of the phase of a reception clock signal (step S945) and executes the processing of step S946.

Since the memory controller 200 adjusts a phase and reads read data again when errors are not capable of being corrected according to the first modified example as described above, the likelihood of reading normal read data may be increased.

Second Modified Example

According to the fifth embodiment, the memory system adjusts only impedance at error detection. However, the memory system may adjust both impedance and a phase. The memory system of a second modified example is different from that of the fifth embodiment in that both impedance and a phase are adjusted at error detection.

The operation of the memory controller 200 of the second modified example is the same as that of the memory controller 200 of the fifth embodiment exemplified in FIG. 38. In addition, the adjustment processing of the second modified example is the same as that of the third embodiment.

(Operation Example of Memory Controller)

Figure 41:
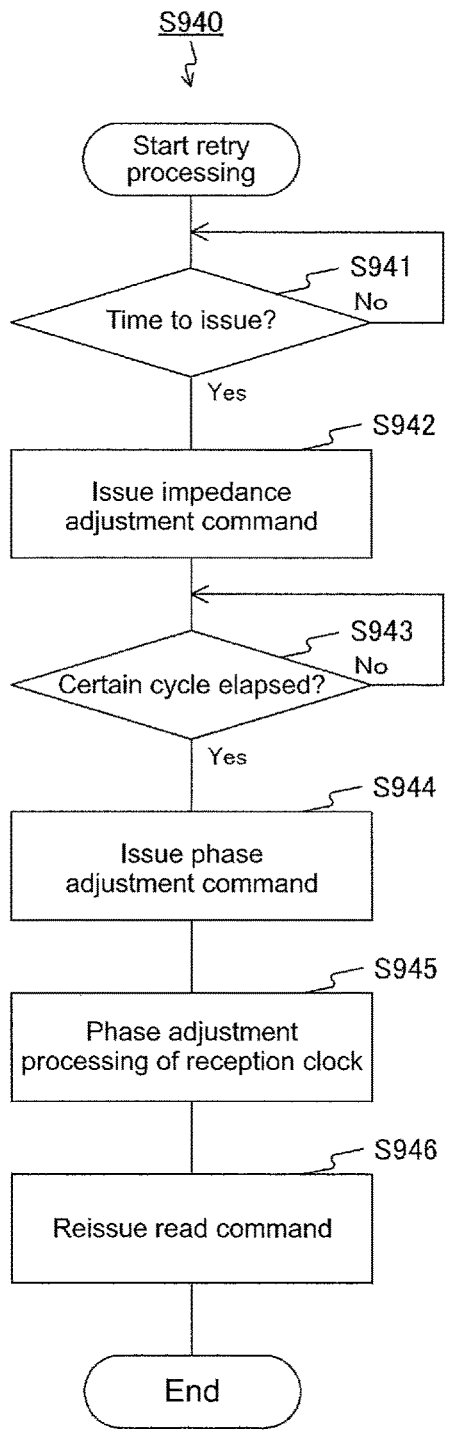
FIG. 41 is a flowchart showing an example of the retry processing according to a second modified example of the fifth embodiment.

FIG. 41 is a flowchart showing an example of retry processing according to the second modified example of the fifth embodiment. The retry processing of the second modified example is different from that of the fifth embodiment in that the processing of steps S944 and S945 of the first modified example is further executed after the processing of step S943.

Since the memory controller 200 adjusts a phase and impedance and reads read data again when errors are not capable of being corrected according to the second modified example as described above, the likelihood of reading normal read data may be increased.

Note that the above embodiments are exemplified to embody the present technology and the matters in the embodiments and the matters specifying the invention in the claims correspond to each other. Similarly, the matters specifying the invention in the claims and the matters identified by the same names in the embodiments of the present technology correspond to each other. However, the present technology is not limited to the embodiments and may be embodied when various modifications are applied to the embodiments without departing from the spirit of the present technology.

In addition, the processing procedures described in the above embodiments may be recognized as a method having the series of procedures, a program causing a computer to execute the series of procedures, or a recording medium recording the program thereon. As such a recording medium, a CD (Compact Disc), a MD (Mini Disc), a DVD (Digital Versatile Disc), a memory card, a Blue-Ray Disc™, or the like may be used.

Note that the present technology may also employ the following configurations.

(1) An interface control circuit, including:
an error detection unit configured to detect whether an error occurs in error correction coded data transmitted via an interface;

an error correction unit configured to execute error correction processing of correcting the error when the error occurs; and an adjustment control unit configured to start adjustment processing of adjusting a transmission characteristic of the interface when the error occurs.

(2) The interface control circuit according to (1), in which the adjustment control unit is configured to start the adjustment processing while the error correction processing is executed.

(3) The interface control circuit according to (1) or (2), in which the interface includes a transmission circuit configured to transmit the error correction coded data, and a reception circuit configured to receive the error correction coded data, and the adjustment control unit is configured to start processing of matching impedances of the transmission circuit and the reception circuit as the adjustment processing.

(4) The interface control circuit according to any one of (1) to (3), in which the adjustment control unit is configured to start processing of adjusting a transmission timing of the data as the adjustment processing.

(5) The interface control circuit according to (4), further including:

an adjustment unit configured to execute the adjustment processing according to control of the adjustment control unit.

(6) The interface control circuit according to (4) or (5), in which the adjustment processing is processing of adjusting the transmission timing based on a reference clock signal.

(7) The interface control circuit according to any one of (4) to (6), further including:

a delay circuit configured to delay the transmission timing according to control of the adjustment control unit, in which the adjustment processing is processing of controlling the delay circuit to adjust the transmission timing.

(8) The interface control circuit according to any one of (4) to (7), in which the adjustment processing is processing of adjusting a phase of a control signal for controlling the transmission timing based on a reference clock signal to adjust the transmission timing.

(9) The interface control circuit according to any one of (4) to (8), further including:

a delay circuit configured to delay a phase of a control signal for controlling the transmission timing according to control of the adjustment control unit, in which the adjustment processing is processing of controlling the delay circuit to adjust the phase of the control signal.

(10) The interface control circuit according to any one of (4) to (9), in which the interface includes a transmission circuit configured to transmit the error correction coded data in synchronism with a transmission clock signal, and a reception circuit configured to receive the error correction coded data in synchronism with a reception clock signal, and the adjustment processing is processing of adjusting a phase of at least one of the transmission clock signal and the reception clock signal to adjust the transmission timing.

(11) The interface control circuit according to (10), in which the adjustment processing is processing of adjusting the phase of one of the transmission clock signal and the reception clock signal based on the other of the transmission clock signal and the reception clock signal to adjust the transmission timing.

(12) The interface control circuit according to (9) or (11), in which the data includes read data read from a memory cell, the transmission clock signal includes a read data transmission clock signal for transmitting the read data, the reception clock signal includes a read data reception clock signal for receiving the read data, and the adjustment processing includes processing of adjusting the phase of at least one of the read data transmission clock signal and the read data reception clock signal.

(13) The interface control circuit according to any one of (10) to (12), in which the data includes write data to be written in a memory cell, the transmission clock signal includes a write data transmission clock signal for transmitting the write data, the reception clock signal includes a write data reception clock signal for receiving the write data, and the adjustment processing includes processing of adjusting the phase of at least one of the write data transmission clock signal and the write data reception clock signal.

(14) The interface control circuit according to (10) or (11), in which the adjustment processing is processing of adjusting the phase based on the transmission timing of the error correction coded data.

(15) The interface control circuit according to (14), in which the adjustment control unit includes a test data generation part configured to generate prescribed test data, and a phase control part configured to start processing of transmitting and returning the test data to and from the interface and adjusting the phase based on whether the transmitted test data and the returned test data match each other as the adjustment processing.

(16) The interface control circuit according to any one of (1) to (15), in which the interface includes a plurality of data lines for transmitting the data.

(17) The interface control circuit according to (16), in which the adjustment processing is processing of adjusting the transmission characteristic for each of the data lines.

(18) The interface control circuit according to (16) or (17), in which the data lines each belongs to any of a plurality of groups, and the adjustment processing is processing of adjusting the transmission characteristic for each of the groups.

(19) The interface control circuit according to any one of (1) to (18), in which the adjustment control unit is configured to start the adjustment processing when the errors in excess of a prescribed threshold occur in the data.

(20) The interface control circuit according to any one of (1) to (19), further including:

a refresh processing unit configured to execute refresh processing of rewriting data where the error is corrected into an address at which the data is read.

(21) The interface control circuit according to (20), in which the refresh processing unit is configured to execute the refresh processing when the number of the corrected errors is greater than a prescribed allowance within error correction capability of the error correction code.

(22) The interface control circuit according to any one of (1) to (21), further including:

a retry processing unit configured to execute retry processing of reading the data and the error correction code again after the adjustment of the transmission characteristic when the errors beyond error correction capability of the error correction code occur in the data.

(23) The interface control circuit according to (22), in which the retry processing unit is configured to issue a prescribed command to read the data and the error correction code again while informing a host computer of the prescribed command.

(24) The interface control circuit according to (22) or (23), in which the retry processing unit is configured to read the data and the error correction code again while informing a host computer of an address at which the data is read.

(25) The interface control circuit according to any one of (22) to (24), in which the retry processing unit is configured to read the data and the error correction code again while informing a host computer of the occurrence of the errors.

(26) The interface control circuit according to any one of (1) to (25), in which the adjustment control unit is configured to start the adjustment processing when a power supply is input to the interface control circuit or when the error Occurs.

(27) The interface control circuit according to any one of (1) to (26), in which the data is data read from a non-volatile memory cell.

(28) A memory system, including:

an interface configured to transmit error correction coded data;

an error detection unit configured to detect whether an error occurs in the data;

an error correction unit configured to execute error correction processing of correcting the error when the error occurs; and an adjustment control unit configured to start adjustment processing of adjusting a transmission characteristic of the interface when the error occurs.

(29) A method of controlling an interface control circuit, including:

detecting whether an error occurs in error correction coded data transmitted via an interface, by an error detection unit;

executing error correction processing of correcting the error when the error occurs, by an error correction unit; and starting adjustment processing of adjusting a transmission characteristic of the interface when the error occurs, by an adjustment control unit.

It should be understood by those skilled in the art that various modifications, combinations, sub-combinations and alterations may occur depending on design requirements and other factors insofar as they are within the scope of the appended claims or the equivalents thereof.

What is claimed is:

1. A memory control circuit comprising:
   a control interface that is configured to
      receive error correction coded data from a memory device, and
      transmit the error correction coded data;
   an error detection unit configured to
      receive the error correction coded data that is transmitted by the control interface, and
      detect whether an error occurs in the error correction coded data; and
      responsive to detecting that the error occurs in the error correction coded data, output a detection result; an error correction unit that is configured,
   to execute error correction processing of correcting the error in the error correction coded data based on the detection result; and
   an adjustment control unit is configured to start adjustment processing of adjusting a communication characteristic of the control interface or a memory interface of the memory device based on the detection result.

2. The memory control circuit according to claim 1, wherein
   the adjustment control unit is configured to start the adjustment processing while the error correction processing is executed.

3. The memory control circuit according to claim 1, wherein
   the memory interface includes
      a transmission circuit configured to transmit the error correction coded data, and
      a reception circuit configured to receive the error correction coded data, and
   the adjustment control unit is configured to start processing of matching impedances of the transmission circuit and the reception circuit as the adjustment processing.

4. The memory control circuit according to claim 1, wherein
   the adjustment control unit is configured to start processing of adjusting a reception timing of the error correction coded data as the adjustment processing.

5. The memory control circuit according to claim 4, further comprising:
   an adjustment unit configured to execute the adjustment processing according to control of the adjustment control unit.

6. The memory control circuit according to claim 4, wherein
   the adjustment processing is processing of adjusting the reception timing based on a reference clock signal.

7. The memory control circuit according to claim 4, further comprising:
   a delay circuit configured to delay the reception timing according to control of the adjustment control unit, wherein
   the adjustment processing is processing of controlling the delay circuit to adjust the reception timing.

8. The memory control circuit according to claim 4, wherein
   the adjustment processing is processing of adjusting a phase of a control signal for controlling the reception timing based on a reference clock signal to adjust the reception timing.

9. The memory control circuit according to claim 4, further comprising:
a delay circuit configured to delay a phase of a control signal for controlling the reception timing according to control of the adjustment control unit, wherein
the adjustment processing is processing of controlling the delay circuit to adjust the phase of the control signal.

10. The memory control circuit according to claim 4, wherein
the control interface includes
a transmission circuit configured to transmit the error correction coded data in synchronism with a transmission clock signal, and
a reception circuit configured to receive the error correction coded data in synchronism with a reception clock signal, and
the adjustment processing is processing of adjusting a phase of at least one of the transmission clock signal or the reception clock signal to adjust the reception timing.

11. The memory control circuit according to claim 10, wherein
the adjustment processing is processing of adjusting the phase of a first one of the at least one of the transmission clock signal or the reception clock signal based on an other one of the at least one of the transmission clock signal or the reception clock signal.

12. The memory control circuit according to claim 10, wherein
the error correction coded data includes read data that is read from a memory cell of the memory device,
the reception clock signal includes a read data reception clock signal for receiving the read data from the memory device, and
the adjustment processing includes processing of adjusting the phase of at least one of the read data reception clock signal.

13. The memory control circuit according to claim 10, wherein
the error correction coded data includes write data to be written in a memory cell of the memory device,
the transmission clock signal includes a write data transmission clock signal for transmitting the write data,
the adjustment processing includes processing of adjusting the phase of the write data transmission clock signal.

14. The memory control circuit according to claim 10, wherein
the adjustment processing is processing of adjusting the phase based on the reception timing of the error correction coded data.

15. The memory control circuit according to claim 14, wherein
the adjustment control unit includes
a test data generation part configured to generate prescribed test data, and
a phase control part configured to start processing of transmitting and returning the prescribed test data to and from the control interface and adjusting the phase based on whether the prescribed test data that is transmitted and the prescribed test data that is returned match each other as the adjustment processing.

16. The memory control circuit according to claim 1, wherein
the control interface includes a plurality of data lines for receiving the error correction coded data.

17. The memory control circuit according to claim 16, wherein
the adjustment processing is processing of adjusting the communication characteristic for each of the plurality of data lines.

18. The memory control circuit according to claim 16, wherein
the plurality of data lines each belongs to any of a plurality of groups, and
the adjustment processing is processing of adjusting the communication characteristic for each of the plurality of groups.

19. The memory control circuit according to claim 1, wherein
the adjustment control unit is configured to start the adjustment processing when errors in excess of a prescribed threshold occur in the error correction coded data.

20. The memory control circuit according to claim 1, further comprising:
a refresh processing unit configured to execute refresh processing of rewriting data where the error is corrected into an address at which the error correction coded data is read.

21. The memory control circuit according to claim 20, wherein
the refresh processing unit is configured to execute the refresh processing when errors that have been corrected is a number that is greater than a prescribed allowance within an error correction capability of an error correction code of the error correction coded data.

22. The memory control circuit according to claim 1, further comprising:
a retry processing unit configured to execute retry processing of reading the error correction coded data and an error correction code of the error correction coded data again after the adjustment of the communication characteristic when errors beyond an error correction capability of the error correction code occur in the error correction coded data.

23. The memory control circuit according to claim 22, wherein
the retry processing unit is configured to issue a prescribed command to read the error correction coded data and the error correction code again while informing a host device of the prescribed command.

24. The memory control circuit according to claim 22, wherein
the retry processing unit is configured to read the error correction coded data and the error correction code again while informing a host device of an address at which the error correction coded data is read.

25. The memory control circuit according to claim 22, wherein
the retry processing unit is configured to read the error correction coded data and the error correction code again while informing a host device of an occurrence of the errors.

26. The memory control circuit according to claim 1, wherein
the adjustment control unit is configured to start the adjustment processing when a power supply is input to the memory control circuit or in response to detecting that the error occurs in the error correction coded data.

27. The memory control circuit according to claim 1, wherein
the error correction coded data is data read from a non-volatile memory cell.

28. A memory system comprising:
a memory device including a memory interface that is configured to transmit error correction coded data; and
a memory control circuit including
a control interface that is configured to
receive the error correction coded data from the memory device, and
transmit the error correction coded data,
an error detection unit configured to
receive the error correction coded data that is transmitted by the control interface,
detect whether an error occurs in the error correction coded data, and
responsive to detecting that the error occurs in the error correction coded data, output a detection result; an error correction unit that is configured
to execute error correction processing of correcting the error in the error correction coded data based on the detection result; and
an adjustment control unit is configured to start adjustment processing of adjusting a communication characteristic of the control interface or the memory interface based on the detection result.

29. A method of controlling a memory control circuit, the method comprising:
receiving, by a control interface of the memory control circuit, error correction coded data transmitted from a memory device;
detecting, by an error detection unit of the memory control circuit, whether an error occurs in the error correction coded data;
outputting a detection result in response to detecting that the error occurs in the error correction coded data;
executing, by an error correction unit, error correction processing of correcting the error in the error correction coded data based on the detection result; and
starting, by an adjustment control unit, adjustment processing of adjusting a communication characteristic of the control interface or a memory interface of the memory device based on the detection result.

* * * * *